United States Patent
Haga

(10) Patent No.: US 11,626,352 B2
(45) Date of Patent: Apr. 11, 2023

(54) SEMICONDUCTOR DEVICE AND METHOD FOR MANUFACTURING THE SAME

(71) Applicant: ROHM CO., LTD., Kyoto (JP)

(72) Inventor: Motoharu Haga, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 185 days.

(21) Appl. No.: 16/045,322

(22) Filed: Jul. 25, 2018

(65) Prior Publication Data

US 2019/0043791 A1 Feb. 7, 2019

(30) Foreign Application Priority Data

Aug. 2, 2017 (JP) .............................. JP2017-149888
Aug. 2, 2017 (JP) .............................. JP2017-149903
Jul. 18, 2018 (JP) .............................. JP2018-134964

(51) Int. Cl.
*H01L 23/495* (2006.01)
*H01L 23/532* (2006.01)
*H01L 23/00* (2006.01)

(52) U.S. Cl.
CPC .... *H01L 23/49575* (2013.01); *H01L 23/4952* (2013.01); *H01L 23/49503* (2013.01);
(Continued)

(58) Field of Classification Search
CPC . H01L 2224/48247; H01L 2224/32245; H01L 2224/73265; H01L 2924/00012;
(Continued)

(56) References Cited

U.S. PATENT DOCUMENTS

2008/0145607 A1* 6/2008 Kajiwara ................ H01L 24/13
  428/137
2009/0096100 A1* 4/2009 Kajiwara ................ H01L 24/83
  252/512

(Continued)

FOREIGN PATENT DOCUMENTS

JP 2010-171271 A 8/2010
JP 2015-170768 A 9/2015
(Continued)

OTHER PUBLICATIONS

Office Action received in the corresponding Japanese Patent application, dated May 31, 2022, and machine translation (14 pages).

*Primary Examiner* — Matthew C Landau
*Assistant Examiner* — Dmitriy Yemelyanov
(74) *Attorney, Agent, or Firm* — Hamre, Schumann, Mueller & Larson, P.C.

(57) ABSTRACT

A semiconductor device includes a semiconductor element, a mount portion, and a sintered metal bond. The semiconductor element includes a body and an electrode pad. The body has an obverse surface facing forward in a first direction and a reverse surface facing rearward in the first direction. The electrode pad covers the element reverse surface. The mount portion supports the semiconductor element. The sintered metal bond electrically bonds the electrode pad and the mount portion. The sintered metal bond includes a first rear edge and a first front edge spaced forward in the first direction from the first rear edge. The electrode pad includes a second rear edge and a second front edge spaced forward in the first direction from the second rear edge. The first front edge of the metal bond is spaced rearward in the first direction from the second front edge of the pad.

10 Claims, 32 Drawing Sheets

(52) U.S. Cl.
CPC .. *H01L 23/49513* (2013.01); *H01L 23/49562* (2013.01); *H01L 23/53242* (2013.01); *H01L 24/05* (2013.01); *H01L 24/29* (2013.01); *H01L 24/32* (2013.01); *H01L 24/49* (2013.01); *H01L 24/83* (2013.01); *H01L 24/85* (2013.01); H01L 24/03 (2013.01); H01L 24/06 (2013.01); H01L 24/27 (2013.01); H01L 24/48 (2013.01); H01L 24/73 (2013.01); H01L 24/92 (2013.01); H01L 2224/0345 (2013.01); H01L 2224/0346 (2013.01); H01L 2224/04026 (2013.01); H01L 2224/04042 (2013.01); H01L 2224/05558 (2013.01); H01L 2224/05624 (2013.01); H01L 2224/05644 (2013.01); H01L 2224/05647 (2013.01); H01L 2224/05655 (2013.01); H01L 2224/0603 (2013.01); H01L 2224/06181 (2013.01); H01L 2224/2732 (2013.01); H01L 2224/27318 (2013.01); H01L 2224/29006 (2013.01); H01L 2224/29007 (2013.01); H01L 2224/29011 (2013.01); H01L 2224/29012 (2013.01); H01L 2224/29013 (2013.01); H01L 2224/29014 (2013.01); H01L 2224/29015 (2013.01); H01L 2224/29016 (2013.01); H01L 2224/2929 (2013.01); H01L 2224/29078 (2013.01); H01L 2224/29139 (2013.01); H01L 2224/29339 (2013.01); H01L 2224/32014 (2013.01); H01L 2224/32057 (2013.01); H01L 2224/32225 (2013.01); H01L 2224/32245 (2013.01); H01L 2224/45124 (2013.01); H01L 2224/45144 (2013.01); H01L 2224/45147 (2013.01); H01L 2224/48247 (2013.01); H01L 2224/48465 (2013.01); H01L 2224/48471 (2013.01); H01L 2224/4903 (2013.01); H01L 2224/49111 (2013.01); H01L 2224/73265 (2013.01); H01L 2224/83055 (2013.01); H01L 2224/8384 (2013.01); H01L 2224/83092 (2013.01); H01L 2224/83192 (2013.01); H01L 2224/83439 (2013.01); H01L 2224/85205 (2013.01); H01L 2224/92247 (2013.01); H01L 2224/94 (2013.01); H01L 2924/10156 (2013.01); H01L 2924/13055 (2013.01); H01L 2924/13091 (2013.01); H01L 2924/14 (2013.01); H01L 2924/181 (2013.01); H01L 2924/1815 (2013.01); H01L 2924/3512 (2013.01)

(58) Field of Classification Search
CPC ....... H01L 2224/92247; H01L 2924/00; H01L 2224/48465; H01L 2224/94; H01L 2924/181; H01L 2224/03; H01L 2224/0345; H01L 2224/0346; H01L 2224/04026; H01L 2224/04042; H01L 2224/05558; H01L 2224/05624; H01L 2224/05644; H01L 2224/05647; H01L 2224/05655; H01L 2224/0603; H01L 2224/06181; H01L 2224/27318; H01L 2224/2732; H01L 2224/29006; H01L 2224/29007; H01L 2224/29011; H01L 2224/29012; H01L 2224/29013; H01L 2224/29014; H01L 2224/29015; H01L 2224/29016; H01L 2224/29078; H01L 2224/29139; H01L 2224/2929; H01L 2224/29339; H01L 2224/32014; H01L 2224/32057; H01L 2224/32225; H01L 2224/45124; H01L 2224/45144; H01L 2224/45147; H01L 2224/48471; H01L 2224/4903; H01L 2224/49111; H01L 2224/83055; H01L 2224/83092; H01L 2224/83192; H01L 2224/83365; H01L 2224/83439; H01L 2224/8384; H01L 2224/85205; H01L 23/49503; H01L 23/49513; H01L 23/4952; H01L 23/49562; H01L 23/49575; H01L 23/53242; H01L 24/03; H01L 24/05; H01L 24/06; H01L 24/27; H01L 24/29; H01L 24/32; H01L 24/48; H01L 24/49; H01L 24/73; H01L 24/83; H01L 24/85; H01L 24/92; H01L 2924/10156; H01L 2924/13055; H01L 2924/13091; H01L 2924/14; H01L 2924/1815; H01L 2924/3512; H01L 23/00; H01L 23/495; H01L 23/532

See application file for complete search history.

(56) References Cited

U.S. PATENT DOCUMENTS

| | | | |
|---|---|---|---|
| 2010/0187678 A1* | 7/2010 | Kajiwara | H01L 23/49524 257/692 |
| 2010/0270515 A1* | 10/2010 | Yasuda | H01B 1/22 252/514 |

FOREIGN PATENT DOCUMENTS

| | | |
|---|---|---|
| JP | 2017-108192 A | 6/2017 |
| WO | 2014/155619 A | 10/2014 |
| WO | 2017/126344 A | 7/2017 |

\* cited by examiner

FIG.2
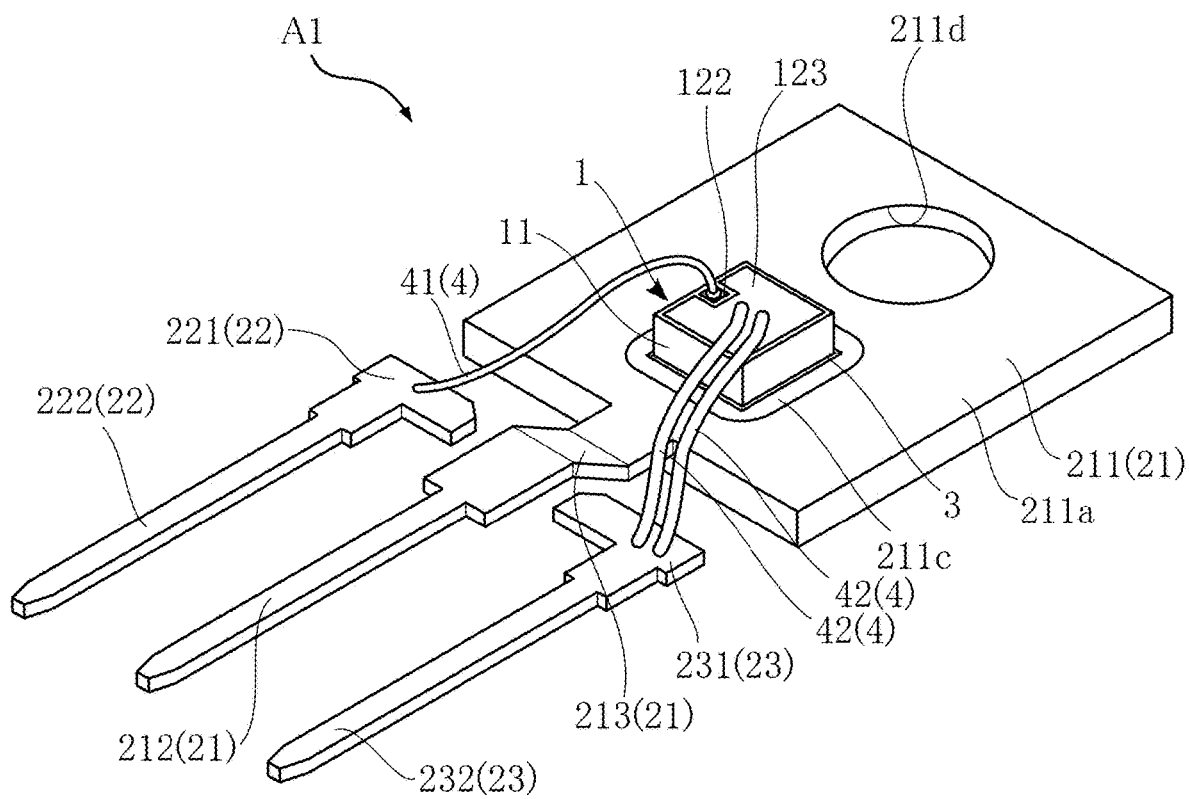
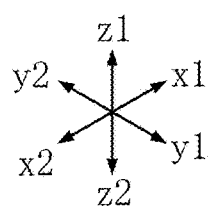

FIG.12
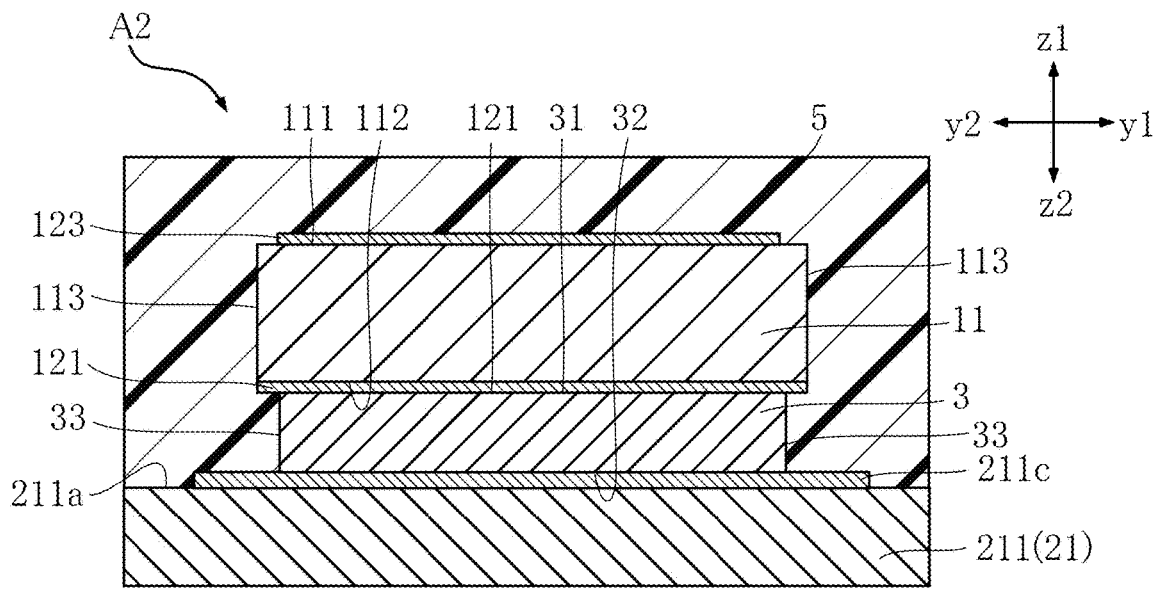
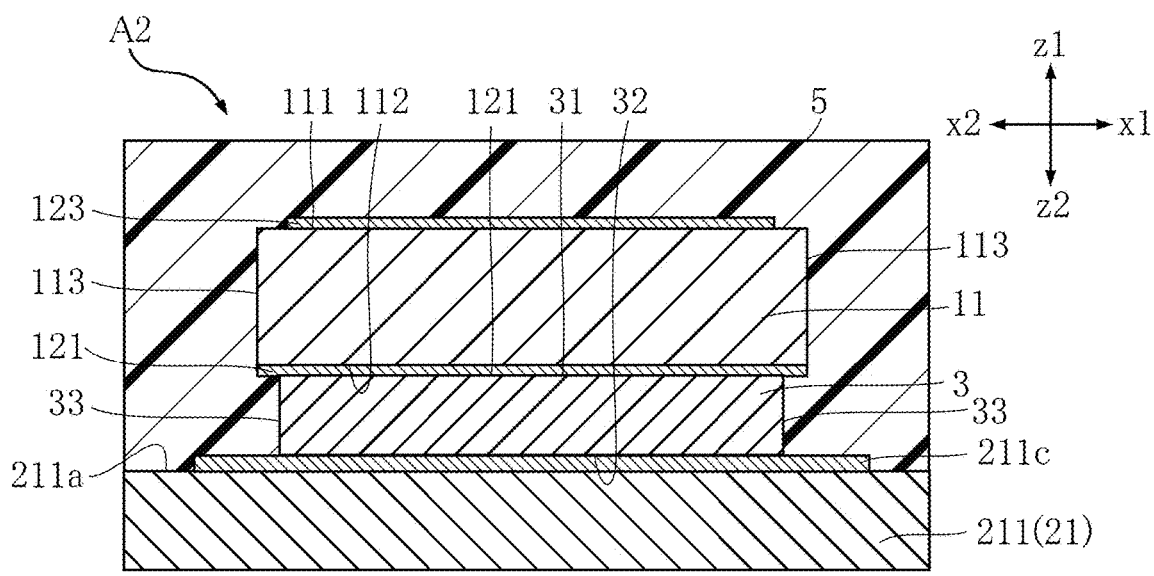

FIG.25
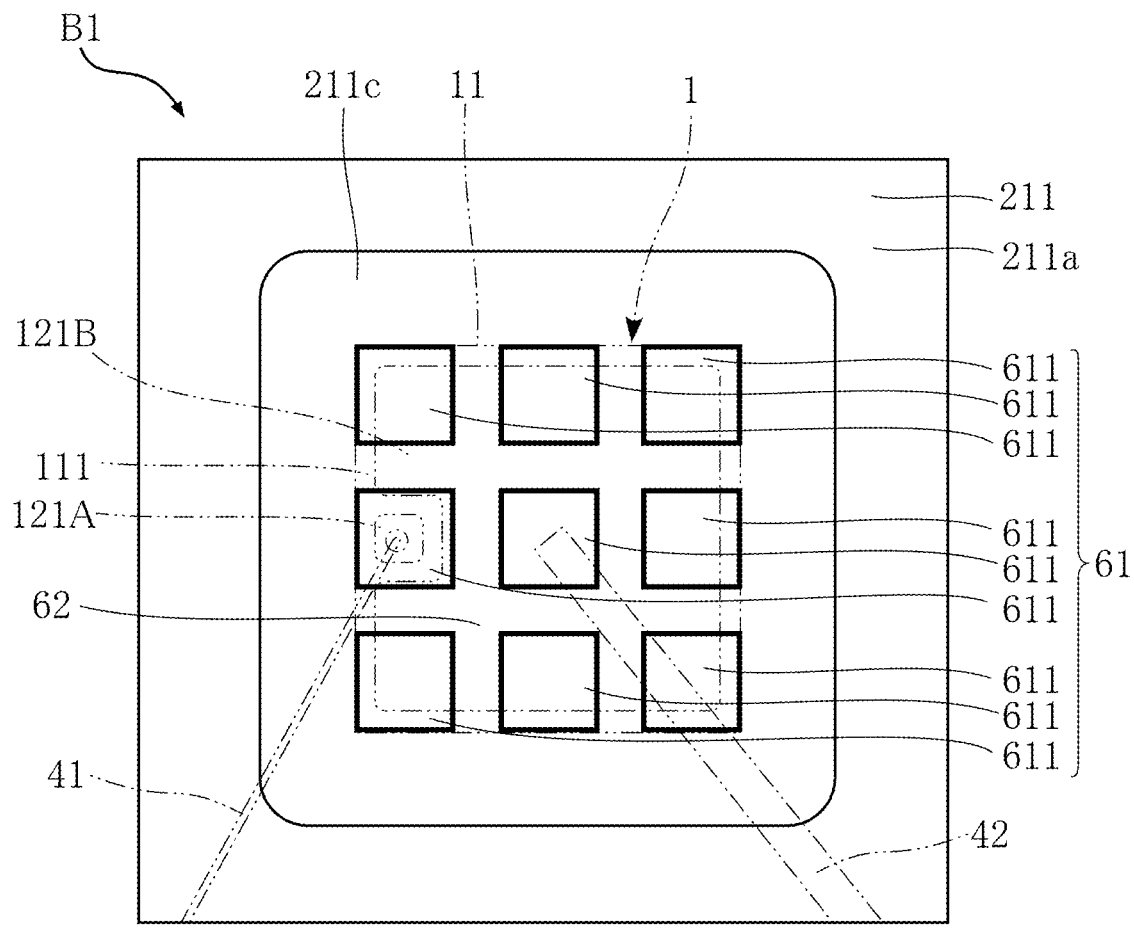
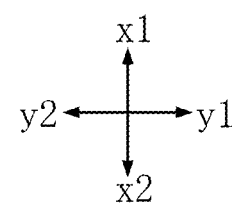

SEMICONDUCTOR DEVICE AND METHOD FOR MANUFACTURING THE SAME

FIELD

The present disclosure relates to a semiconductor device in which a semiconductor element is mounted, and a method for manufacturing such a semiconductor device.

BACKGROUND

Conventionally, lead solder has been used as a die bonding material for a semiconductor device in which a semiconductor element is mounted on a support member. However, to reduce detrimental effects on human health and the environment, lead solder is being replaced with a lead-free bonding material. For example, JP-A-2010-171271 discloses a semiconductor device that uses sintered silver as a die bonding material. The semiconductor device disclosed in JP-A-2010-171271 includes a lead frame, a semiconductor element (Si chip) and a bonding layer. The lead frame includes a bonding portion, on which the semiconductor element is bonded via the bonding layer. The bonding layer is made of sintered silver.

Use of sintered silver as a die bonding material may cause the following problems. For example, in the structure disclosed in JP-A-2010-171271, metal paste is applied to the bonding portion, and the semiconductor element is mounted while pressing the semiconductor element onto the metal paste. The metal paste is then heat-treated to form the bonding layer made of sintered silver. The bonding layer formed in this way includes a fillet portion that is in contact with a side surface of the semiconductor element. Since the bonding ability of sintered silver with respect to the semiconductor element (silicon) is low, the fillet portion is not strongly bonded to the side surface of the semiconductor element. Thus, due to shock or the like that occurs during the semiconductor device manufacturing process, a part of the fillet portion may be broken and separated from the semiconductor element. When such a separated part comes into contact with the lead frame or an electrode part of the semiconductor element for example, an electrical short circuit may occur, which may reduce the reliability of the device. Such a problem is not specific to sintered silver but may occur with other types of sintered metal such as sintered copper. In this way, use of sintered metal as a die bonding material in a semiconductor device still has room for improvement with respect to enhancement of reliability.

SUMMARY

The present disclosure is conceived in view of the above problem. An object of the present disclosure is to provide a semiconductor device that has improved reliability even with the use of a sintered metal as a die bonding material and to provide a method for manufacturing such a semiconductor device.

According to an embodiment of a first aspect of the present disclosure, there is provided a semiconductor device that includes: a semiconductor element including an element body and an electrode pad, the element body having an element obverse surface facing forwarding first direction and an element reverse surface facing rearward in the first direction, the electrode pad covering the element reverse surface; an element mount portion on which the semiconductor element is mounted; and a sintered metal bond that electrically bonds the electrode pad and the element mount portion, where the sintered metal bond includes a first rear edge and a first front edge that is spaced forward in the first direction from the first rear edge, the electrode pad includes a second rear edge and a second front edge that is spaced forward in the first direction from the second rear edge, and the first front edge of the sintered metal bond is spaced rearward in the first direction from the second front edge of the electrode pad.

According to another embodiment of the first aspect of the present disclosure, there is provided a method for manufacturing the semiconductor device as set forth in claim 1, and the method includes: a paste application step for applying a sintering metal paste to the element mount portion; a mounting step for placing the semiconductor element on the sintering metal paste in such a manner that the sintering metal paste and the electrode pad face each other, and a sintering step for forming the sintering metal paste into the sintered metal bond by heat treatment, where the mounting step includes achieving a paste-pad positional relationship in which a front edge of the sintering metal paste in the first direction is offset rearward in the first direction from a front edge of the electrode pad in the first direction, and the sintering step includes performing the heat treatment while maintaining the paste-pad positional relationship.

According to the above-described structure, the front edge of the sintered metal bond in the first direction is located rearward in the first direction from a front edge of the electrode pad in the first direction. That is, the sintered metal bond is not arranged forward of the electrode pad in the first direction, so that it is not in contact with the element body of the semiconductor element. This enhances the bonding strength between the sintered metal bond and the semiconductor element. Thus, the semiconductor device has improved reliability even with the use of a sintered metal as a die bonding material.

Other features and advantages of the technique according to the present disclosure will become apparent from the detailed description given below with reference to the accompanying drawings.

DRAWINGS

FIG. 2 is a view in which a resin package is omitted from the perspective view shown in FIG. 1;

FIG. 12 shows a bonding structure according to the second embodiment of the first aspect;

FIG. 25 is an enlarged plan view showing a part before the paste application step according to the first embodiment of the second aspect;

EMBODIMENTS

Figure 1:
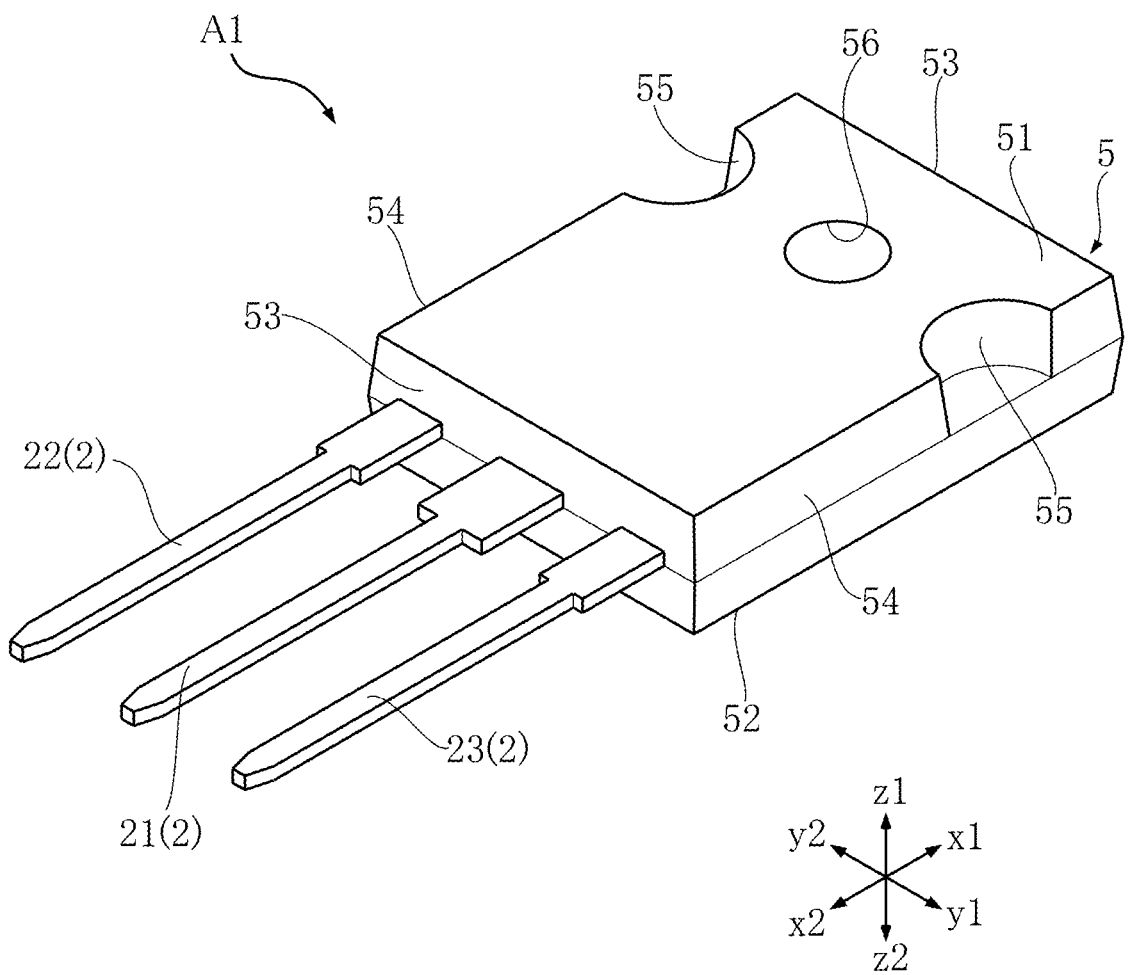
FIG. 1 is a perspective view of a semiconductor device according to a first embodiment of a first aspect.

Embodiments are described with reference to the drawings. FIGS. 1-15 are explanatory views related to the first aspect of the present disclosure, whereas FIGS. 16-35 are explanatory views related to the second aspect of the present disclosure. Note that the reference numerals applied to the embodiments based on the first aspect (FIGS. 1-15) are independent from the reference numerals applied to the embodiments based on the second aspect (FIGS. 16-35). Thus, between the embodiments according to the first aspect and the embodiments according to the second aspect, same reference numerals may be applied to the members that are different in configuration, function, material or the like. Also, between the embodiments according to the first aspect and the embodiments according to the second aspect, different reference numerals may be applied to the members that are identical (or similar) in configuration, function, material or the like.

FIGS. 1-5 show a semiconductor device A1 according to a first embodiment of a first aspect. The semiconductor device A1 is of a type to be mounted on electrical circuit boards of automobiles, electronic devices, etc. The semiconductor device A1 includes a semiconductor element 1, a lead frame 2, a sintered metal bond 3, a plurality of wires 4 (41 and 42), and a resin package 5.

Figure 3:
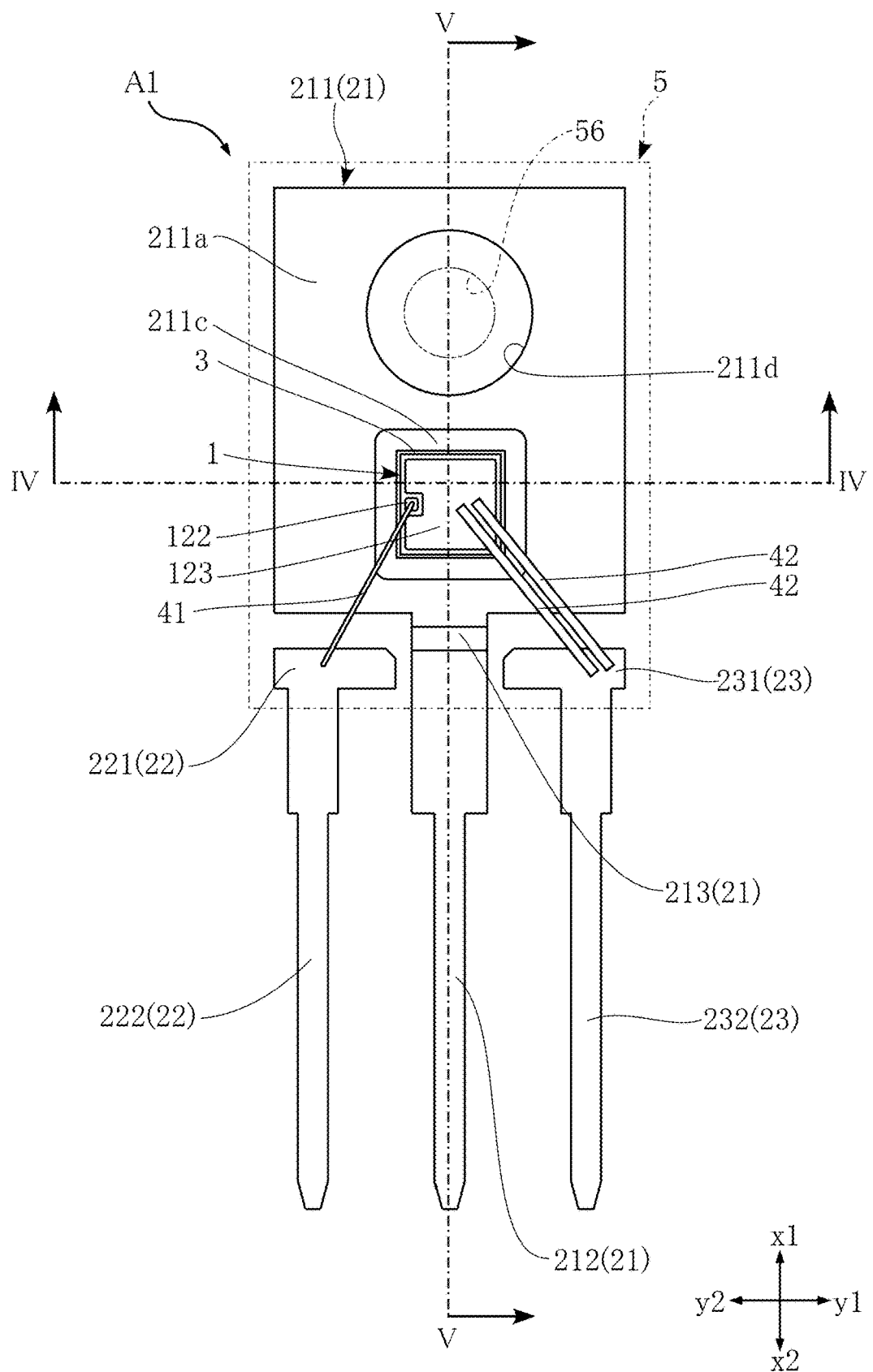
FIG. 3 is a plan view of the semiconductor device according to the first embodiment of the first aspect.
Figure 4:
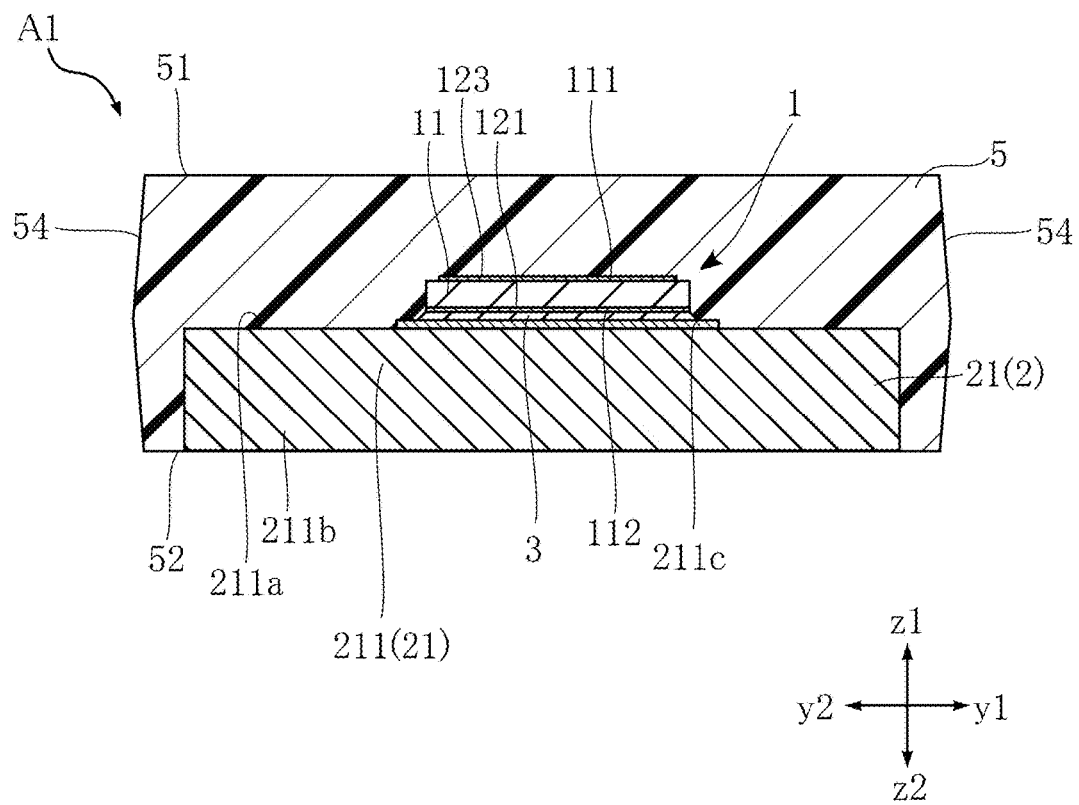
FIG. 4 is a sectional view taken along line IV-IV in FIG. 3.
Figure 5:
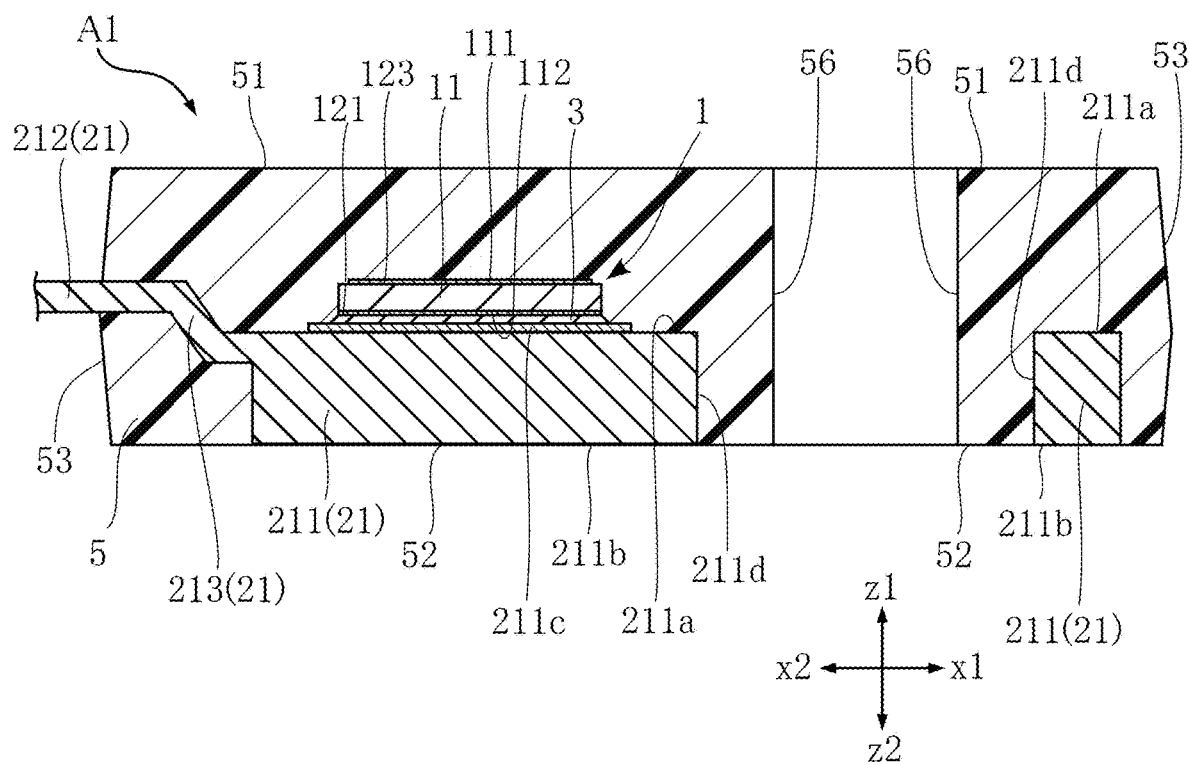
FIG. 5 is a sectional view taken along line V-V in FIG. 3.

FIG. 1 is a perspective view of the semiconductor device A1. FIG. 2 is a perspective view in which illustration of the resin package 5 is omitted from FIG. 1. FIG. 3 is a plan view of the semiconductor device A1. In FIG. 3, the resin package 5 is indicated by an imaginary line (thin single-dot chain line). FIG. 4 is a sectional view taken along line IV-IV in FIG. 3. FIG. 5 is a sectional view taken along line V-V in FIG. 3. For convenience of understanding, an orthogonal coordinate system defined by an x direction, a y direction, and a z direction that are orthogonal to each other is defined. In the orthogonal coordinate system, one side in the x direction is defined as a x1 direction while the other side is defined as a x2 direction, one side in the y direction is defined as a y1 direction while the other side is defined as a y2 direction, and one side in the z direction is defined as a z1 direction while the other side is defined as a z2 direction. The direction parallel to the z direction is defined as the thickness direction of the semiconductor device A1. In the present embodiment, the z direction may be referred to as a "first direction". Also, the z1 direction may be referred to as "forward in the first direction", whereas the z2 direction may be referred to as "rearward in the first direction".

The semiconductor element 1 is an electronic component that can perform the main function of the semiconductor device A1. In the present embodiment, the semiconductor element 1 is a power semiconductor element such as a power MOSFET (Metal Oxide Semiconductor Field Effect Transistor) or an IGBT (Insulated Gate Bipolar Transistor). The semiconductor element is not limited to this, and may be another type of transistor, various types of diodes, various types of thyristors, etc., or an IC chip such as a control IC. In the present embodiment, the semiconductor element 1 has a rectangular shape of 1 to 5 mm square as viewed in the z direction (also referred to as "plan view"), but is not limited to this. The semiconductor element 1 includes an element body 11, a first electrode pad 121, a second electrode pad 122 and a third electrode pad 123.

The element body 11 is made of a semiconductor material. In the present embodiment, the semiconductor material is silicon. The element body 11 is in the form of a rectangular parallelepiped. The element body 11 includes an element obverse surface 111, an element reverse surface 112 and a plurality of element side surfaces 113.

The element obverse surface 111 faces in the z1 direction. The element reverse surface 112 faces in the z2 direction. In the present embodiment, the element obverse surface 111 and the element reverse surface 112 are both flat.

Each of the element side surfaces 113 is perpendicular to the element obverse surface 111 and the element reverse surface 112. Each element side surface 113 is connected to the element obverse surface 111 at its z1-direction edge and connected to the element reverse surface 112 at its z2-direction edge. As viewed in the z direction, each element side surface 113 faces to the outside of the semiconductor element 1. In the present embodiment, each element side surface 113 is entirely flat.

Each of the first electrode pad 121, the second electrode pad 122, and the third electrode pad 123 may be made of a plating layer of Cu, Ni, Al or Au, for example. For example, when the semiconductor element 1 is a power MOSFET, the first electrode pad 121 may be a drain electrode, the second electrode pad 122 may be a gate electrode, and the third electrode pad 123 may be a source electrode. For example, when the semiconductor element 1 is an IGBT, the first electrode pad 121 may be a collector electrode, the second electrode pad 122 may be a gate electrode, and the third electrode pad 123 may be an emitter electrode.

In the present embodiment, the first electrode pad 121 is formed on the element reverse surface 112. The first electrode pad 121 is rectangular as viewed in the z direction. All of the edges of the first electrode pad 121 as viewed in the z direction correspond to the edges of the element reverse surface 112 as viewed in the z direction. Thus, the first electrode pad 121 covers the entirety of the element reverse surface 112.

In the present embodiment, both of the second electrode pad 122 and the third electrode pad 123 are formed on the element obverse surface 111. The area of the second electrode pad 122 is smaller than the area of the third electrode pad 123. To the second electrode pad 122 is connected a first wire 41. To the third electrode pad 123 is connected a plurality of second wires 42.

The lead frame 2 is made of an electrically conductive material. Examples of such an electrically conductive material include Cu. The lead frame 2 is bonded to an electrical circuit board to form a conduction path between the semiconductor element 1 and the electrical circuit board. In the present embodiment, the lead frame 2 includes a first lead 21, a second lead 22 and a third lead 23.

The first lead 21 includes a first pad portion (die pad) 211, a first terminal 212, and an intermediate connecting portion 213.

The first pad portion 211 is a part on which the semiconductor element 1 is mounted. The first pad portion 211 has a pad obverse surface 211a and a pad reverse surface 211b.

The pad obverse surface 211a faces in the z1 direction. The pad obverse surface 211a is entirely flat. The pad obverse surface 211a is formed with a plating layer 211c. The plating layer 211c covers a part of the pad obverse surface 211a on which the semiconductor element 1 is mounted. In the present embodiment, the plating layer 211c is rectangular as viewed in the z direction and has an area larger than that of the semiconductor element 1. It is only required that the plating layer 211c covers at least the part on which the semiconductor element 1 is mounted. Thus, the plating layer 211c may additionally cover other portions or may cover the entire surface of the lead frame 2. The plating layer 211c is made of Ag, for example. The material for the plating layer 211c is not limited to this. The plating layer 211c may be formed by electroplating.

The pad reverse surface 211b faces in the z2 direction. The pad reverse surface 211b is entirely flat. The pad reverse surface 211b is entirely exposed from the resin package 5. This enhances the heat dissipation performance of the semiconductor device A1. Note that the pad reverse surface 211b may be covered with the resin package 5.

The first pad portion 211 is formed with a pad through-hole 211d extending from the pad obverse surface 211a to the pad reverse surface 211b. The pad through-hole 211d is spaced apart from the semiconductor element 1 as viewed in the z direction.

As shown in FIGS. 2, 3, and 5, the first terminal 212 extends along the x direction. The first terminal 212 is partially exposed from the resin package 5. The first terminal 212 is electrically connected to the first electrode pad 121 via the intermediate connecting portion 213, the first pad portion 211, the plating layer 211c and the sintered metal bond 3.

As shown in FIGS. 2, 3, and 5, the intermediate connecting portion 213 is connected to the first pad portion 211 and the first terminal 212. As shown in FIG. 5, the first pad portion 211 and the first terminal 212 differ from each other in position in the z direction, and the first pad portion 211 is offset from the first terminal 212 in the z2 direction. More specifically, the upper surface of the first pad portion 211 (the pad obverse surface 211a) is offset from the lower surface of the first terminal 212 in the z2 direction, and the entirety of the first pad portion 211 is offset from the first terminal 212 in the z2 direction. Thus, the intermediate connecting portion 213 is inclined with respect to the first pad portion 211 and the first terminal 212. The intermediate connecting portion 213 is entirely covered with the resin package 5.

The second lead 22 includes a second pad portion 221 and a second terminal 222.

As shown in FIGS. 2 and 3, the dimension of the second pad portion 221 in the y direction is longer than that of the second terminal 222. The second pad portion 221 is entirely covered with the resin package 5. As shown in FIGS. 2 and 3, to the second pad portion 221 is connected the first wire 41.

As shown in FIGS. 2 and 3, the second terminal 222 extends along the x direction. In the illustrated example, the dimension of the second terminal 222 measured along the x direction is considerably larger than the dimension measured along the y direction. (That is, the second terminal 222 is elongated in the x direction.) The second terminal 222 is partially exposed from the resin package 5. In the illustrated example, most of the second terminal 222 is exposed from the resin package 5.

The third lead 23 includes a third pad portion 231 and a third terminal 232.

As shown in FIGS. 2 and 3, the dimension of the third pad portion 231 in the y direction is longer than that of the third terminal 232. The third pad portion 231 is entirely covered with the resin package 5. As shown in FIGS. 2 and 3, to the third pad portion 231 are connected the plurality of second wires 42.

As shown in FIGS. 2 and 3, similarly to the second terminal 222, the third terminal 232 extends along the x direction. The third terminal 232 is partially exposed from the resin package 5.

The first lead 21, the second lead 22 and the third lead 23 are spaced apart from each other. In the y direction, the first terminal 212 of the first lead 21 is located between the second terminal 222 of the second lead 22 and the third terminal 232 of the third lead 23. The portions of the first terminal 212, second terminal 222 and third terminal 232 that are exposed from the resin package 5 are covered with a metal plating layer. For example, the metal plating layer is made of the same material as the plating layer 211c. The metal plating layer is formed by electroplating.

The sintered metal bond 3 is interposed between the semiconductor element 1 and the lead frame 2 (the first pad portion 211) to electrically bond these parts to each other.

Figure 6:
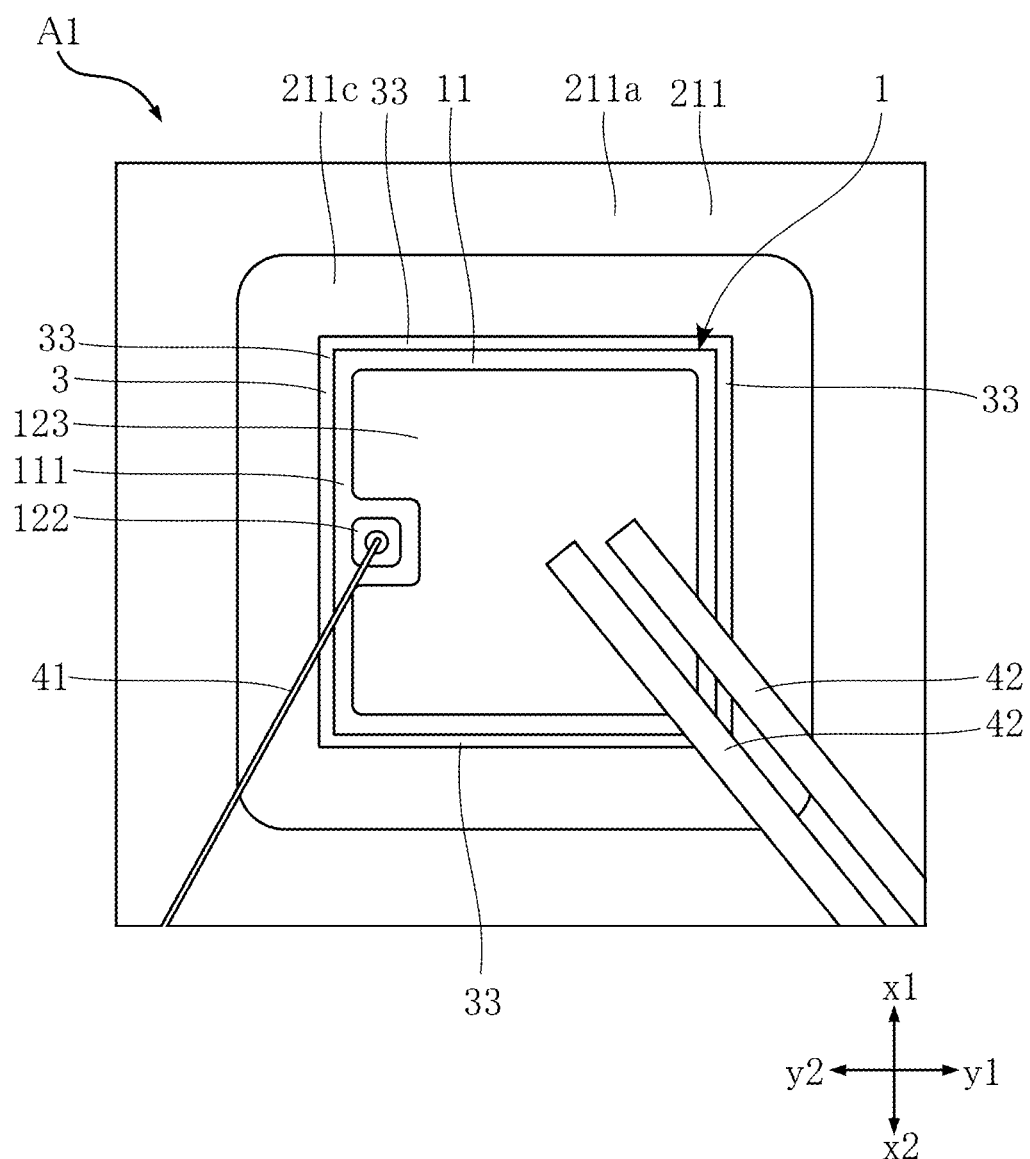
FIG. 6 is a plan view showing a part of FIG. 3 as enlarged.
Figure 7:
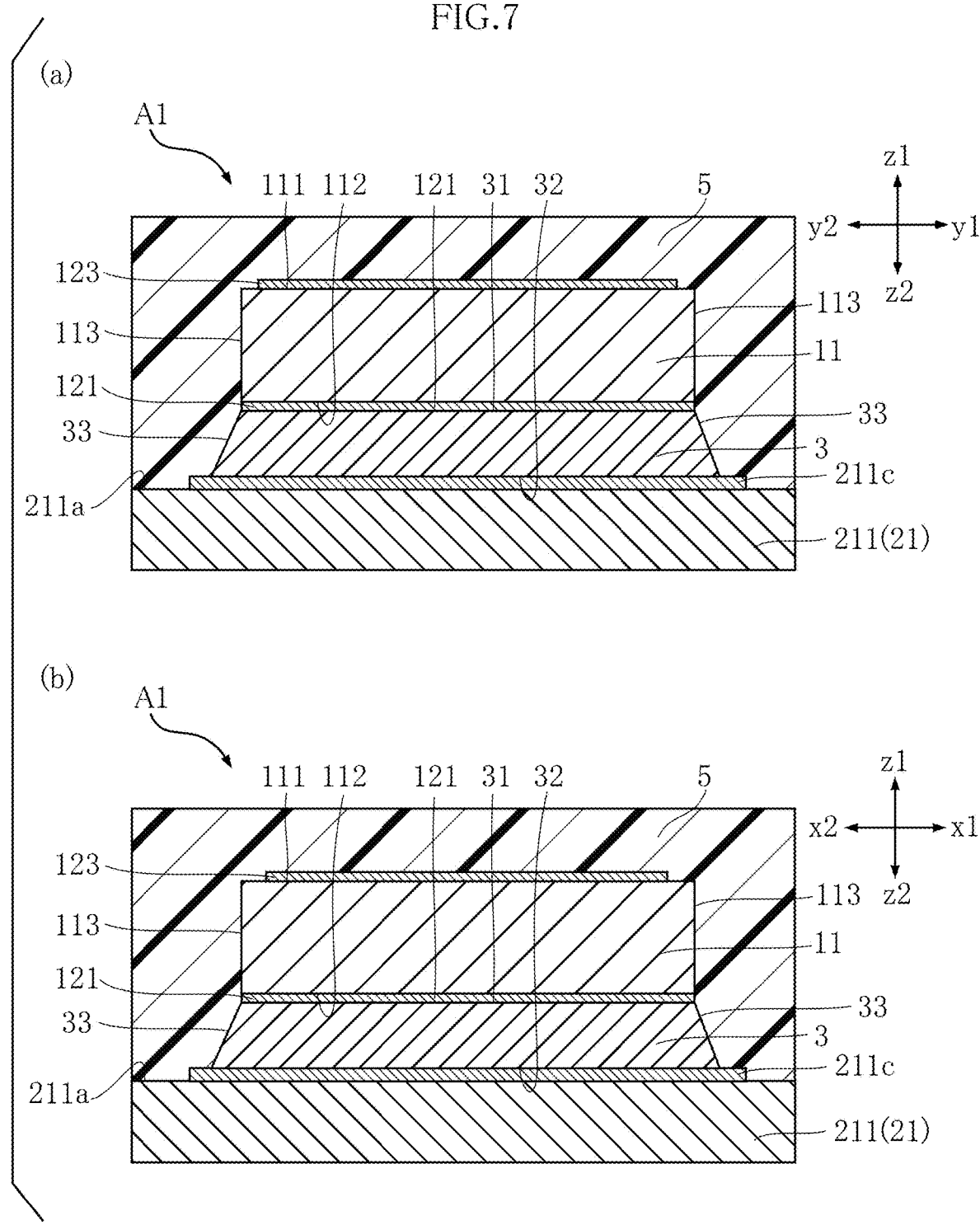
FIG. 7 shows a bonding structure according to the first embodiment of the first aspect, where (a) is a sectional view showing a part of FIG. 4 as enlarged, and (b) is a sectional view showing a part of FIG. 5 as enlarged.
Figure 8:
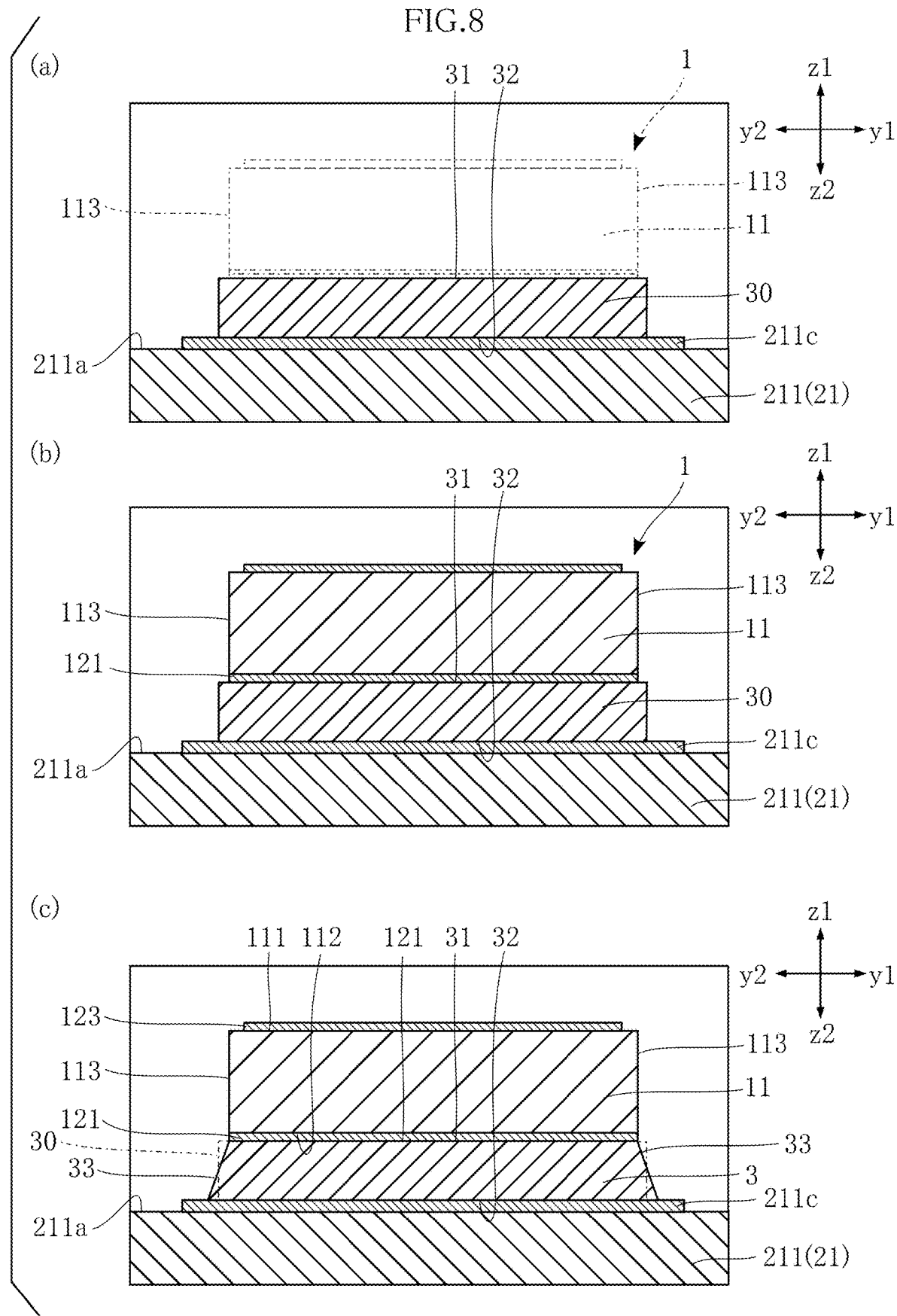
FIG. 8 shows a die bonding process (a)-(c) in a semiconductor device manufacturing method.
Figure 9:
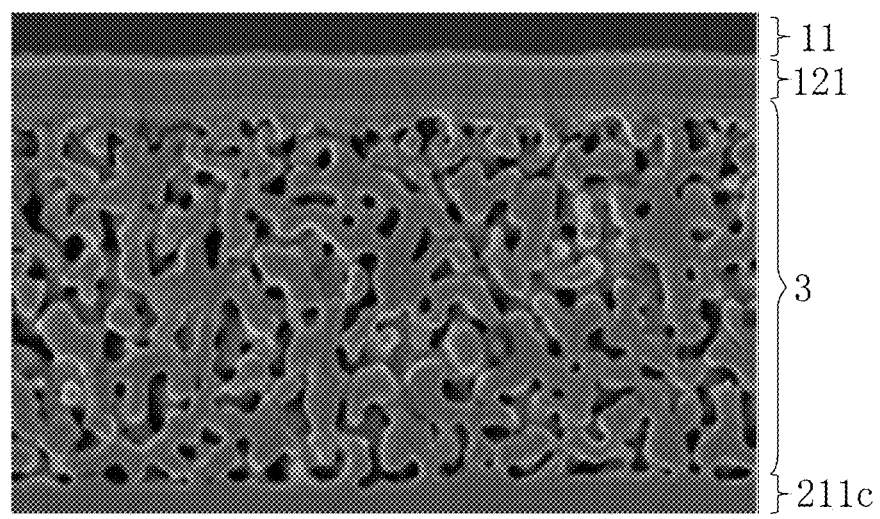
FIG. 9 shows a micrograph of a sintered metal bond.

FIGS. 6-9 illustrate the bonding structure of the semiconductor element 1 and the lead frame 2 (the first pad portion 211) via the sintered metal bond 3. FIG. 6 is a plan view showing a part of FIG. 3 as enlarged. FIG. 7(*a*) is a sectional view showing a part of FIG. 4 as enlarged. That is, FIG. 7(*a*) is an enlarged view of a section of the semiconductor device A1 taken along the y-z plane. FIG. 7(*b*) is a sectional view showing a part of FIG. 5 as enlarged. That is, FIG. 7(*b*) is an enlarged view of a section of the semiconductor device A1 taken along the x-z plane. FIG. 9 shows a micrograph of the sintered metal bond 3.

The sintered metal bond 3 is made of sintered metal. In the present embodiment, the sintered metal is sintered silver. The sintered metal is not limited to this and may be sintered copper, for example. As shown in FIG. 9, the sintered metal bond 3 is porous and has a large number of minute pores. In the present embodiment, the minute pores are left unfilled. However, the pores may be filled with epoxy resin. In such a case, the sintered metal bond 3 contains epoxy resin. Since a high content of epoxy resin may reduce the electrical conductivity of the sintered metal bond 3, the content of epoxy resin is preferably determined in view of the amount of current that flows to the semiconductor element 1. The sintered metal bond 3 has a first contact surface 31, a second contact surface 32 and a plurality of sintered metal side surfaces 33.

As shown in FIG. 7, the first contact surface 31 is in contact with the first electrode pad 121. That is, in the z direction, the first contact surface 31 corresponds to the z2-direction surface (and hence its edges) of the first electrode pad 121. In the present embodiment, the dimension of the first contact surface 31 in the x direction is equal to that of the first electrode pad 121, and the dimension of the first contact surface 31 in the y direction is equal to that of the first electrode pad 121. Thus, as viewed in the z direction, each edge of the first contact surface 31 corresponds to a corresponding one of the edges of the first electrode pad 121.

As shown in FIG. 7, the second contact surface 32 is in contact with the plating layer 211*c*. In the present embodiment, all of the edges of the second contact surface 32 as viewed in the z direction are located on the inner side of the edges of the plating layer 211*c* as viewed in the z direction. That is, the entirety of the second contact surface 32 is in contact with a part of the upper surface of the plating layer 211*c*. Moreover, as viewed in the z direction, each edge of the second contact surface 32 is located on the outer side of (farther from the center of the sintered metal bond 3 as viewed in the z direction than) a corresponding one of the edges (the edge that is adjacent to and parallel to said edge) of the first contact surface 31.

Each of the sintered metal side surfaces 33 is connected to the first contact surface 31 at its z1-direction edge and connected to the second contact surface 32 at its z2-direction edge. The sintered metal side surfaces 33 include a surface facing in the x1 direction, a surface facing in the x2 direction, a surface facing in the y1 direction, and a surface facing in the y2 direction. In the present embodiment, each sintered metal side surface 33 is entirely flat.

The sintered metal bond 3 has a cross section perpendicular to the z direction, and the area of the cross section increases as proceeding from the first contact surface 31 toward the second contact surface 32 along the z direction. That is, as shown in FIG. 7, each of the sintered metal side surfaces 33 is inclined as viewed in the x direction or as viewed in the y direction. The sintered metal bond 3 is in the form of a trapezoid as viewed in the x direction as shown in FIG. 7(*a*) and also as viewed in the y direction as shown in FIG. 7(*b*).

Each of the plurality of wires 4 connects the semiconductor element 1 and the lead frame 2 to establish electrical conduction between these. The wires 4 include the first wire 41 and the plurality of second wires 42.

As shown in FIGS. 2 and 3, the first wire 41 has one end bonded to the second pad portion 221 and the other end bonded to the semiconductor element 1 (the second electrode pad 122). The first wire 41 electrically connects the second pad portion 221 and the second electrode pad 122. In the present embodiment, the first wire 41 is made of aluminum (Al), for example. Note that the composition of the first wire 41 may not be 100% aluminum and may contain other components (such as metal or non-metal) in an allowable range as impurities. In this way, in the present disclosure, when the main component of a wire is aluminum, the wire is described as being made of aluminum or containing aluminum even if some impurities are contained. Instead of aluminum, the first wire 41 may be made of gold (Au) or copper (Cu), for example.

As shown in FIGS. 2 and 3, each of the second wires 42 has one end bonded to the third pad portion 231 and the other end bonded to the semiconductor element 1 (the third electrode pad 123). Thus, each of the second wires 42 electrically connects the third pad portion 231 and the third electrode pad 123. In the present embodiment, similarly to the first wire 41, the second wires 42 are made of aluminum (Al). However, the second wires 42 are not limited to this and may be made of gold (Au) or copper (Cu), for example. Although the semiconductor device A1 includes two second wires 42 in the present embodiment, the number of the second wires 42 is not limited to this and may be three or more, or may be one. In the illustrated example, the diameter of each second wire 42 is larger than that of the first wire 41, but is not limited to this.

The material, number, and wire diameter of the first wire 41 and the second wires 42 may be determined in view of the current that flows through these wires.

The resin package 5 covers the semiconductor element 1, a part of the lead frame 2, the sintered metal bond 3, and the plurality of wires 4. The resin package 5 is made of a thermosetting synthetic resin having electrical insulation properties. In the present embodiment, the resin package 5 is made of black epoxy resin. The resin package 5 includes a resin obverse surface 51, a resin reverse surface 52, a pair of first resin side surfaces 53 and a pair of second resin side surfaces 54.

As shown in FIGS. 4 and 5, the resin obverse surface 51 faces in the z1 direction. As shown in FIGS. 4 and 5, the resin reverse surface 52 faces in the z2 direction.

As shown in FIG. 5, the paired first resin side surfaces 53 are spaced apart from each other in the x direction. The paired first resin side surfaces 53 face away from each other in the x direction. As shown in FIG. 5, each of the paired first resin side surfaces 53 is connected to the resin obverse surface 51 at its z1-direction edge and connected to the resin reverse surface 52 at its z2-direction edge. In the present embodiment, a part of the first lead 21 (the first terminal 212), a part of the second lead 22 (the second terminal 222), and a part of the third lead (the third terminal 232) are exposed from the first resin side surface 53 located on the x2 side.

As shown in FIG. 4, the paired second resin side surfaces 54 are spaced apart from each other in the y direction. The paired second resin side surfaces 54 face away from each other in the y direction. As shown in FIG. 4, each of the paired second resin side surfaces 54 is connected to the resin obverse surface 51 at its z1-direction edge and connected to the resin reverse surface 52 at its z2-direction edge.

As shown in FIG. 1, the resin package 5 is formed with a pair of resin recesses 55 extending inward of the resin package 5 from the respective z1-direction edges of the paired second resin side surfaces 54. As shown in FIGS. 1 and 5, the resin package 5 is formed with a resin through-hole 56 extending from the resin obverse surface 51 to the resin reverse surface 52 in the z direction. In the present embodiment, as viewed in the z direction, the center of the resin through-hole 56 corresponds to the center of the pad through-hole 211d. The diameter of the resin through-hole 56 is smaller than that of the pad through-hole 211d. In the present embodiment, the hole wall of the pad through-hole 211d is entirely covered with the resin package 5. By inserting a fastener such as a screw into the resin through-hole 56, a heat dissipating member such as a heat spreader may be attached to the semiconductor device A1, so that the heat dissipation performance of the semiconductor device A1 is improved.

A method for manufacturing the semiconductor device A1 is described below. The method for manufacturing the semiconductor device A1 may include a parts preparation process, a die bonding process, a wire bonding process, a resin molding process and a finishing process. In the present embodiment, these processes of the manufacturing method are performed in the mentioned order.

In the parts preparation process, the structural parts of the semiconductor device A1 are prepared. Specifically, a wafer that is to become the element body 11 is subjected to plating treatment, whereby a first through a third electrode pads 121-123 are formed. The wafer has a size that allows production of a plurality of element bodies 11 (the semiconductor elements 1). The plated wafer is diced to provide a semiconductor element 1. Further, lead frames 2 are formed by molding. In the parts preparation process, the plurality of lead frames 2 are formed integrally as connected to each other by a connection frame.

In the die bonding process, the semiconductor element 1 is electrically bonded to the first pad portion 211 via the sintered metal bond 3. The die bonding process includes a paste application step, a mounting step, and a sintering step. FIG. 8(a) shows the state after the paste application step. FIG. 8(b) shows the state after the mounting step. FIG. 8(c) shows the state after the sintering step.

In the paste application step, a sintering metal paste 30 that is a base for the sintered metal bond 3 is applied. In the present embodiment, sintering silver paste is used as the sintering metal paste 30. The sintering silver paste is a paste containing silver particles of microsize or nanosize mixed in a solvent. In the present embodiment, the solvent of the sintering silver paste contains no (or little) epoxy resin. Specifically, in the paste application step, the sintering metal paste 30 is applied to the first pad portion 211 (plating layer 211c) by using a dispenser. In this step, the amount of application or shape of the sintering metal paste 30 is adjusted in such a manner that the sintering metal paste 30 has a configuration shown in FIG. 8(a). In FIG. 8(a), the semiconductor element 1 that is to be mounted in the subsequent mounting step is indicated by imaginary lines (single-dot chain lines). In the present embodiment, as shown in FIG. 8(a), the sintering metal paste 30 is applied to be formed into a rectangular shape. The sintering metal paste 30 is applied to be slightly larger than the semiconductor element 1 as viewed in the z direction. That is, the sintering metal paste 30 is applied in such a manner that the side surfaces of the sintering metal paste 30 (the surfaces facing in the x direction or the y direction) are located on the outer side of the element side surfaces 113 of the element body 11. The sintering metal paste 30 may be applied by screen printing.

In the mounting step, the semiconductor element 1 is mounted on the sintering metal paste 30 applied on the first pad portion 211. Specifically, as shown in FIG. 8(b), the semiconductor element 1 is placed on the sintering metal paste 30 in such a manner that the first electrode pad 121 of the semiconductor element 1 and the first pad portion 211 face each other. In placing the semiconductor element 1 in this way, the push-in amount (the amount by which the semiconductor element 1 is pushed into the sintering metal paste 30) is adjusted such that the z1-direction edge of the sintering metal paste 30 is offset in the z2 direction from the z1-direction edge of the first electrode pad 121. That is, the push-in amount in the placing operation is adjusted such that the z1-direction edge of the sintering metal paste 30 will not be offset in the z1 direction from the z1-direction edge of the first electrode pad 121. In the present embodiment, as shown in FIG. 8(b), the z1-direction edge of the sintering metal paste 30 (the first contact surface 31) corresponds to the z2-direction edge of the first electrode pad 121 in the z direction. That is, in the present embodiment, the semiconductor element 1 is just placed on the sintering metal paste 30 without the application of any particular force (the force toward the sintering metal paste 30) to the semiconductor element 1. In other words, the push-in amount in the present embodiment is provided by the weight of the semiconductor element 1 itself. Note that if the push-in amount in this process is large, a fillet portion is formed at the sintered metal bond 3, similarly to a conventional semiconductor device.

In the sintering step, the sintering metal paste 30 is formed into the sintered metal bond 3 by heat treatment. Specifically, with the semiconductor element 1 placed on the sintering metal paste 30, the sintering metal paste 30 is heat-treated under predetermined sintering conditions. Examples of such sintering conditions include presence or absence of pressurization, heating time, heating temperature, and environment (atmosphere). In the present embodiment, heat treatment at 200° C. in an unpressurized state is carried out for two hours in an atmosphere containing oxygen. The sintering conditions are not limited to those described above. By the above-described heat treatment, the solvent contained in the sintering metal paste 30 vaporizes while the silver particles combine with each other, whereby the porous sintered metal bond 3 as shown in FIG. 9 is formed.

The sintered metal bond 3 formed by the sintering step has a configuration shown in FIGS. 7 and 8(c). In FIG. 8(c), the sintering metal paste 30 before the sintering step is indicated by imaginary lines (single-dot chain lines). By heat-treating the sintering metal paste, the viscosity of the sintering metal paste 30 is reduced. Due to such a reduced viscosity, the z1-direction edge of the sintering metal paste 30 as viewed in the z direction (upper corners of the sintering metal paste 30 in FIG. 8(c)) sags in the z2 direction, as shown in FIG. 8(c). As a result, of the sintered metal bond 3, the edge of the first contact surface 31 as viewed in the z direction corresponds to the edge of the first electrode pad 121 as viewed in the z direction. The sintered metal side surface 33 is also formed that is inclined in such a manner that the area of the cross section perpendicular to the z direction increases as proceeding from the first contact surface 31 toward the second contact surface 32. The flowability of the sintering metal paste 30 is low even when the viscosity is reduced by heating. Thus, unlike lead solder, the sintering metal paste does not become a liquid state. Further, the sintering metal paste 30 has no wettability like lead solder. When the sintering metal paste 30 transforms into the sintered metal bond 3 in the sintering step, the transformation starts from the outer side of the sintering metal paste 30. Moreover, since the solvent vaporizes, the sintered metal bond 3 has a reduced volume as compared with that in the state of the sintering metal paste 30.

In the die bonding process described above, the application amount and shape of the sintering metal paste 30 is adjusted in the paste application step, and also, the push-in amount in placing the semiconductor element 1 is adjusted in the mounting step. However, the present disclosure is not limited to this, and it is only required that the bonding structure as shown in FIG. 7 is obtained through the die bonding process.

In the wire bonding process, the first wire 41 and the plurality of second wires 42 are bonded. For example, the wire bonding process is performed using a known wire bonder. The wire bonding process includes a first wire bonding step and a second wire bonding step.

In the first wire bonding step, the first wire 41 is bonded with a wire bonder that uses a capillary. Specifically, an end of a wire is allowed to project from the capillary of the wire bonder and melted, so that the end of the wire is formed into a ball shape. The ball-shaped end is pressed against the second electrode pad 122. Subsequently, the capillary is moved while drawing the wire from the capillary, and then, the wire is pressed against the second pad portion 221 of the second lead 22. Then, the capillary is lifted while pressing the wire with a clamp of the capillary, whereby the wire is cut. The first wire 41 is formed in this way, and the second electrode pad 122 and the second pad portion 221 are electrically connected to each other. Note that the wire may first be bonded to the second pad portion 221 and then bonded to the second electrode pad 122.

In the second wire bonding step, the second wires 42 are bonded with a wire bonder that uses a wedge tool. Specifically, ultrasonic vibration is applied, with an end of the wedge of the wedge tool, which is in a state capable of wedge bonding, pressed against the third electrode pad 123. As a result, an end of a second wire 42 is welded to the third electrode pad 123. Subsequently, the wedge is moved while drawing the wire from the end of the wedge, and ultrasonic vibration is applied with the wire pressed against the third pad portion 231 of the third lead 23. As a result, the other end of the second wire 42 is welded to the third pad portion 231. Thereafter, the wedge is slightly moved, and a cut is formed in the second wire 42 with a cutter of the wedge tool. Then, the wire is cut by separating the wire from the third pad portion 231 along with the wedge. Thus, the second wire 42 is formed, and the third electrode pad 123 and the third pad portion 231 are electrically connected to each other. In the present embodiment, the two second wires 42 are formed by conducting the second wire bonding step twice. Note that the wire may first be bonded to the third pad portion 231 and then bonded to the third electrode pad 123.

In the wire bonding process, the order of the first wire bonding step and the second wire bonding step is not limited, and either step may be conducted first. A wedge tool may be used instead of the capillary in the first wire bonding step, and a capillary may be used instead of the wedge tool in the second wire bonding step. These may be selected appropriately depending on the material, wire diameter, arrangement or the like of the first wire 41 and the second wires 42.

In the resin molding process, the resin package 5 is formed to package the semiconductor device A1. The resin molding process may be performed by a known transfer molding using a mold. Specifically, the lead frame 2 to which the semiconductor element 1, the first wire 41, and the second wires 42 are bonded is set in a molding machine, and fluidized epoxy resin is loaded into the cavity in the mold and molded. Then, the epoxy resin is hardened, and the lead frame 2 after the molding is taken out. Subsequently, excess resin or burrs are removed to form the shape of the resin package 5 described above.

In the finishing process, the semiconductor device A1 is formed into the configuration shown in FIG. 1 and finished as a shippable product. For example, the finishing process includes a cutting step for cutting away unnecessary portions (e.g. the connecting frame described above) of the lead frame 2 that are exposed to the outside of the resin package 5, an exterior treatment step for improving the strength against bending of the lead frame 2 exposed to the outside of the resin package 5, improving adhesion at the time of mounting on a printed circuit board, rust prevention or the like, a lead working step for bending the lead frame 2 exposed to the outside of the resin package 5 into a predetermined shape, a stamping step for stamping a company name, a product name, a rod number or the like on the package, and an inspection/sorting step for discriminating between good products and defective products. These steps may be performed appropriately depending on the specification of the final semiconductor device A1. Through the finishing process, the semiconductor device A1 shown in FIGS. 1-5 is completed.

The advantages of the semiconductor device A1 and its manufacturing method are described below.

According to the present embodiment, the sintered metal bond 3 is not in contact with the element body 11 but in contact with the first electrode pad 121. The first electrode pad 121 has a higher bonding ability than the element body 11. This prevents or reduces a breakage of a part of the sintered metal bond 3 due to impact or the like. Thus, the semiconductor device A1 that uses a sintered metal as the die bonding material has improved reliability. Moreover, in a conventional semiconductor device, the sintered metal bond 3 is in contact with a side surface of the element body 11. With such a configuration, the difference in coefficient of linear expansion between the sintered metal bond 3 (silver) and the element body 11 (silicon) causes a stress to be exerted on the element body 11. Such a stress may cause a crack in the element body 11. By contrast, in the present embodiment, no part of the sintered metal bond 3 is in contact with the element body 11, so that generation of a crack in the element body is eliminated or reduced. Thus, the semiconductor device A1 that uses a sintered metal as the die bonding material has improved reliability.

In the present embodiment, the sintering metal paste 30, which is a base material for the sintered metal bond 3, contains no (or little) epoxy resin. The sintered metal bond 3 made of such a sintering metal paste 30 that does not contain epoxy resin is hard and fragile, as compared with a sintered metal bond made of a sintering metal paste containing epoxy resin. Thus, it may be considered that the sintered metal bond 3 has a high risk of breakage. However, such a risk of breakage of the sintered metal bond 3 is effectively eliminated by the above-described configuration. That is, the bonding structure according to the present embodiment is particularly effective when a sintered metal bond 3 that does not contain epoxy resin is used.

Variations of the semiconductor device A1 are described below with reference to FIGS. 10(*a*)-10(*c*).

Figure 10:
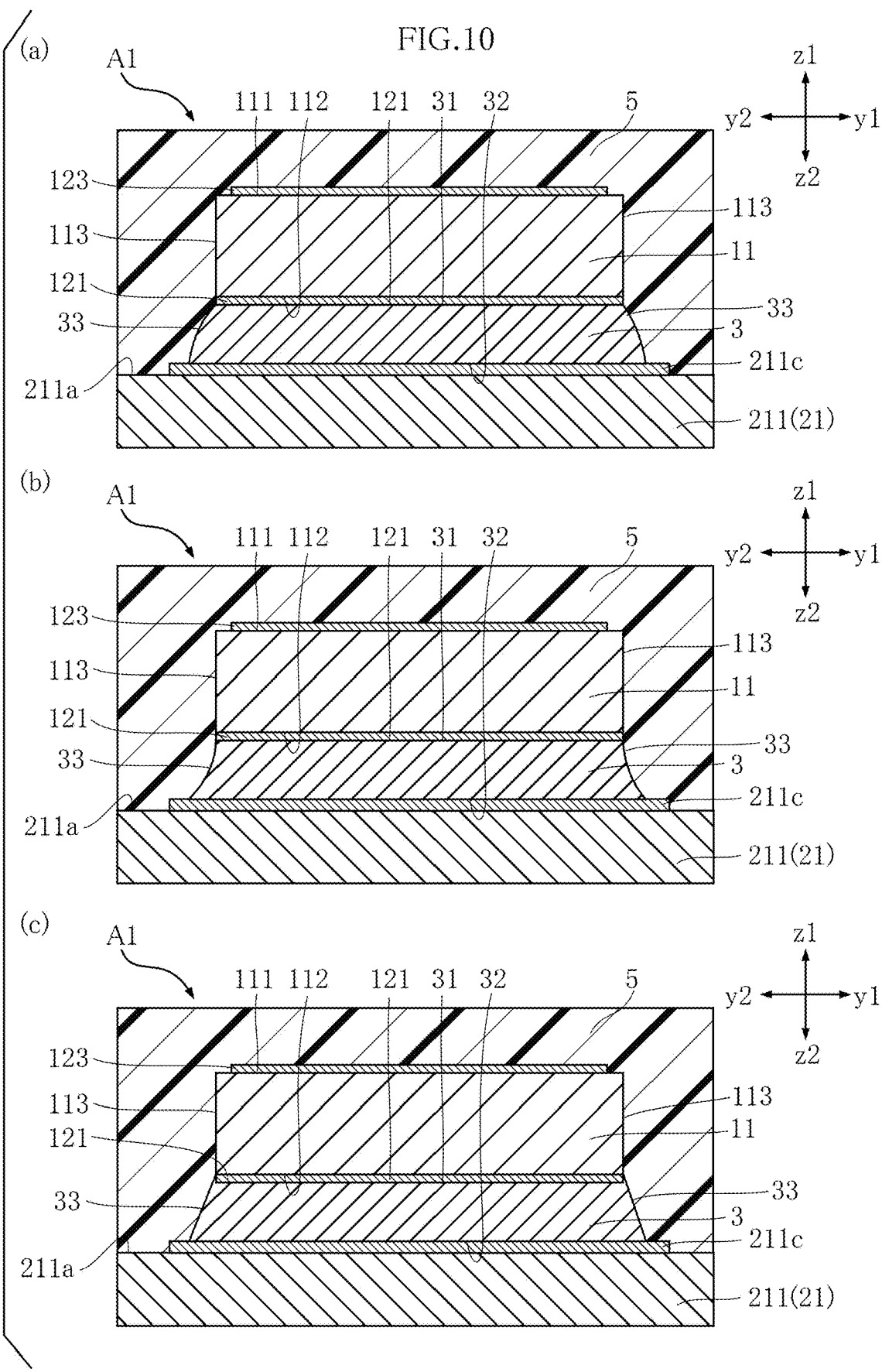
FIG. 10 shows a bonding structure according to variations (a)-(c) of the first embodiment of the first aspect.

FIG. 10(*a*) shows an instance in which each of the sintered metal side surfaces 33 is curved to project outward from the sintered metal bond 3. FIG. 10(*b*) shows an instance in which each of the sintered metal side surfaces 33 is curved inward of the sintered metal bond 3. FIG. 10(*c*) shows an instance in which the z1-direction edge of the sintered metal bond 3 corresponds to the z1-direction edge of the first electrode pad 121. Although each sintered metal side surface 33 is flat in the instance illustrated in FIG. 10(*c*), each side surface 33 may be a curved surface like that shown in FIG. 10(*a*) or FIG. 10(*b*).

In the variations shown in FIG. 10 again, similarly to the first embodiment, the z1-direction edge of the sintered metal bond 3 is offset in the z2 direction from the z1-direction edge of the first electrode pad 121. Note that the bonding structures by the sintered metal bond 3 shown in FIGS. 10(*a*)-10(*c*) are obtained by appropriately setting the type or application amount of the sintering metal paste 30 used for the paste application step, the push-in amount in placing the semiconductor element 1 in the mounting step, or the sintering conditions in the sintering step, for example.

In each of the above-described variations again, the sintered metal bond 3 is not in contact with the element body 11 but in contact with the first electrode pad 121. Thus, the above-described advantages are obtained.

A semiconductor device A2 according to a second embodiment of the first aspect is described below. In the description given below, the elements that are identical or similar to those of the semiconductor device A1 according to the first embodiment are designated by the same reference signs as those used for the semiconductor device A1, and the description thereof is omitted. The semiconductor device A2 of the second embodiment differs from the semiconductor device A1 of the first embodiment in that the entirety of the sintered metal bond 3 is hidden by the semiconductor element 1 as viewed from the z1 side. Except this point, the entire configuration of the semiconductor device A2 is substantially the same as that of the semiconductor device A1 (see FIGS. 1-5).

Figure 11:
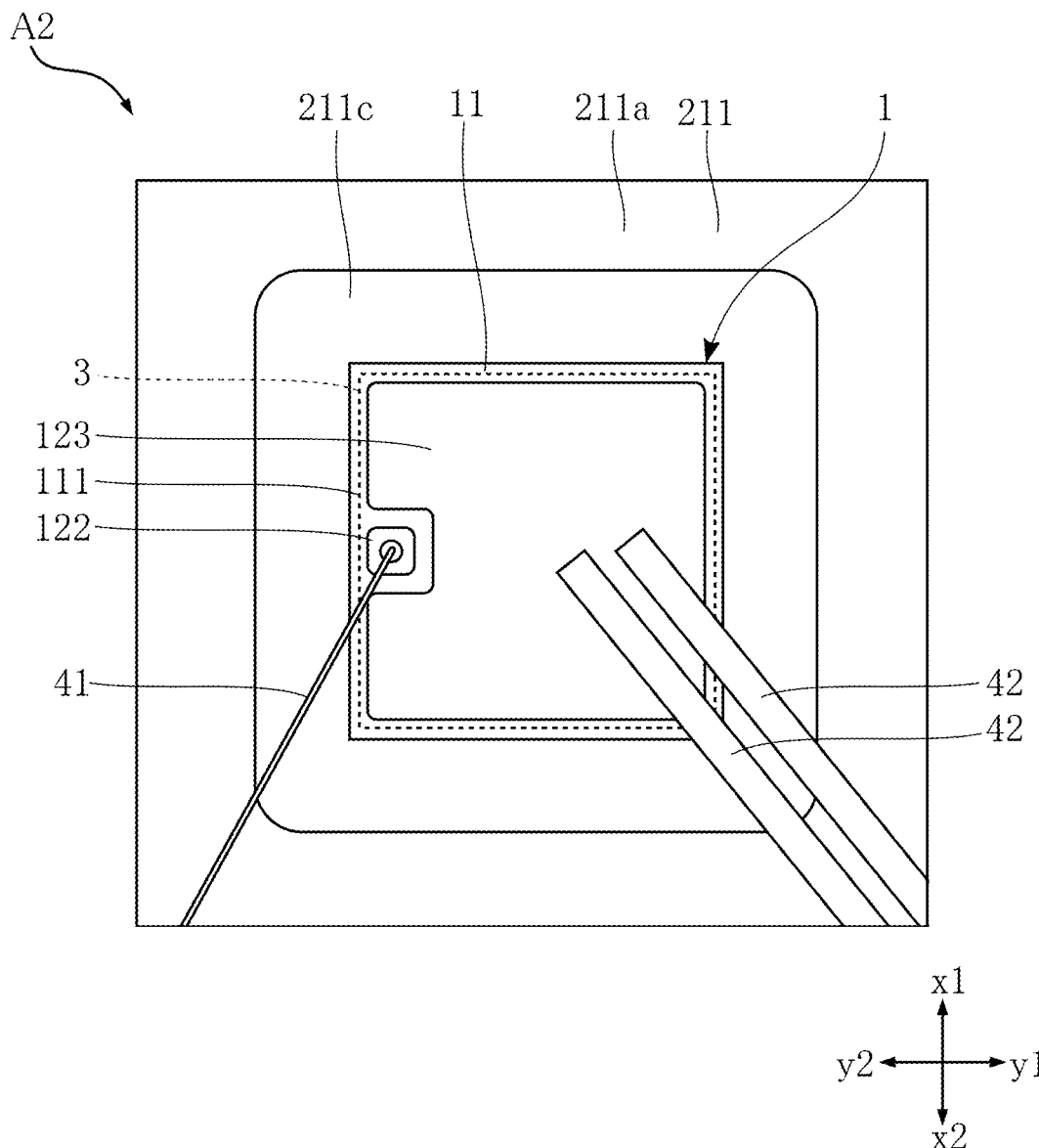
FIG. 11 is an enlarged plan view showing a part a semiconductor device according to a second embodiment of the first aspect.

FIGS. 11 and 12 illustrate the bonding structure in the semiconductor device A2. FIG. 11 is a plan view (corresponding to FIG. 6) showing a part of the semiconductor device A2 as enlarged. In FIG. 11, the sintered metal bond 3 is indicated by broken lines. FIG. 12(*a*) is an enlarged view (corresponding to FIG. 7(*a*)) showing a section of the semiconductor device A2 taken along the y-z plane. FIG. 12(*b*) is an enlarged view (corresponding to FIG. 7(*b*)) showing a section taken along the x-z plane according to the second embodiment. Note that the micrograph of the sintered metal bond 3 according to the second embodiment will be the same as that shown in FIG. 9.

In the present embodiment, as shown in FIGS. 11 and 12, all of the edges of the first contact surface 31 of the sintered metal bond 3 as viewed in the z direction are located on the inner side of the edge of the first electrode pad 121 as viewed in the z direction. As shown in FIG. 12, the edge of the first contact surface 31 as viewed in the z direction and the edge of the second contact surface 32 as viewed in the z direction correspond to each other. That is, all of the edges of the second contact surface 32 as viewed in the z direction are located on the inner side of the edge of the first electrode pad 121 as viewed in the z direction. The sintered metal bond 3 is rectangular as viewed in the x direction as shown in FIG. 12(*a*) and also rectangular as viewed in the y direction as shown in FIG. 12(*b*). Thus, the sintered metal bond 3 is hidden by the semiconductor element 1 as viewed from the z1 side.

According to the present embodiment again, the sintered metal bond 3 is not in contact with the element body 11 but in contact with the first electrode pad 121. This provides the same advantages as those of the first embodiment.

Variations of the semiconductor device A2 are described below with reference to FIGS. 13(*a*)-13(*c*).

Figure 13:
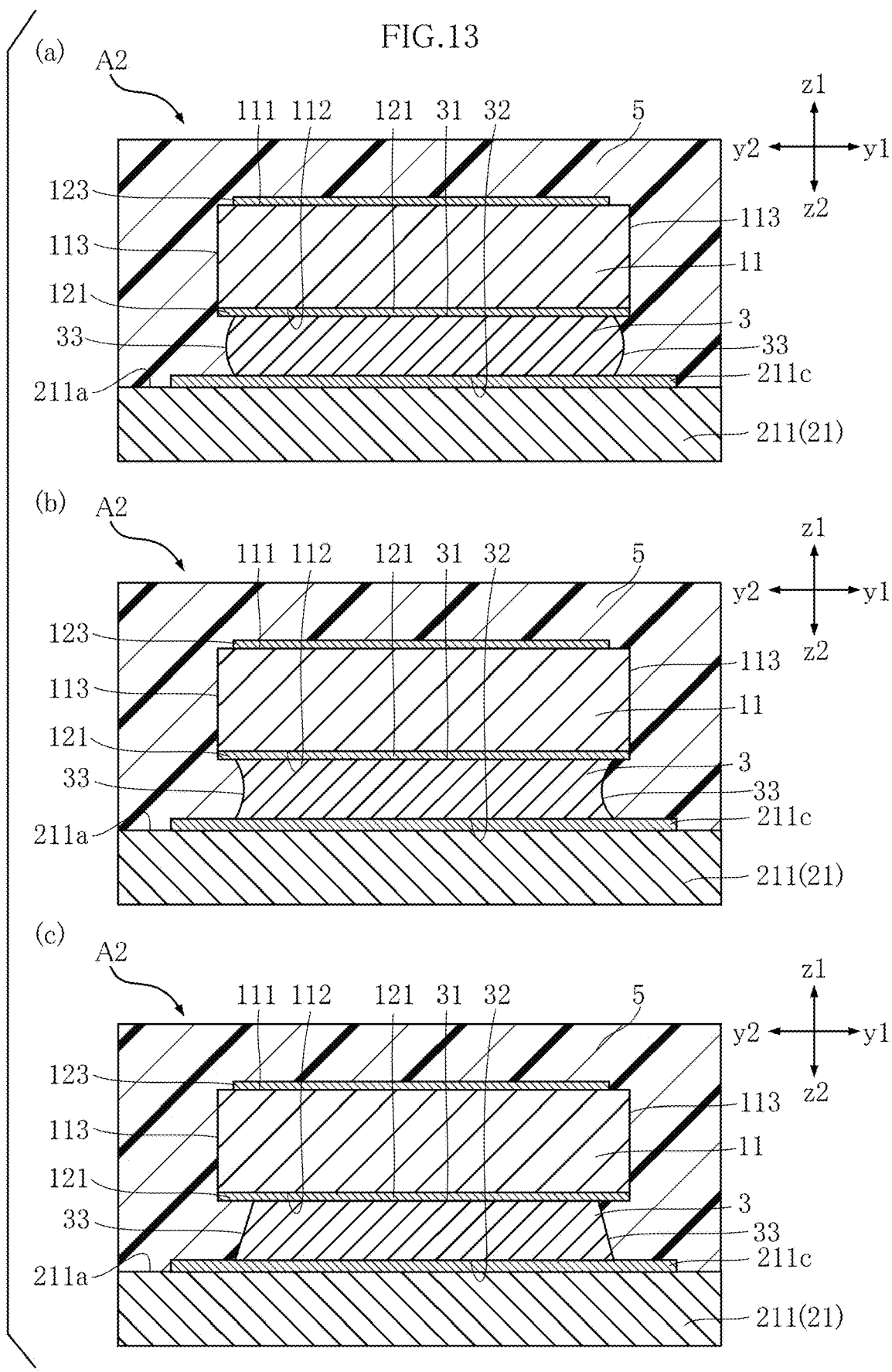
FIG. 13 shows a bonding structure according to variations (a)-(c) of the second embodiment of the first aspect.

FIG. 13(*a*) shows an instance in which each of the sintered metal side surfaces 33 is curved to project outward from the sintered metal bond 3 at its middle part in the z direction. FIG. 13(*b*) shows an instance in which each of the sintered metal side surfaces 33 is curved inward of the sintered metal bond 3 at its middle part in the z direction. FIG. 13(*c*) shows an instance in which each of the sintered metal side surfaces 33 is inclined similarly to the first embodiment. Note that each of the sintered metal side surfaces 33 may have another configuration such as a configuration including both of a projecting portion and an inwardly curved portion.

In the sintered metal bond 3 according to these variations again, similarly to variations of the first embodiment, the z1-direction edge of the sintered metal bond 3 is offset in the z2 direction from the z1-direction edge of the first electrode pad 121. Note that the bonding structures by the sintered metal bond 3 shown in FIGS. 13(*a*)-13(*c*) are obtained by appropriately setting the type or application amount of the sintering metal paste 30 used for the paste application step, the push-in amount in placing the semiconductor element 1 in the mounting step, or the sintering conditions in the sintering step, for example.

In each of the above-described variations of the second embodiment again, the sintered metal bond 3 is not in contact with the element body 11 but in contact with the first electrode pad 121. Thus, the above-described advantages are obtained.

A semiconductor device A3 according to a third embodiment of the first aspect is described below. In the description given below, the elements that are identical or similar to those of the semiconductor devices A1 or A2 according to the first or the second embodiment are designated by the same reference signs as those used for these semiconductor devices, and the description thereof is omitted. The semiconductor device A3 according to the third embodiment differs from the semiconductor devices A1 and A2 of the first and the second embodiments in that the first electrode pad 121 includes a part extending from element reverse surface 112 onto each of the element side surfaces 113. Except this point, the entire configuration of the semiconductor device A3 is substantially the same as that of the semiconductor device A1 (see FIGS. 1-5).

Figure 14:
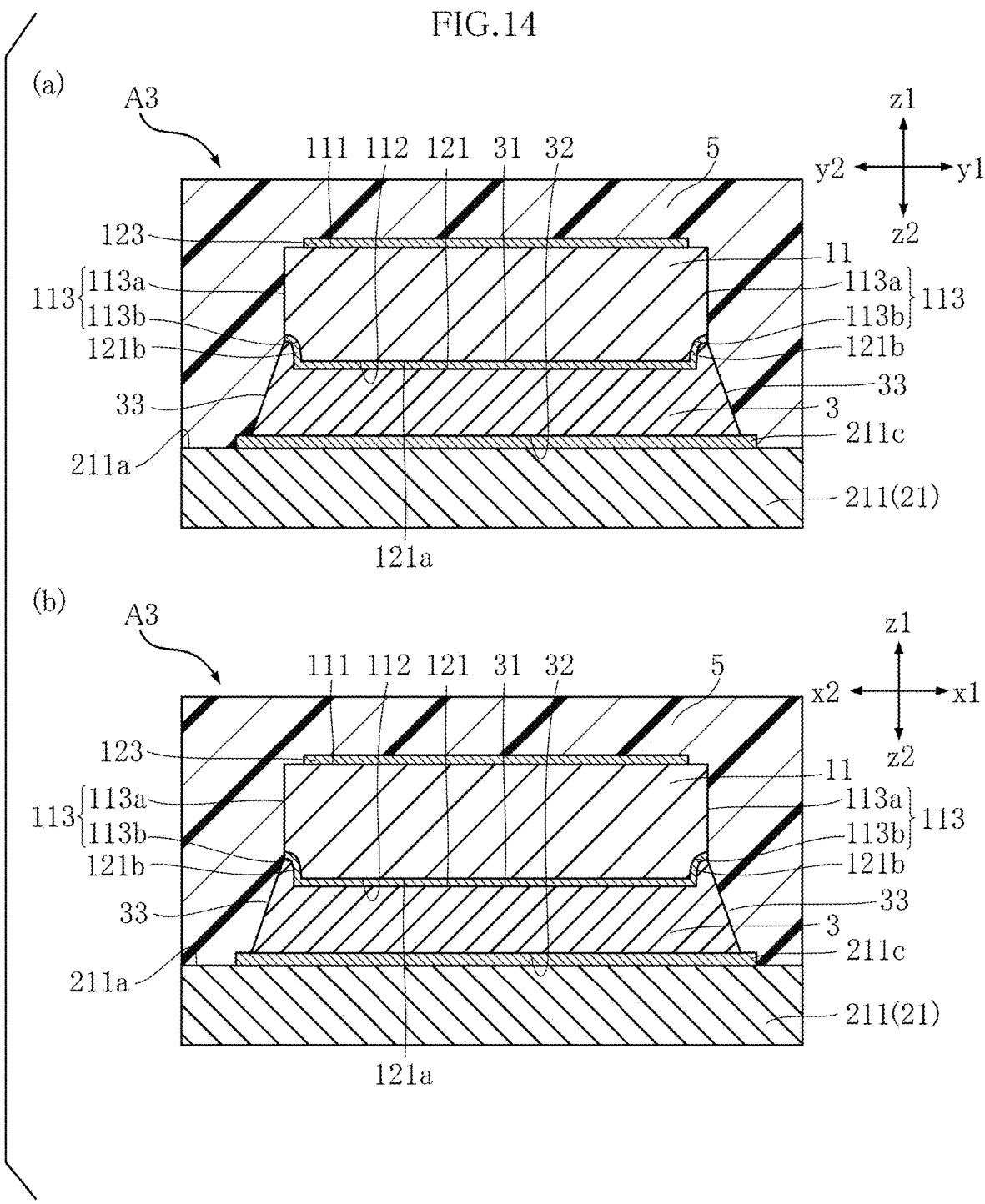
FIG. 14 shows a bonding structure according to a third embodiment of the first aspect.

FIG. 14(*a*) is an enlarged view (corresponding to FIG. 7(*a*)) showing a section taken along the y-z plane according to the third embodiment. FIG. 14(*b*) is an enlarged view (corresponding to FIG. 7(*b*)) showing a section taken along the x-z plane according to the third embodiment. The micrograph of the sintered metal bond 3 according to the third embodiment is the same as that shown in FIG. 9.

As shown in FIG. 14, each of the element side surfaces 113 of the element body 11 includes an element side surface flat portion 113*a* and an element side surface recess 113*b*. The element side surface flat portion 113*a* is a part of each element side surface 113 that is flat. The element side surface recess 113*b* is a part of each element side surface 113 that is curved inward from the element side surface flat portion 113a. In the present embodiment, the element side surface recess 113b is located at the z2-direction edge, connecting the element side surface flat portion 113a and the element reverse surface 112.

In the present embodiment, the first electrode pad 121 includes a first covering portion 121a and second covering portions 121b.

The first covering portion 121a is a part of the first electrode pad 121 that is formed on the element reverse surface 112. The second covering portions 121b are portions of the first electrode pad 121 other than the first covering portion 121a. In the present embodiment, each of the second covering portions 121b is formed on the surface of the element side surface recess 113b of a respective element side surface 113. The second covering portions 121b are connected to the first covering portion 121a. The second covering portions 121b extend in the z1 direction from the opposite x-direction edges and the opposite y-direction edges of the first covering portion 121a toward the element side surface recesses 113b. That is, the second covering portions 121b extend from the first covering portion 121a in the z1 direction along the element side surfaces 113.

The first electrode pad 121 having the first covering portion 121a and the second covering portions 121b may be formed as follows. First, a groove is formed by half-cutting the reverse surface of a wafer along a dicing line. Thereafter, the material for the first electrode pad 121 is applied onto the entire reverse surface of the wafer by sputtering or plating, for example. Subsequently, the wafer is cut along the dicing line with a blade that is narrower than the blade used for half-cutting. As a result, the groove is divided to form the element side surface recesses 113b, and the cut surface of the wafer becomes the element side surface flat portions 113a. The portions of the first electrode pad 121 that are along the element side surface recesses 113b become the second covering portions 121b. The second covering portions 121b are in contact with the sintered metal bond 3. In the illustrated example, the sintered metal bond 3 include portions projecting in the z1 direction, and the projecting portions are in contact with the second covering portions 121b. In the section shown in FIG. 14(a) or 14(b), the edge (front edge) of each projecting portion is offset rearward (in the z2 direction) from the front edge (z1-direction edge) of the relevant second covering portion 121b.

In the present embodiment again, the sintered metal bond 3 is not in contact with the element body 11 but in contact with the first electrode pad 121. This provides the same advantages as those of the first embodiment.

Moreover, in the present embodiment, the contact area between the sintered metal bond 3 and the first electrode pad 121 of the semiconductor element 1 is larger than those in the first and the second embodiments. Thus, the bonding strength between the sintered metal bond 3 and the semiconductor element 1 is enhanced as compared with the first and the second embodiments.

Variations of the semiconductor device A3 are described below with reference to FIGS. 15(a)-15(c).

FIG. 15(a) shows an instance in which each of the second covering portions 121b extends onto an element side surface flat portion 113a. FIG. 15(b) shows an instance in which each of the element side surface recesses 113b is formed at a middle part in the z direction of a respective element side surface 113. In each element side surface 113 of the semiconductor device A3 shown in FIG. 15(b), the opposite edges of each element side surface recess 113b in the z direction are connected to the element side surface flat portion 113a. FIG. 15(C) shows an instance in which each of the element side surfaces 113 does not include an element side surface recess 113b. The semiconductor element 1 having the configurations shown in FIGS. 15(a)-15(C) can be formed by appropriately changing the technique or order of steps for the processing such as wafer dicing, sputtering or plating.

In the variations shown in FIG. 15 again, similarly to the variations of the first embodiment, the z1-direction edge of the sintered metal bond 3 is offset in the z2 direction from the z1-direction edge of the first electrode pad 121. Note that the bonding structures by the sintered metal bond 3 shown in FIGS. 15(a)-15(c) are obtained by appropriately setting the type or application amount of the sintering metal paste 30 used for the paste application step, the push-in amount in placing the semiconductor element 1 in the mounting step, or the sintering conditions in the sintering step, for example.

In each of the above-described variations again, the sintered metal bond 3 is not in contact with the element body 11 but in contact with the first electrode pad 121. Thus, the above-described advantages are obtained.

Figure 15:
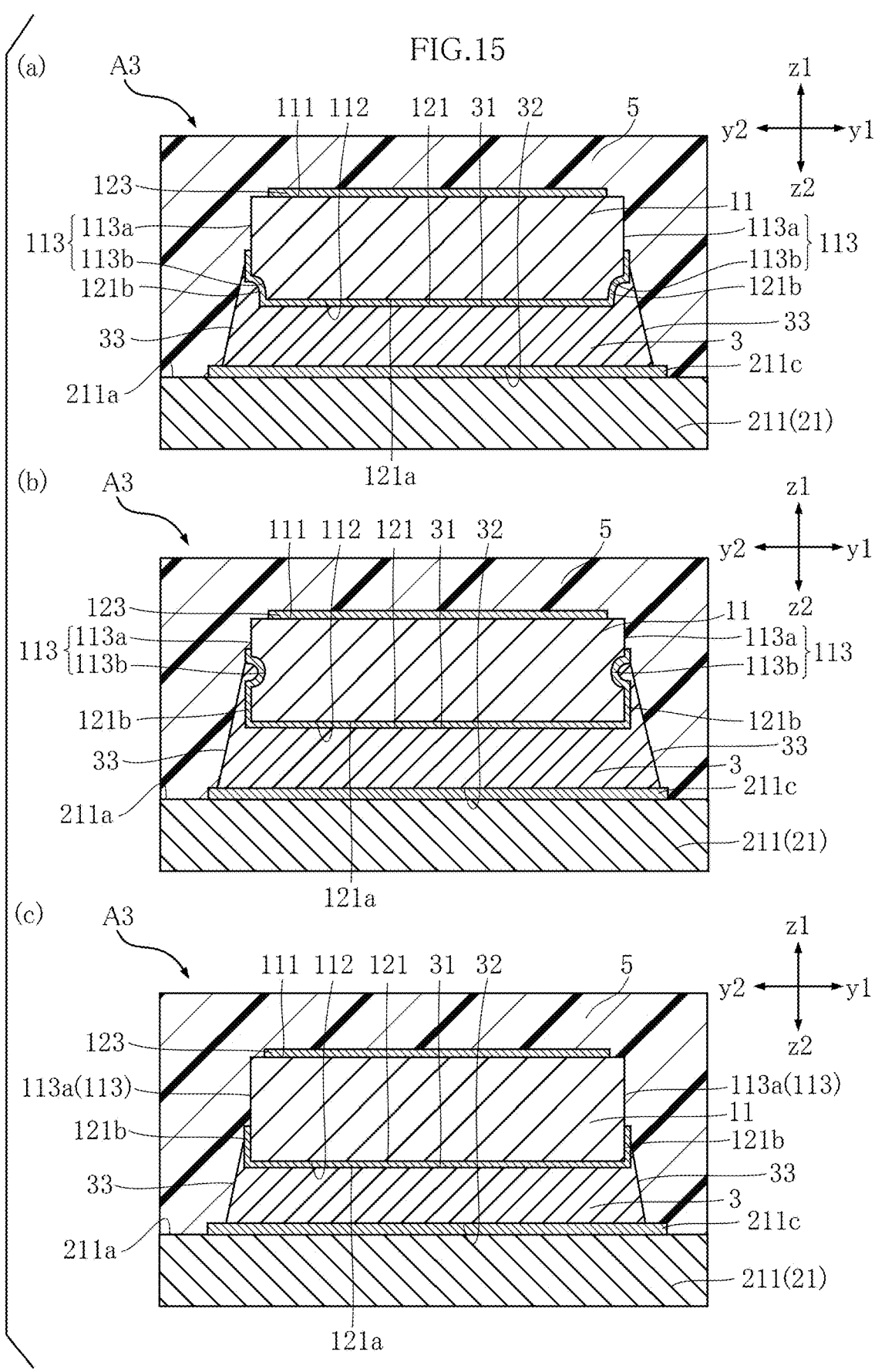
FIG. 15 shows a bonding structure according to variations (a)-(c) of the third embodiment of the first aspect.

Although each of the sintered metal side surfaces 33 is flat in the third embodiment and its variations shown in FIGS. 14 and 15, the sintered metal side surface 33 is not limited to this. That is, in the third embodiment and its variations again, each sintered metal side surface 33 may be curved to project outward from the sintered metal bond (see FIG. 10(a)) or may be curved inward of the sintered metal bond (see FIG. 10(b)), as is in the variations of the first embodiment. Further, although the sintered metal side surfaces 33 are shown as inclined, the sintered metal side surfaces 33 are not limited to this and may be perpendicular to the x-y plane.

Although the first pad portion 211 (pad obverse surface 211a) is formed with a plating layer 211c in the first through the third embodiments, the plating layer 211c may not be formed. That is, the semiconductor element 1 may be bonded to the first pad portion 211 via the sintered metal bond 3. In this case, the second contact surface 32 of the sintered metal bond 3 is in contact with the first pad portion 211 (pad obverse surface 211a).

Although the first through the third embodiments describe an example in which a single semiconductor element 1 is mounted on the lead frame 2, the present disclosure is not limited to this, and a plurality of semiconductor elements 1 may be mounted. In such a case, the shape of the lead frame 2 or the number of leads may be changed appropriately depending on the desired function of the semiconductor device.

Although the first through the third embodiments describe a semiconductor device of a lead frame structure, the technique according to the present disclosure is applicable to various types of semiconductor devices that uses the sintered metal bond 3 to bond the semiconductor element 1. For example, the technique according to the present disclosure is also applicable to a surface-mounting or chip-type semiconductor device that does not have a lead frame.

A semiconductor device or a method for manufacturing a semiconductor device according to the first aspect of the present disclosure can be defined as the following clauses 1A-16A.

Clause 1A.

A semiconductor device comprising:
a semiconductor element including an element body and an electrode pad, the element body having an element obverse surface facing forward in a first direction and an element reverse surface facing rearward in the first direction, the electrode pad covering the element reverse surface;

an element mount portion on which the semiconductor element is mounted; and a sintered metal bond that electrically bonds the electrode pad and the element mount portion, wherein the sintered metal bond includes a first rear edge and a first front edge that is spaced forward in the first direction from the first rear edge, the electrode pad includes a second rear edge and a second front edge that is spaced forward in the first direction from the second rear edge, and the first front edge of the sintered metal bond is spaced rearward in the first direction from the second front edge of the electrode pad.

Clause 2A.

The semiconductor device according to clause 1A, wherein the sintered metal bond includes a first contact surface that is in contact with the electrode pad and a second contact surface opposite to the first contact surface, and in the first direction, an entirety of the first contact surface corresponds to the second rear edge of the electrode pad.

Clause 3A.

The semiconductor device according to clause 2A, further comprising a plating layer formed on the element mount portion, wherein the second contact surface is in contact with the plating layer.

Clause 4A.

The semiconductor device according to clause 3A, wherein the plating layer contains silver.

Clause 5A.

The semiconductor device according to any one of clauses 2A-4A, wherein an edge of the first contact surface and an edge of the electrode pad correspond to each other as viewed in the first direction.

Clause 6A.

The semiconductor device according to any one of clauses 2A-4A, wherein the entirety of the first contact surface overlaps with a part of the electrode pad as viewed in the first direction.

Clause 7A.

The semiconductor device according to clause 5A or 6A, wherein the sintered metal bond has across section perpendicular to the first direction, and an area of the cross section increases as proceeding from the first contact surface toward the second contact surface.

Clause 8A.

The semiconductor device according to clause 5A or 6A, wherein the first contact surface and the second contact surface correspond to each other as viewed in the first direction.

Clause 9A.

The semiconductor device according to clause 1A, wherein the semiconductor element includes an element side surface facing in a second direction perpendicular to the first direction, the electrode pad includes a first covering portion that covers the element reverse surface and a second covering portion that extends forward in the first direction from the first covering portion along the element side surface, and the second covering portion is in contact with the sintered metal bond.

Clause 10A.

The semiconductor device according to any one of clauses 1A-9A, wherein the sintered metal bond comprises porous sintered silver.

Clause 11A.

The semiconductor device according to any one of clauses 1A-10A, wherein the semiconductor element is made of silicon.

Clause 12A.

The semiconductor device according to any one of clauses 1A-11A, further comprising a lead frame, wherein the element mount portion comprises a part of the lead frame.

Clause 13A.

The semiconductor device according to any one of clauses 1A-12A, further comprising a resin package that covers the semiconductor element and the sintered metal bond.

Clause 14A.

The semiconductor device according to any one of clauses 1A-13A, wherein the semiconductor element comprises an IGBT or a power MOSFET.

Clause 15A.

A method for manufacturing the semiconductor device as set forth in any one of clauses 1A to 14A, the method comprising:

a paste application step for applying a sintering metal paste to the element mount portion, a mounting step for placing the semiconductor element on the sintering metal paste in such a manner that the sintering metal paste and the electrode pad face each other, and a sintering step for forming the sintering metal paste into the sintered metal bond by heat treatment, wherein the mounting step includes achieving a paste-pad positional relationship in which a front edge of the sintering metal paste in the first direction is offset rearward in the first direction from a front edge of the electrode pad in the first direction, and the sintering step includes performing the heat treatment while maintaining the paste-pad positional relationship.

Clause 16A.

The manufacturing method according to clause 15A, wherein the mounting step comprises adjusting an amount by which the semiconductor element is pushed into the sintering metal paste to achieve the paste-pad positional relationship.

The semiconductor device and the method for manufacturing the semiconductor device according to the first aspect of the present disclosure is not limited to the foregoing embodiments. The specific structure of each part of the semiconductor device and the specific treatment in each step of the semiconductor device manufacturing method may be varied in design in many ways.

An embodiment according to a second aspect of the present disclosure is described below with reference to FIGS. 16-35.

First, the background to the proposal of the second embodiment according to the second aspects is described. As described before, instead of lead solder, sintered silver or the like is often used as a die bonding material for mounting the semiconductor element to a support member (bonding portion). Specifically, metal paste containing an organic solvent is applied to a bonding portion, and the semiconductor element is mounted on the metal paste. By subsequently heat-treating the metal paste, the organic solvent is evaporated, and a bonding layer made of sintered silver is formed.

In this method, part of the gas generated due to evaporation of the organic solvent remains in the bonding layer without being discharged to the outside, forming voids in the bonding layer. Generally, such voids are formed non-uniformly in the entire bonding layer and sometimes formed concentratedly at a certain area in the bonding layer. In such a case, the bonding strength of the semiconductor element to the bonding portion varies depending on the positions, and a problem such as a breakage of the bonding layer may occur at a position where the bonding strength is relatively small.

Such a problem is not specific to sintered silver but may occur with other types of sintered metal such as sintered copper. In this way, use of sintered metal as a die bonding material in a semiconductor device still has room for improvement as to the enhancement of reliability of the bonding strength.

Embodiments according to the second aspect of the present disclosure have been conceived under the above circumstances. An object of these embodiments is to provide a semiconductor device that has improved reliability even with the use of a sintered metal as a die bonding material and to provide a method for manufacturing such a semiconductor device.

FIGS. 16-20 show a semiconductor device B1 according to a first embodiment of the second aspect. The semiconductor device B1 is of a type to be mounted on electrical circuit boards of automobiles, electronic devices, etc. The semiconductor device B1 includes a semiconductor element 1, a lead frame 2, a sintered metal bond 3, a plurality of wires 4, and a resin package 5.

Figure 16:
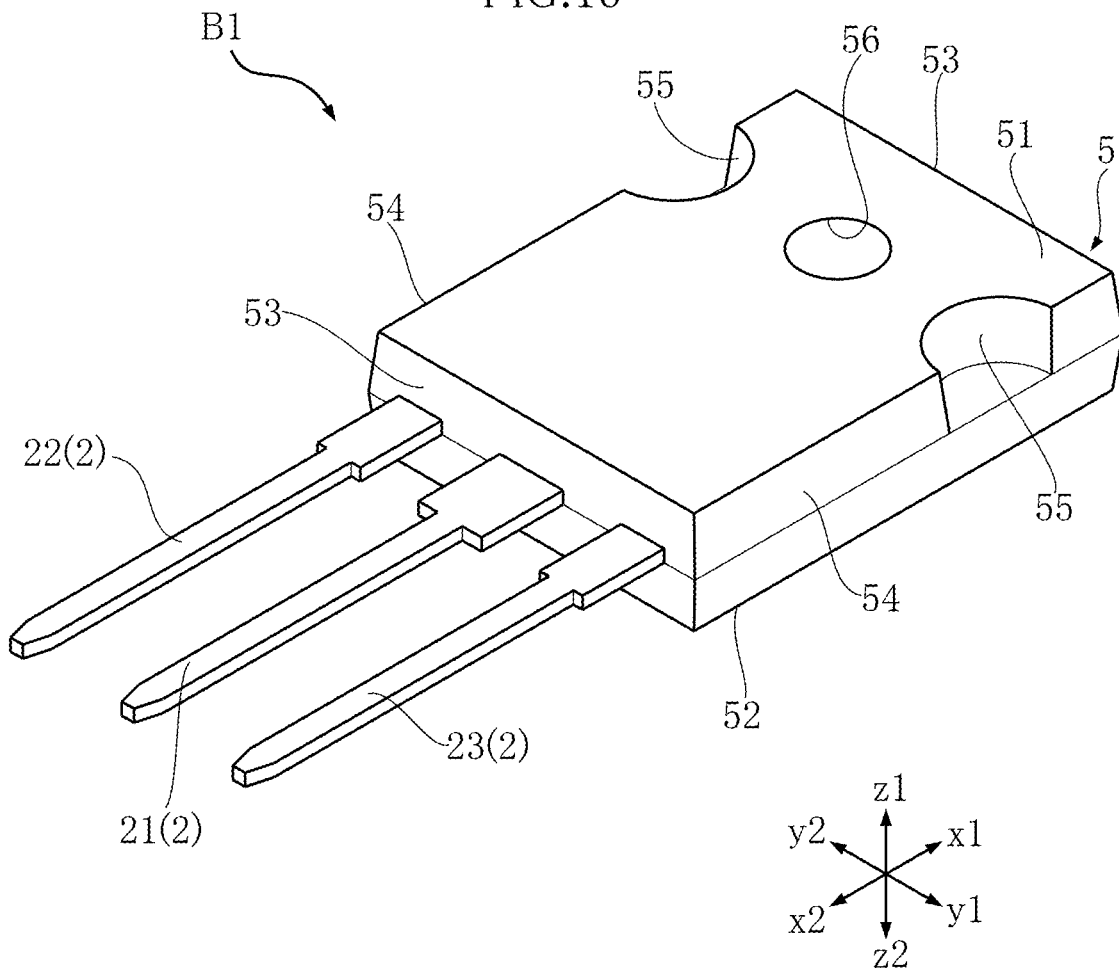
FIG. 16 is a perspective view of a semiconductor device according to a first embodiment of a second aspect.
Figure 17:
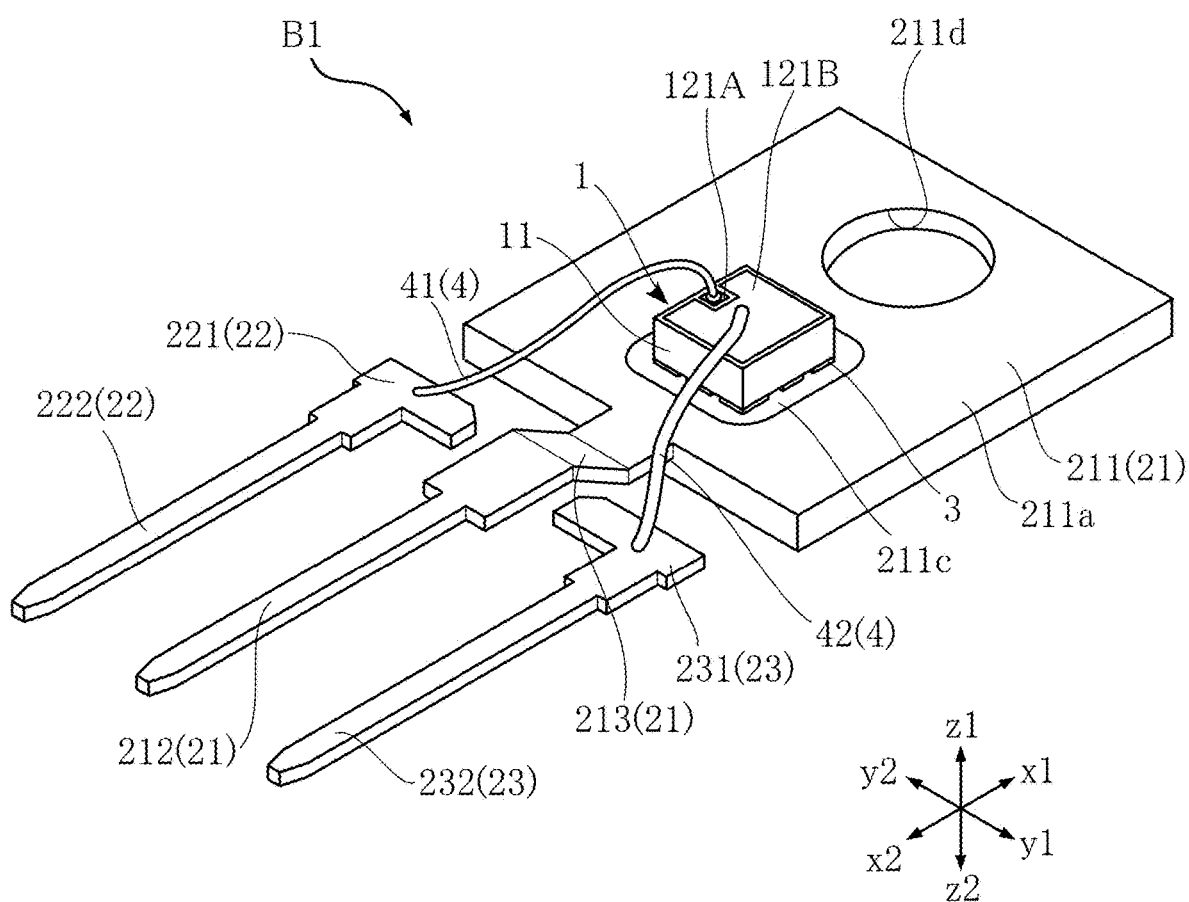
FIG. 17 is a view in which a resin package is omitted from the perspective view shown in FIG. 16.
Figure 18:
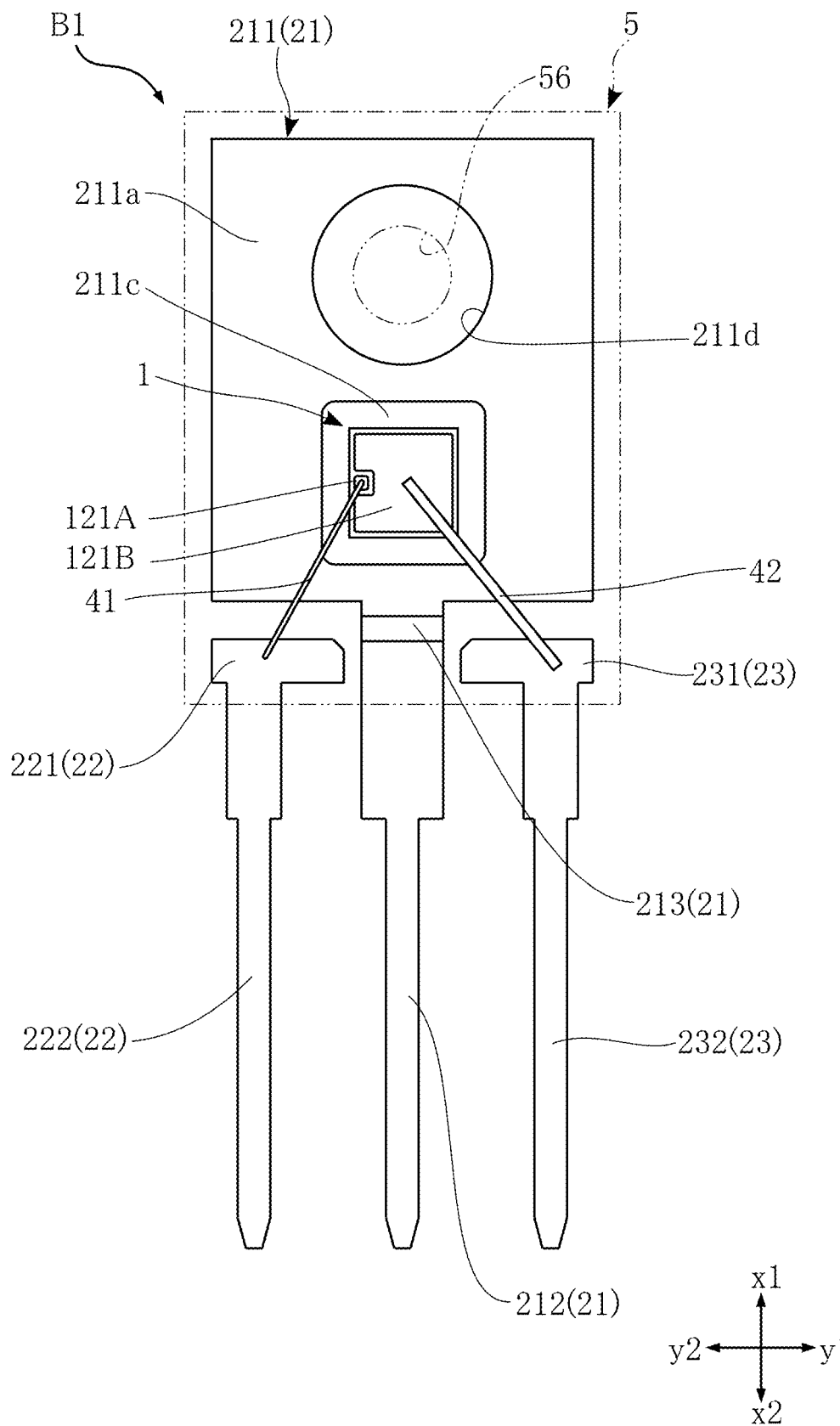
FIG. 18 is a plan view of the semiconductor device according to the first embodiment of the second aspect.
Figure 19:
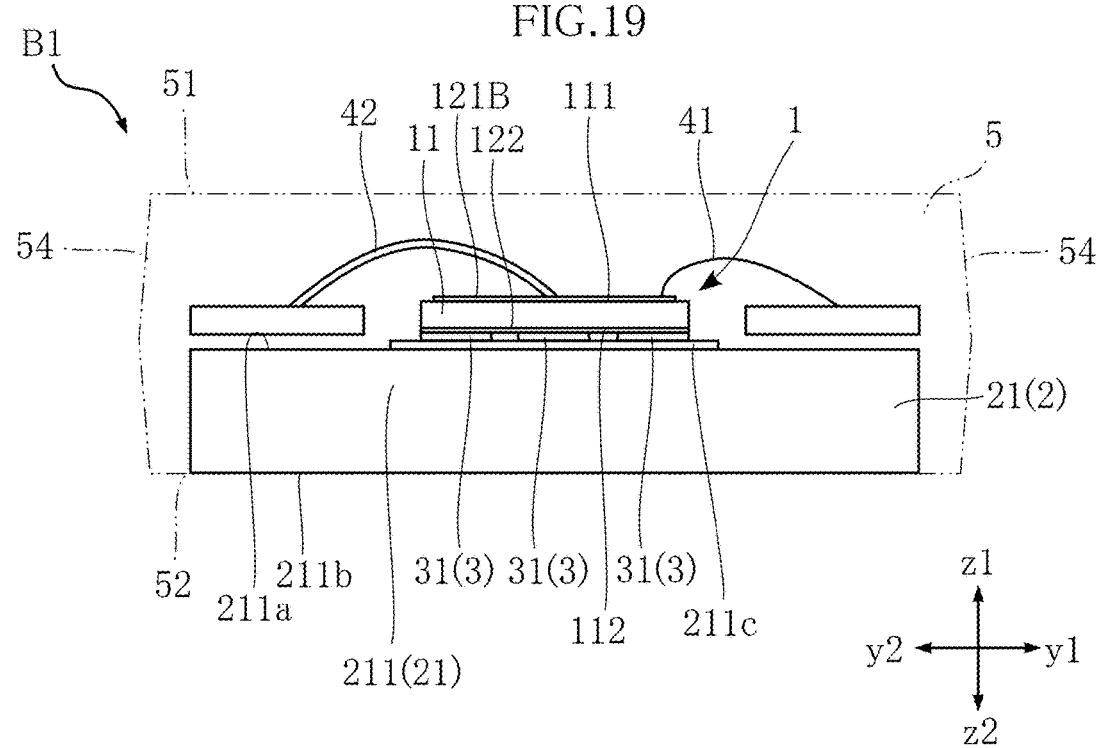
FIG. 19 is a rear view of the semiconductor device according to the first embodiment of the second aspect.
Figure 20:
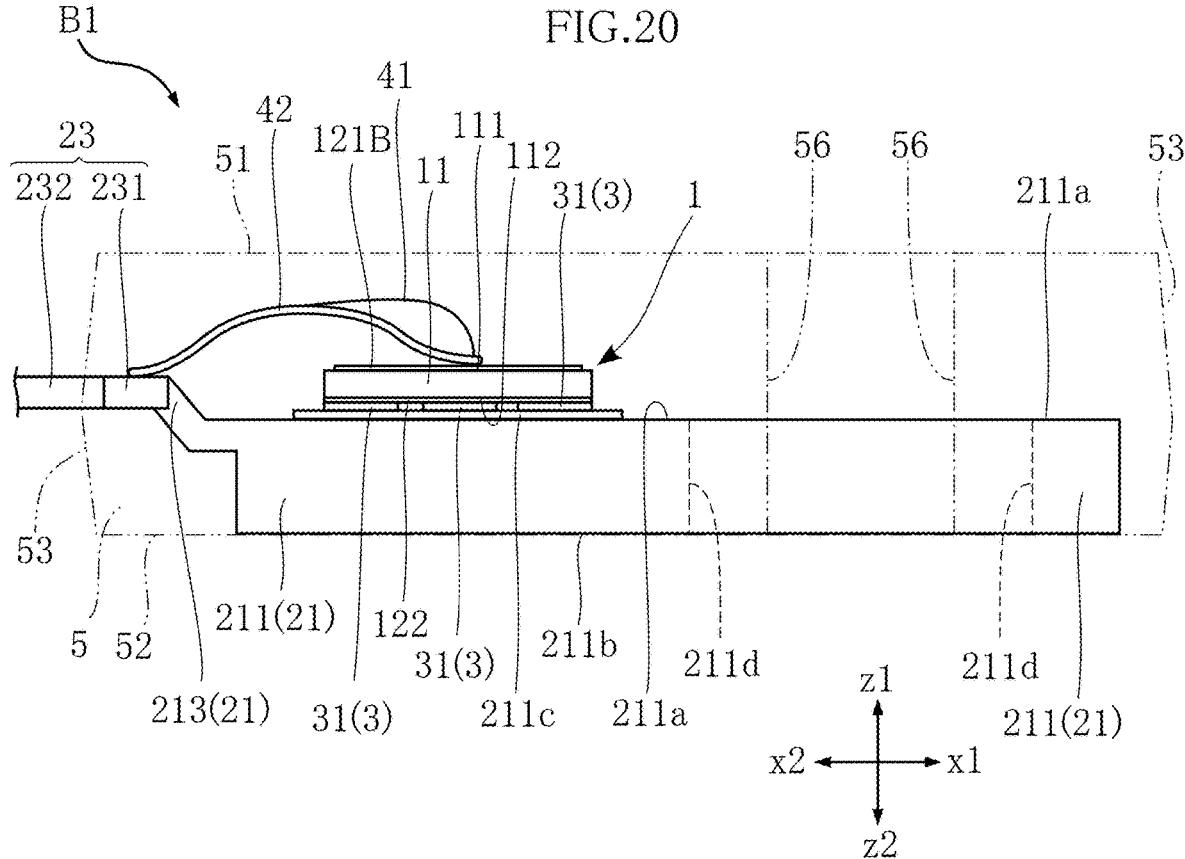
FIG. 20 is a right-side view of the semiconductor device according to the first embodiment of the second aspect.

FIG. 16 is a perspective view of the semiconductor device B1. FIG. 17 is a perspective view in which illustration of the resin package 5 is omitted from FIG. 16. FIG. 18 is a plan view of the semiconductor device B1 (as viewed from the z1 side toward the z2 side). FIG. 19 is a back view of the semiconductor device B1 (as viewed from the x1 side toward the x2 side). FIG. 20 is a right-side view of the semiconductor device B1 (as viewed from the y1 side toward the y2 side). In FIGS. 18-20, the resin package 5 is indicated by two-dot chain lines.

The semiconductor element 1 is an electronic component that can perform the main function of the semiconductor device B1. In the present embodiment, the semiconductor element 1 is a power semiconductor element such as a power MOSFET (Metal Oxide Semiconductor Field Effect Transistor) or an IGBT (Insulated Gate Bipolar Transistor). In the present embodiment, the semiconductor element 1 has a rectangular shape of 4 mm square as viewed in the z direction. That is, both of the x-direction dimension and the y-direction dimension are 4 mm. Note that the size of the semiconductor element 1 is not limited to this. The semiconductor element 1 includes an element body 11, an obverse surface electrode pad 121, and a reverse surface electrode pad 122.

The element body 11 is made of a semiconductor material. In the present embodiment, the semiconductor material is silicon. The element body 11 is in the form of a rectangular parallelepiped. The element body 11 includes an element obverse surface 111, an element reverse surface 112 and a plurality of element side surfaces 113.

The element obverse surface 111 and the element reverse surface 112 face away from each other. In the present embodiment, the element obverse surface 111 faces in the z1 direction. The element reverse surface 112 faces in the z2 direction. The element obverse surface 111 and the element reverse surface 112 are both flat.

Each of the element side surfaces 113 is perpendicular to the element obverse surface 111 and the element reverse surface 112. Each element side surfaces 113 is connected to the element obverse surface 111 at its z1-direction edge and connected to the element reverse surface 112 at its z2-direction edge. As viewed in the z direction, each element side surfaces 113 faces to the outside of the semiconductor element 1. In the present embodiment, each element side surface 11 is entirely flat.

The obverse surface electrode pad 121 is formed on the element obverse surface 111. In the present embodiment, the obverse surface electrode pad 121 includes a first obverse surface electrode pad 121A and a second obverse surface electrode pad 121B. The first obverse surface electrode pad 121A and the second obverse surface electrode pad 121B are insulated from each other. The area of the first obverse surface electrode pad 121A is smaller than that of the second obverse surface electrode pad 121B. To the first obverse surface electrode pad 121A is connected a first wire 41. To the second obverse surface electrode pad 121B is connected a second wire 42.

The reverse surface electrode pad 122 is formed on the element reverse surface 112. The reverse surface electrode pad 122 is rectangular as viewed in the z direction. All of the edges of the reverse surface electrode pad 122 as viewed in the z direction correspond to the edges of the element reverse surface 112 as viewed in the z direction. Thus, the reverse surface electrode pad 122 covers the entirety of the element reverse surface 112.

Each of the obverse surface electrode pad 121 and the reverse surface electrode pad 122 may be made of a plating layer of Cu, Ni, Al or Au, for example. For example, when the semiconductor element 1 is a power MOSFET, the reverse surface electrode pad 122 may be a drain electrode, the first obverse surface electrode pad 121A may be a gate electrode, and the second obverse surface electrode pad 121B may be a source electrode. For example, when the semiconductor element 1 is an IGBT, the reverse surface electrode pad 122 may be a collector electrode, the first obverse surface electrode pad 121A may be a gate electrode, and the second obverse surface electrode pad 121B may be an emitter electrode. Note that these are merely examples, and the present disclosure is not limited to these.

The lead frame 2 is made of an electrically conductive material. Examples of such an electrically conductive material include Cu. The lead frame 2 is bonded to an electrical circuit board to form a conduction path between the semiconductor element 1 and the electrical circuit board. In the present embodiment, the lead frame 2 includes a first lead 21, a second lead 22 and a third lead 23.

The first lead 21 includes a first pad portion (die pad) 211, a first terminal 212 and an intermediate connecting portion 213.

The first pad portion 211 is a part on which the semiconductor element 1 is mounted. The first pad portion 211 has a pad obverse surface 211a and a pad reverse surface 211b.

The pad obverse surface 211a faces in the z1 direction. The pad obverse surface 211a is entirely flat. The pad obverse surface 211a is formed with a plating layer 211c. The plating layer 211c covers a part of the pad obverse surface 211a on which the semiconductor element 1 is mounted. In the present embodiment, the plating layer 211c is rectangular as viewed in the z direction and has an area larger than that of the semiconductor element 1. It is only required that the plating layer 211c covers at least the part on which the semiconductor element 1 is mounted. Thus, the plating layer 211c may additionally cover other portions or may cover the entirety of the lead frame 2. The plating layer 211c is made of Ag, for example. The material for the plating layer 211c is not limited to this. The plating layer 211c may be formed by electroplating. The method for forming the plating layer 211c is not limited to this.

The pad reverse surface 211b faces in the z2 direction. The pad reverse surface 211b is entirely flat. The pad reverse surface 211b is entirely exposed from the resin package 5. This enhances the heat dissipation performance of the semiconductor device B1. Note that the pad reverse surface 211b may be covered with the resin package 5.

The first pad portion 211 is formed with a pad through-hole 211d extending from the pad obverse surface 211a to the pad reverse surface 211b. The pad through-hole 211d is spaced apart from the semiconductor element 1 as viewed in the z direction.

As shown in FIGS. 17 and 18, the first terminal 212 extends along the x direction. The first terminal 212 is partially exposed from the resin package 5. The first terminal 212 is electrically connected to the reverse surface electrode pad 122 via the intermediate connecting portion 213, the first pad portion 211, the plating layer 211c and the sintered metal bond 3.

As shown in FIGS. 17 and 18, the intermediate connecting portion 213 is connected to the first pad portion 211 and the first terminal 212. The first pad portion 211 and the first terminal 212 differ from each other in position in the z direction, and the first pad portion 211 is offset from the first terminal 212 in the z2 direction. Thus, the intermediate connecting portion 213 is inclined with respect to the first pad portion 211 and the first terminal 212. The intermediate connecting portion 213 is entirely covered with the resin package 5.

The second lead 22 includes a second pad portion 221 and a second terminal 222.

As shown in FIGS. 17 and 18, the dimension of the second pad portion 221 in the y direction is larger than that of the second terminal 222. The second pad portion 221 is entirely covered with the resin package 5. As shown in FIGS. 17 and 18, to the second pad portion 221 is connected the first wire 41.

As shown in FIGS. 17 and 18, the second terminal 222 extends along the x direction. The second terminal 222 is partially exposed from the resin package 5.

The third lead 23 includes a third pad portion 231 and a third terminal 232.

As shown in FIGS. 17 and 18, the dimension of the third pad portion 231 in the y direction is larger than that of the third terminal 232. The third pad portion 231 is entirely covered with the resin package 5. As shown in FIGS. 17 and 18, to the third pad portion 231 is connected the second wire 42.

As shown in FIGS. 17 and 18, the third terminal 232 extends along the x direction. The third terminal 232 is partially exposed from the resin package 5.

The first lead 21, the second lead 22 and the third lead 23 are spaced apart from each other. In the y direction, the first terminal 212 of the first lead 21 is located between the second terminal 222 of the second lead 22 and the third terminal 232 of the third lead 23. The portions of the first terminal 212, second terminal 222 and third terminal 232 that are exposed from the resin package 5 are covered with a metal plating layer. For example, the metal plating layer is made of a same material as the plating layer 211c. The metal plating layer is formed by electroplating.

Figure 21:
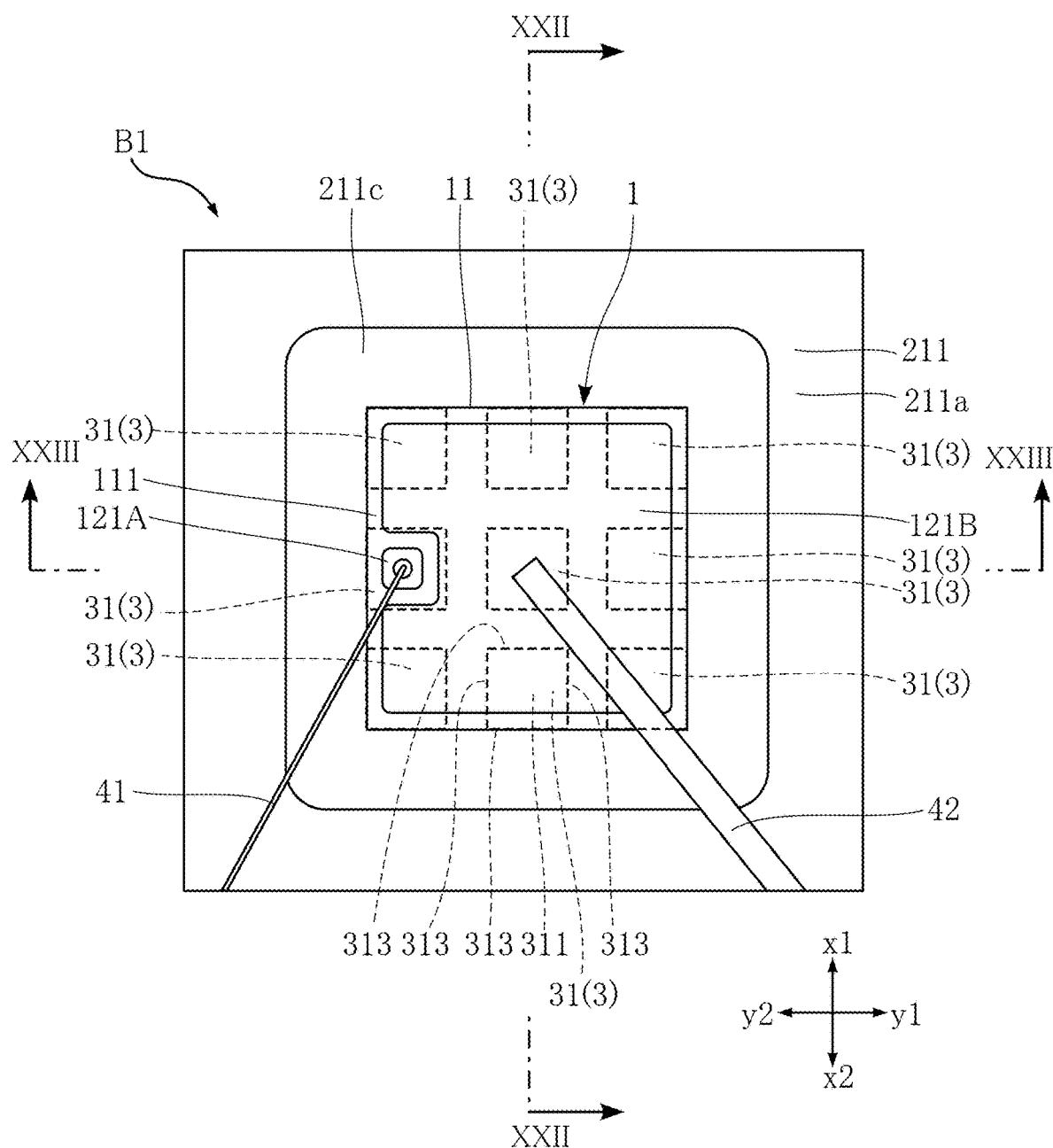
FIG. 21 is a plan view showing a part of FIG. 18 as enlarged.
Figure 22:
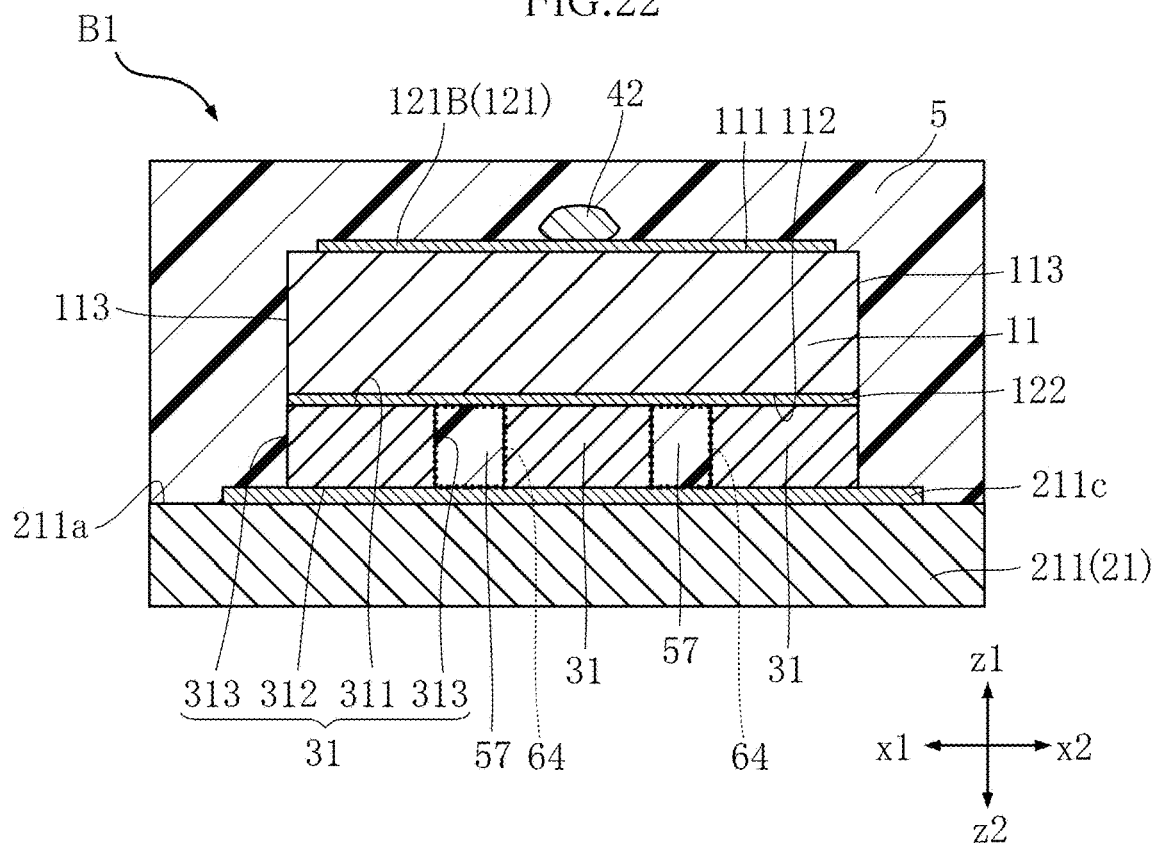
FIG. 22 is a sectional view taken along line XXII-XXII in FIG. 21.
Figure 23:
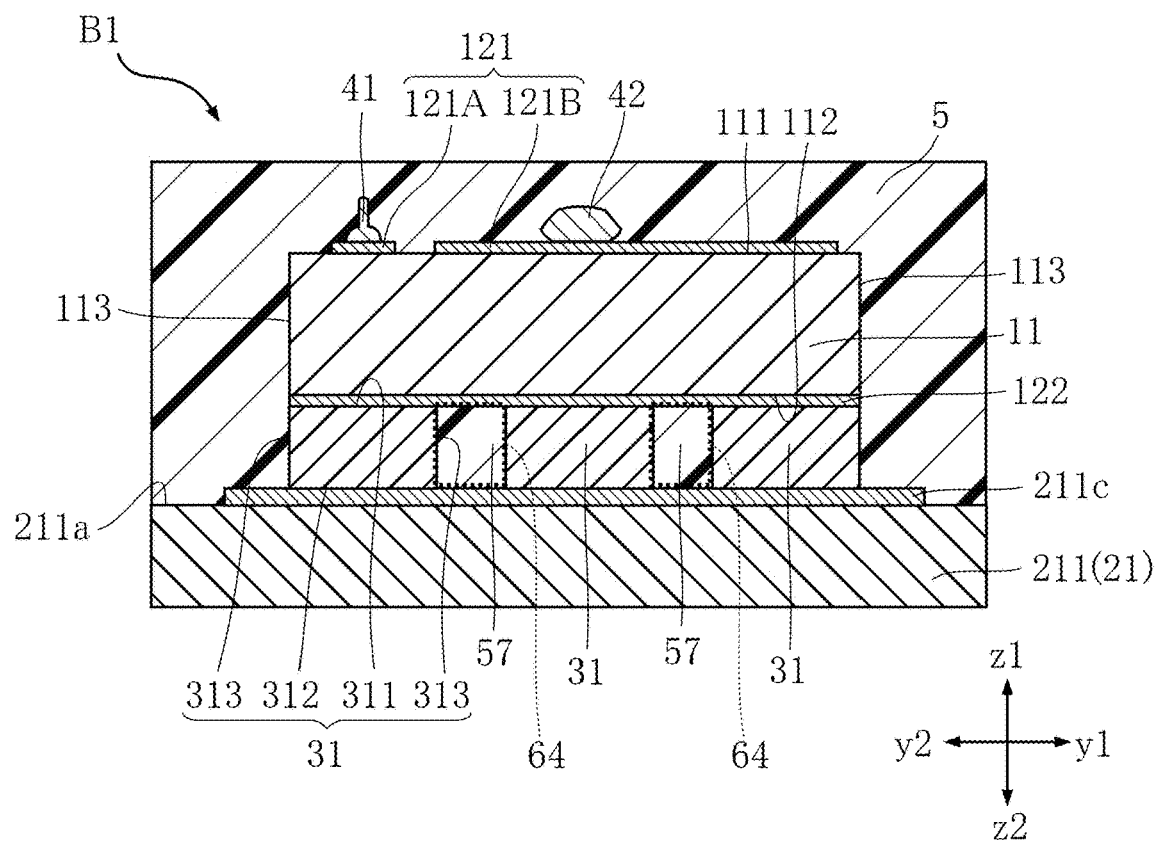
FIG. 23 is a sectional view taken along line XXIII-XXIII in FIG. 21.
Figure 24:
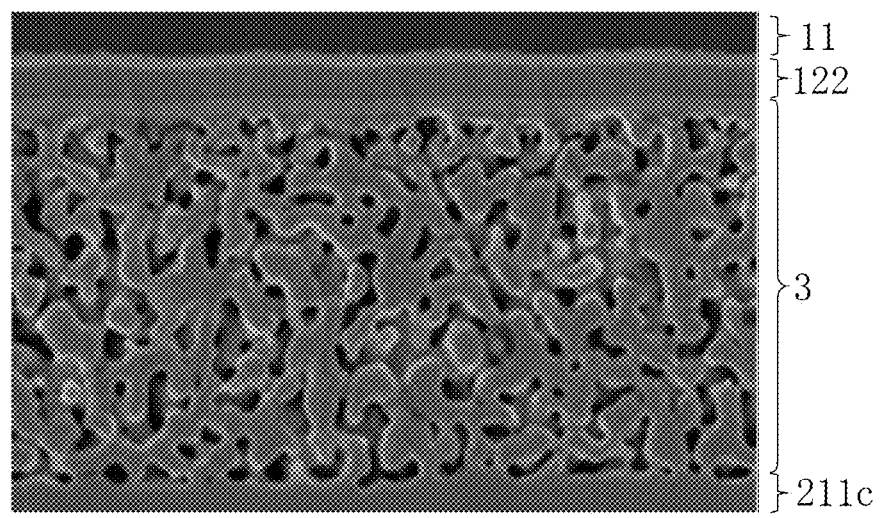
FIG. 24 shows a micrograph of a sintered metal bond.

The sintered metal bond 3 is interposed between the semiconductor element 1 and the lead frame 2 (the first pad portion 211) to electrically bond these parts to each other. FIGS. 21-24 illustrate the sintered metal bond 3. FIG. 21 is a plan view showing a part of FIG. 18 as enlarged. In FIG. 21, the sintered metal bond 3 is indicated by broken lines. FIG. 22 is a sectional view taken along line XXII-XXII in FIG. 21. FIG. 23 is a sectional view taken along line XXIII-XXIII in FIG. 21. FIG. 24 shows a micrograph of the sintered metal bond 3.

The sintered metal bond 3 is made of sintered metal. In the present embodiment, the sintered metal is sintered silver. The sintered metal is not limited to this and may be sintered copper, for example. As shown in FIG. 24, the sintered metal bond 3 is porous and has a large number of minute pores. In the present embodiment, the minute pores of the sintered metal bond 3 are left unfilled. However, the pores may be filled with epoxy resin. That is, the sintered metal bond 3 may contain epoxy resin. However, since a high content of epoxy resin may reduce the electrical conductivity of the sintered metal bond 3, the content of epoxy resin may be determined in view of the amount of current that flows to the semiconductor element 1.

In the present embodiment, as shown in FIG. 21, the sintered metal bond 3 is made up of a plurality of individual bonding parts 31. The plurality of individual bonding parts 31 are spaced apart from each other. In the present embodiment, as shown in FIG. 21, each of the individual bonding parts 31 is rectangular as viewed in the z direction. The shape of each individual bonding part is not limited to a rectangular shape and may be a circular shape or a polygonal shape. Each individual bonding part 31 is 1 mm square as viewed in the z direction. Note that the dimension of each individual bonding part 31 as viewed in the z direction is not limited to this. The dimension of the sintered metal bond 3 as viewed in the z direction depends on the shape, as viewed in the z direction, of an application region 61 in the paste application step, which is described later. The individual bonding parts 31 are arranged in a matrix, and the distance between adjacent individual bonding parts 31 in the x direction and the y direction is set to 0.5 mm. In the present embodiment, as shown in FIG. 21, all of the individual bonding parts 31 overlap the semiconductor element 1 as viewed in the z direction. As shown in FIGS. 22 and 23, each of the individual bonding parts 31 is rectangular as viewed in the x direction and as viewed in the y direction. Each of the individual bonding parts 31 has a bonding part obverse surface 311, a bonding part reverse surface 312 and a plurality of bonding part side surfaces 313.

As shown in FIGS. 22 and 23, each of the bonding part obverse surfaces 311 is in contact with the reverse surface electrode pad 122. As shown in FIGS. 22 and 23, each of the bonding part reverse surfaces 312 is in contact with the plating layer 211c. Each of the bonding part side surfaces 313 is connected to the bonding part obverse surface 311 at its z1-direction edge and connected to the bonding part reverse surface 312 at its z2 direction edge. In the present embodiment, the plurality of bonding part side surfaces 313 include a surface facing in the x1 direction, a surface facing in the x2 direction, a surface facing in the y1 direction and a surface facing in the y2 direction. Each of the bonding part side surfaces 313 is entirely flat. In the present embodiment, each of the bonding part side surfaces 313 is perpendicular to the x-y plane as shown in FIGS. 22 and 23, but is not limited to this. For example, each of the bonding part side surfaces 313 may be inclined in such a manner that the cross section in the x-y plane of each individual bonding part becomes larger as proceeding from the z1 side toward the z2 side. Alternatively, each of the bonding part side surfaces 313 may be a convex surface projecting outward at its middle part in the z direction or may be a concave surface curved inward at its middle part in the z direction. These shapes can be obtained by appropriately setting the sintering conditions in the sintering step, for example.

Each of the plurality of wires 4 connects the semiconductor element 1 and the lead frame 2 to establish electrical conduction between these. The wires 4 include the first wire 41 and the second wire 42.

As shown in FIGS. 17 and 18, the first wire 41 has one end bonded to the second pad portion 221 and the other end bonded to the semiconductor element 1 (the first obverse surface electrode pad 121A). The first wire 41 electrically connects the second pad portion 221 and the first obverse surface electrode pad 121A. In the present embodiment, the main material for the first wire 41 is aluminum (Al). That is, the first wire 41 contains aluminum as its constituent material. The content of aluminum may be 100% or less than 100%. (That is, impurities may be contained.) The main material is not limited to aluminum but may be gold (Au) or copper (Cu), for example.

As shown in FIGS. 17 and 18, the second wire 42 has one end bonded to the third pad portion 231 and the other end bonded to the semiconductor element 1 (the second obverse surface electrode pad 121B). The second wire 42 electrically connects the third pad portion 231 and the second obverse surface electrode pad 121B. In the present embodiment, the main material for the second wire 41 is aluminum (Al). The main material for the second wire 42 is not limited to aluminum but may be gold (Au) or copper (Cu), for example. The diameter of the second wire 42 is larger than that of the first wire 41.

The material, number, and wire diameter of the first wire 41 and the second wire 42 may be determined in view of the current that flows through these wires. A plurality of second wires 42 may be provided to secure a certain amount of current flow or guarantee proper operation when one wire is broken.

The resin package 5 covers the semiconductor element 1, a part of the lead frame 2, the sintered metal bond 3, and the plurality of wires 4. The resin package 5 is made of a thermosetting synthetic resin having electrical insulation properties. In the present embodiment, the resin package 5 is made of black epoxy resin. The resin package 5 includes a resin obverse surface 51, a resin reverse surface 52, a pair of first resin side surfaces 53 and a pair of second resin side surfaces 54.

As shown in FIGS. 19 and 20, the resin obverse surface 51 faces in the z1 direction. As shown in FIGS. 19 and 20, the resin reverse surface 52 faces in the z2 direction.

As shown in FIG. 20, the paired first resin side surfaces 53 are spaced apart from each other in the x direction. The paired first resin side surfaces 53 face away from each other in the x direction. As shown in FIG. 20, each of the paired first resin side surfaces 53 is connected to the resin obverse surface 51 at its z1-direction edge and connected to the resin reverse surface 52 at its z2-direction edge. In the present embodiment, a part of the first lead 21 (the first terminal 212), a part of the second lead 22 (the second terminal 222) and a part of the third lead (the third terminal 232) are exposed from the first resin side surface 53 located on the x2 side.

As shown in FIG. 19, the paired second resin side surfaces 54 are spaced apart from each other in the y direction. The paired second resin side surfaces 54 face away from each other in the y direction. As shown in FIG. 19, each of the paired second resin side surfaces 54 is connected to the resin obverse surface 51 at its z1-direction edge and connected to the resin reverse surface 52 at its z2-direction edge.

The resin package 5 is formed with a pair of resin recesses 55 extending inward of the resin package 5 from the respective z1-direction edges of the paired second resin side surfaces 54. As shown in FIGS. 16 and 20, the resin package 5 is formed with a resin through-hole 56 extending from the resin obverse surface 51 to the resin reverse surface 52 in the z direction. In the present embodiment, as viewed in the z direction, the center of the resin through-hole 56 corresponds to the center of the pad through-hole 211d. The diameter of the resin through-hole 56 is smaller than that of the pad through-hole 211d. In the present embodiment, the hole wall of the pad through-hole 211d is entirely covered with the resin package 5. Though not illustrated, by inserting a fastener such as a screw into the resin through-hole 56, a heat dissipating member such as a heat spreader may be attached to the semiconductor device B1, so that the heat dissipation performance of the semiconductor device B1 is improved.

As shown in FIGS. 22 and 23, the resin package 5 includes portions interposed between the reverse surface electrode pad 122 and the plating layer 211c. These portions are referred to as interposed portions 57. Each of the interposed portions 57 extends from the reverse surface electrode pad 122 to the plating layer 211c in the z direction.

As shown in FIGS. 22 and 23, in the semiconductor device B1 configured as described above, between the semiconductor element 1 (the reverse surface electrode pad 122) and the first pad portion 211 (the plating layer 211c) exist portions where the sintered metal bond 3 (the individual bonding parts 31) is formed and portions where the sintered metal bond 3 (the individual bonding parts 31) is not formed. The portions where the sintered metal bond 3 (the individual bonding parts 31) is not formed are referred to as sintered metal unfilled portions 64. The dimension in the z direction of the sintered metal unfilled portions 64 is the same as that of the sintered metal bond 3 (individual bonding parts 31). In the present embodiment, each of the sintered metal unfilled portions is filled with a part of the resin package 5 (the interposed portion 57).

A method for manufacturing the semiconductor device B1 is described below. The method for manufacturing the semiconductor device B1 may include a parts preparation process, a die bonding process, a wire bonding process, a resin molding process and a finishing process. In the present embodiment, these processes of the manufacturing method are performed in the mentioned order.

In the parts preparation process, structural parts of the semiconductor device B1 are prepared. Specifically, a wafer that is to become the element body 11 is subjected to plating treatment, whereby the obverse surface electrode pad 121 and the reverse surface electrode pad 122 are formed. The wafer has a size that allows production of a plurality of element bodies 11 (the semiconductor elements 1). The plated wafer is diced to provide a semiconductor element 1. Further, lead frames 2 are formed by molding. In the parts preparation process, a plurality of lead frames 2 are formed integrally as connected by a connection frame.

Figure 26:
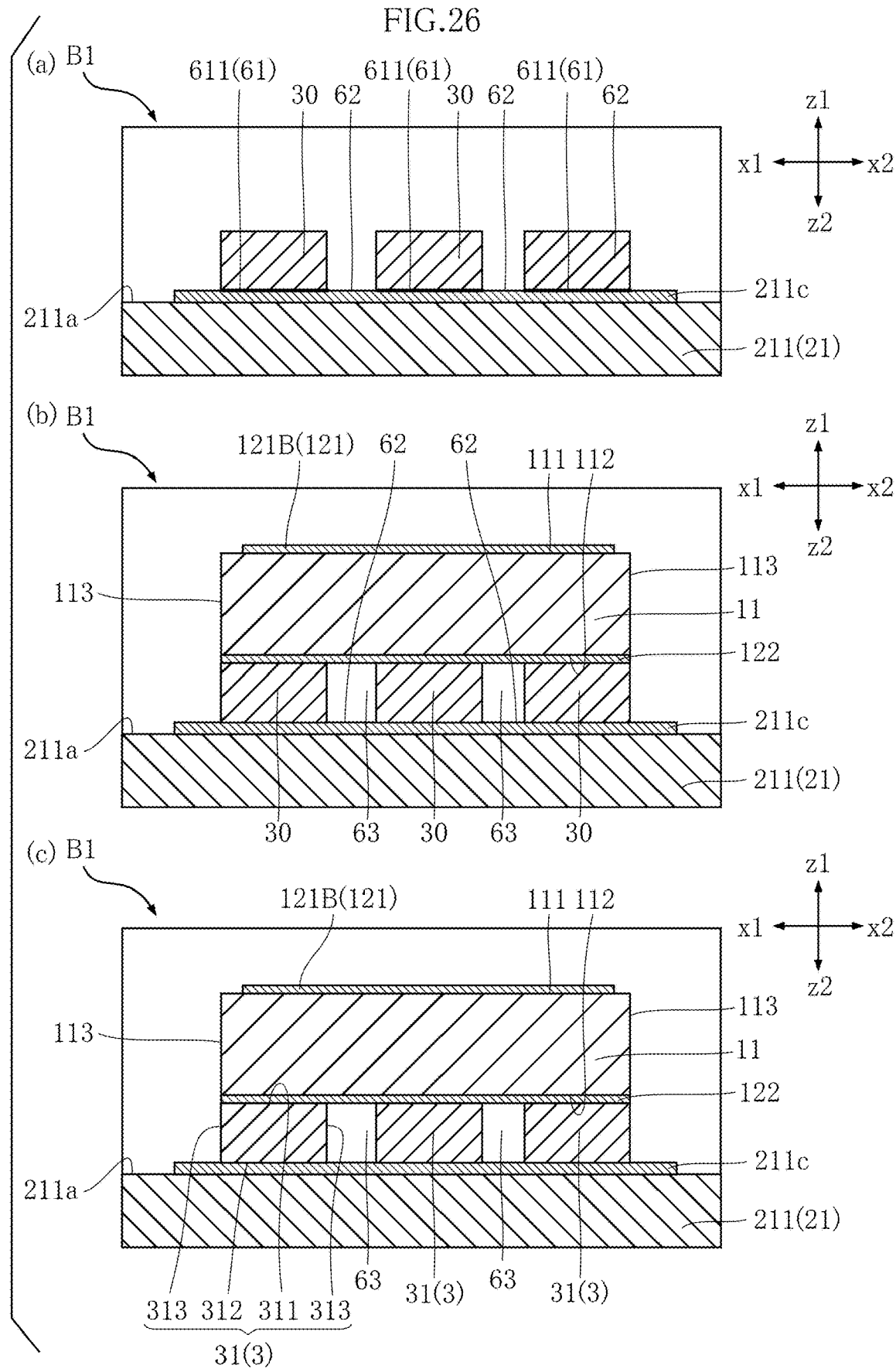
FIG. 26 shows the semiconductor device after each step of the die bonding process according to the first embodiment of the second aspect.

In the die bonding process, the semiconductor element 1 is electrically bonded to the first pad portion 211 via the sintered metal bond 3. The die bonding process includes a paste application step, a mounting step, and a sintering step. FIGS. 25 and 26 illustrate the die bonding process. FIG. 25 is an enlarged plan view showing the state before the paste application step. In FIG. 25, the semiconductor element 1, the first wire 41, and the second wire 42 are indicated by two-dot chain lines.

The application region 61, which will be described later, is indicated by thick solid lines. FIG. 26 are enlarged sectional views of the semiconductor device B1 in the state after respective steps of the die bonding process. Specifically, FIG. 26(*a*) shows the state after the paste application step. FIG. 26(*b*) shows the state after the mounting step. FIG. 26(*c*) shows the state after the sintering step. Note that FIG. 26 are enlarged sectional views corresponding to FIG. 23.

In the paste application step, a sintering metal paste 30, that is a base for the sintered metal bond 3, is applied. In the present embodiment, sintering silver paste is used as the sintering metal paste 30. The sintering silver paste is a paste containing silver particles of microsize or nanosize mixed in a solvent. In the present embodiment, the solvent of the sintering silver paste contains no (or little) epoxy resin. The sintering metal paste 30 is applied by screen printing using a mask, for example. Instead of screen printing, a dispenser may be used to apply the metal paste 30. The method for applying the sintering metal paste 30 is not limited to these.

In the paste application step, the sintering metal paste 30 is applied to predetermined portions of the first pad portion 211 (plating layer 211c). Specifically, an application area 61 and a non-application area 62 are set in advance on the first pad portion 211 (the plating layer 211c), as shown in FIG. 25. The application area 61 is an area to which the sintering metal paste 30 is to be applied. The non-application area 62 is an area to which the sintering metal paste 30 is not to be applied. In the present embodiment, as shown in FIG. 25, the application area 61 is made up of a plurality of individual sections 611 that are separate from each other as viewed in the z direction. Each of the individual sections 611 has a rectangular shape of 1 mm square. The shape of each individual section 611 as viewed in the z direction is not limited to a rectangular shape and may be a circular shape or a polygonal shape. Also, the dimension of each individual section 611 as viewed in the z direction is not limited to that described above. The individual sections 611 are arranged in a matrix and the distance between adjacent individual sections 611 is 0.5 mm. Note that the non-application area 62 is an area that is directly below the semiconductor element 1 and that excludes the application area 61. The sintering metal paste 30 is applied to the application area 61 (each of the individual sections 611). In this process, the sintering metal paste 30 is applied into a pillar shape having a bottom surface on the application area 61. In this way, the semiconductor device B1 in the state shown in FIG. 26(a) is obtained.

The semiconductor device B1 in the state shown in FIG. 26(a) includes, on the first pad portion 211, portions where the sintering metal paste 30 is applied and portions where the sintering metal paste 30 is not applied. Thus, steps in the z direction are formed.

In the mounting step, the semiconductor element 1 is mounted on the sintering metal paste 30 applied on the first pad portion 211. Specifically, the reverse surface electrode pad 122 (the element reverse surface 112 of the element body 11) of the semiconductor element 1 is oriented to face the first pad portion 211 (the plating layer 211c). Then, the semiconductor element 1 is placed so as to overlap with both of the application area 61 and the non-application area 62 as viewed in the z direction. Thus, the semiconductor element 1 is disposed on the sintering metal paste 30 applied to the application area 61, so that the semiconductor device B1 in the state shown in FIG. 26(b) is obtained.

In the semiconductor device B1 in the state shown in FIG. 26(b), an unfilled space 63 exists on the non-application area 62. The unfilled space 63 is the space that is sandwiched between the reverse surface electrode pad 122 of the semiconductor element 1 and the first pad portion 211 and that is not filled with the sintering metal paste 30. In the present embodiment, the unfilled space 63 communicates with the space (hereinafter referred to as an "external space") outside the edge of the semiconductor element 1 (the reverse surface electrode pad 122) as viewed in the z direction. Note that if the semiconductor element 1 is pushed in too strongly in the mounting step, the sintering metal paste 30 may be crushed. In such a case, the unfilled space 63 may not be formed in the non-application area 62. Thus, the push-in amount in placing the semiconductor element 1 is adjusted in such a manner that the unfilled space 63 is formed. In the present embodiment, the push-in amount is such that the semiconductor element 1 is just placed on the sintering metal paste 30 with almost no application of pressing force.

In the sintering step, the sintering metal paste 30 is formed into the sintered metal bond 3 by heat treatment. Specifically, with the semiconductor element 1 placed on the sintering metal paste 30, the sintering metal paste 30 is heat-treated under predetermined sintering conditions. Examples of such sintering conditions include presence or absence of pressurization, heating time, heating temperature, and environment (atmosphere). In the present embodiment, heat treatment at 200° C. in an unpressurized state is carried out for two hours in an atmosphere containing oxygen. The sintering conditions are not limited to those described above. By the above-described heat treatment, the solvent contained in the sintering metal paste 30 vaporizes while the silver particles combine with each other, whereby the porous sintered metal bond 3 as shown in FIG. 24 is formed. The vaporized component from the solvent of the sintering metal paste 30 is discharged to the adjacent unfilled space 63. Since the unfilled space 63 communicates with the external space as described above, the vaporized component is discharged to the external space through the unfilled space 63. That is, in the present embodiment, the unfilled space 63 functions as an air vent for discharging the vaporized component. In this way, the semiconductor device B1 in the state shown in FIG. 26(c) is obtained.

In the semiconductor device B1 in the state shown in FIG. 26(c), the unfilled space 63 has become the sintered metal unfilled portions 64, in which the sintered metal bond 3 is not formed. That is, the semiconductor device B1 has the sintered metal unfilled portions 64. The sintered metal unfilled portions 64 are interposed between the semiconductor element 1 (the reverse surface electrode pad 122) and the plating layer 211c. The dimension in the z direction of the sintered metal unfilled portions 64 is the same as that of the sintered metal bond 3. Thus, the sintered metal unfilled portions 64 extend in the z direction from the reverse surface electrode pad 122 to the plating layer 211c between the reverse surface electrode pad 122 and the plating layer 211c. As shown in FIG. 26(c), the sintered metal bond 3 has almost the same shape as the sintering metal paste 30 applied to the application area 61. That is, each of the individual bonding parts 31 has almost the same shape as that of the sintering metal paste 30 applied on each of the individual sections 611.

In the wire bonding process, the first wire 41 and the second wire 42 are bonded. For example, the wire bonding process is performed using a known wire bonder. The wire bonding process includes a first wire bonding step and a second wire bonding step.

In the first wire bonding step, the first wire 41 is bonded with a wire bonder that uses a capillary. Specifically, an end of a wire is allowed to project from the capillary of the wire bonder and melted. The end of the wire, which is formed into a ball shape, is pressed against the first obverse surface electrode pad 121A. Subsequently, the capillary is moved while drawing the wire from the capillary, and then, the wire is pressed against the second pad portion 221 of the second lead 22. Then, the capillary is lifted while pressing the wire with a clamp of the capillary, whereby the wire is cut. The first wire 41 is formed in this way, and the first obverse surface electrode pad 121A and the second pad portion 221 are electrically connected to each other. Note that the wire may first be bonded to the second pad portion 221 and then bonded to the first obverse surface electrode pad 121A.

In the second wire bonding step, the second wire 42 is bonded with a wire bonder that uses a wedge tool. Specifically, ultrasonic vibration is applied, with an end of the wedge of the wedge tool, which is in a state capable of wedge bonding, pressed against the second obverse surface electrode pad 121B. As a result, an end of the second wire 42 is welded to the second obverse surface electrode pad 121B. Subsequently, the wedge is moved while drawing the wire from the end of the wedge, and ultrasonic vibration is applied with the wire pressed against the third pad portion 231 of the third lead 23. As a result, the other end of the second wire 42 is welded to the third pad portion 231. Thereafter, the wedge is slightly moved, and a cut is formed in the second wire 42 with a cutter of the wedge tool. Then, the wire is cut by separating the wire from the third pad portion 231 along with the wedge. Thus, the second wire 42 is formed, and the second obverse surface electrode pad 121B and the third pad portion 231 are electrically connected to each other. Note that the wire may first be bonded to the third pad portion 231 and then bonded to the second obverse surface electrode pad 121B. When the semiconductor device B1 includes a plurality of second wires 42, the second wire bonding process may be performed a plurality of times.

In the wire bonding process, the order of the first wire bonding step and the second wire bonding step is not limited, and either step may be conducted first. A wedge tool may be used instead of the capillary in the first wire bonding step, and a capillary may be used instead of the wedge tool in the second wire bonding step. These may be selected appropriately depending on the material, wire diameter, arrangement or the like of the first wire 41 and the second wire 42.

In the resin molding process, the resin package 5 is formed to package the semiconductor device B1. The resin molding process may be performed by a known transfer molding using a mold. Specifically, the lead frame 2 to which the semiconductor element 1, the first wire 41, and the second wire 42 are bonded is set in a molding machine, and fluidized epoxy resin is loaded into the cavity in the mold and molded. Then, the epoxy resin is hardened. Thereafter, the lead frame 2 after the molding is taken out, and excess resin or burrs are removed to form the shape of the resin package 5 described above. As described above, since the unfilled space 63 communicates with the external space, when epoxy resin is loaded into the cavity of the mold in the resin molding process, it flows also into the unfilled space 63. The epoxy resin flowed into the unfilled space 63 is hardened to become the interposed portions 57. That is, the sintered metal unfilled portions 64 are filled with a part (interposed portions 57) of the resin package 5S. In the example described above, the interposed portions 57 are formed by the flowing of epoxy resin into the unfilled space 63 during the molding. However, epoxy resin may not properly flow into the unfilled space 63 depending on the conditions such as the shape or size of the unfilled space 63, the temperature in the molding process (resin temperature or mold temperature), injection pressure, or injection amount. In such a case, epoxy resin may be loaded in the unfilled space by under filling to form the interposed portions 57. Alternatively, the unfilled space 63 may not be filled with epoxy resin. In that case, the sintered metal unfilled portions 64 are left unfilled.

In the finishing process, the semiconductor device B1 is formed into the configuration shown in FIG. 16 and finished as a shippable product. For example, the finishing process includes a cutting step for cutting away unnecessary portions (e.g. the connecting frame described above) of the lead frame 2 that are exposed to the outside of the resin package 5, an exterior treatment step for improving the strength against bending of the lead frame 2 exposed to the outside of the resin package 5, improving adhesion at the time of mounting on a printed circuit board, rust prevention or the like, a lead working step for bending the lead frame 2 exposed to the outside of the resin package 5 into a predetermined shape, a stamping step for stamping a company name, a product name, a rod number or the like on the package, and an inspection/sorting step for discriminating between good products and defective products. These steps may be performed appropriately depending on the specification of the final specification of the semiconductor device B1. By completing the finishing process, the semiconductor device B1 shown in FIGS. 16-20 is obtained.

The advantages of the semiconductor device B1 and its manufacturing method are described below.

According to the first embodiment of the second aspect, in the paste application step, the application area 61 to which the sintering metal paste 30 is applied and the non-application area 62 to which the sintering metal paste 30 is not applied are provided on the first pad portion 211 (the plating layer 211c). That is, the non-application area 62 is intentionally provided. By the provision of the non-application area 62, in the state after the mounting step, a space (the unfilled space 63) is present on the non-application area 62. With such an arrangement, the vaporized component that is generated in the process of the sintering metal paste 30 becoming the sintered metal bond 3 is discharged to the unfilled space 63 and then to the external space. This prevents the vaporized component from remaining in the sintered metal bond 3 and appearing as voids. That is, formation of voids in the sintered metal bond 3 is eliminated or reduced. This eliminates or reduces bonding strength variations due to voids and assures that the semiconductor element 1 is bonded with uniform bonding strength. Thus, the semiconductor device B1 has improved reliability even with the use of a sintered metal as a die bonding material.

According to the first embodiment of the second aspect, the plurality of individual bonding parts 31 are rectangular and arranged in a tetragonal lattice. Thus, the sintered metal bond 3 is symmetric with respect to the center of the semiconductor element 1 as viewed in the z direction. Specifically, the sintered metal bond 3 is symmetric with respect to a line passing through the center of the semiconductor element 1 and extending in parallel to the x direction and also symmetric with respect to a line passing through the center of the semiconductor element 1 and extending in parallel to the y direction. The sintered metal bond 3 is also symmetric with respect to the center of the semiconductor element 1. Thus, the semiconductor element 1 is mounted on the plurality of individual bonding parts 31 (sintered metal bond 3) that are arranged uniformly. Thus, in the semiconductor device B1, the semiconductor element 1 is bonded with uniform bonding strength.

According to the first embodiment of the second aspect, in the wire bonding process, the wires 4 are bonded to the portions of the obverse surface electrode pad 121 that overlap with the application area 61 as viewed in the z direction. Specifically, the first wire 41 is bonded to a part of the first obverse surface electrode pad 121A that overlaps with the application area 61 as viewed in the z direction, whereas the second wire 42 is bonded to a part of the second obverse surface electrode pad 121B that overlaps with the application area 61 as viewed in the z direction. That is, the wires 4 are bonded to the portions of the obverse surface electrode pad 121 directly under which the sintered metal bond 3 is arranged. If the wires 4 are bonded to the portions of the obverse surface electrode pad 121 under which the sintered metal bond 3 is not arranged, transmission efficiency of the pressing force or ultrasonic vibration in bonding the wires reduces. In such a case, a bonding failure of the wires 4 may occur. In particular, wedge bonding or stitch bonding requires a greater pressing force or ultrasonic vibration as compared with ball bonding. Bonding the wires 4 to the portions of the obverse surface electrode pad 121 directly under which the sintered metal bond 3 is arranged prevents reduction of the above-described transmission efficiency. That is, the semiconductor device B1 eliminates or reduces a bonding failure of the wires 4. When the positions at which the wires 4 are to be bonded in the obverse surface electrode pad 121 of the semiconductor element 1 are known in advance, the application area 61 is set directly under such wire bonding positions in the paste application step to reduce or eliminate a bonding failure. In other words, the portions directly under the wire bonding positions are not set as the non-application area 62 in the paste application step.

According to the first embodiment of the second aspect, each of the individual sections 611 of the application area 61 has a rectangular shape of 1 mm square. Studies by the inventor of the present application has revealed that voids are likely to be formed in each individual section 611 at a point that is distant by more than 1.5 mm from an edge of the individual section 611 that is closest to the point as viewed in the z direction. Note that the above-described edge refers to the boundary between the application area 61 and the non-application area 62. In other words, it is found that, in each individual section 611, formation of voids is unlikely to occur at any point that is distant by not more than 1.5 mm from an edge of the individual section 611 that is closest to the point as viewed in the z direction. In the present embodiment, since each of the individual sections 611 has a rectangular shape of 1 mm square, every point within each individual section 611 cannot be distant from an edge closest to this point by more than 0.5 mm as viewed in the z direction. Thus, the semiconductor device B1 effectively eliminates or reduces formation of voids. Because of the above reason, when the dimension of the semiconductor element 1 as viewed in the z direction is 3 mm square or larger, the possibility of void formation may increase if the sintering metal paste 30 is applied to the entire area under the semiconductor element 1. Thus, the provision of the non-application area 62 effectively eliminates or reduces formation of voids when the dimension of the semiconductor element 1 as viewed in the z direction is 3 mm square or larger.

Figure 27:
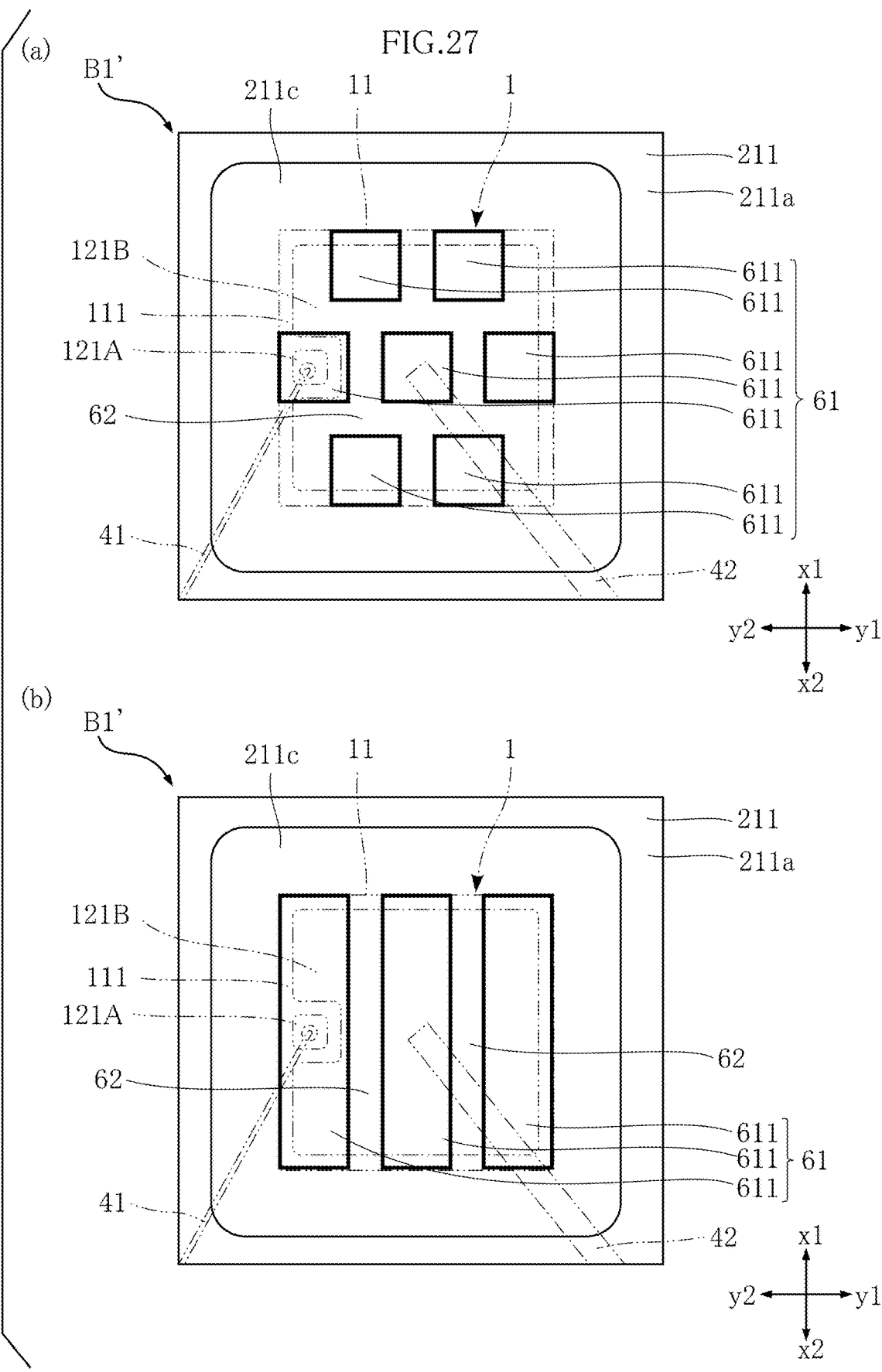
FIG. 27 shows a part before the paste application step in variations (a)-(b) of the first embodiment of the second aspect.

Variations of the first embodiment of the second aspect are described below. FIG. 27 are enlarged plan views each showing the state before the paste application step in the method for manufacturing a semiconductor device B1' as a variation of the semiconductor device B1. In FIG. 27, the semiconductor element 1, the first wire 41, and the second wire 42 are indicated by two-dot chain lines. The application region 61 is indicated by thick solid lines. Referring to this figure, description is given below of the application area 61 and the non-application area 62 provided in the paste application step in each variation of the first embodiment of the second aspect.

In the variation shown in FIG. 27(*a*), similarly to the above-described first embodiment of the second aspect, the application area 61 is made up of a plurality of individual sections 611. The individual sections 611 of the application area 61 are arranged in a regular triangular lattice as viewed in the z direction. Each of the individual sections 611 is 1 mm square, for example. The individual sections 611 may be arranged in other lattices such as a rhombus lattice (isosceles triangular lattice), a rectangular lattice, or a parallelotope lattice.

In the variation shown in FIG. 27(*b*), similarly to the first embodiment of the second aspect, the application area 61 is made up of a plurality of individual sections 611. The individual sections 611 of the application area 61 are arranged to form stripes as viewed in the z direction. For example, each of the individual sections 611 is 4 mm in dimension in the x direction and 1 mm in dimension in the y direction. That is, each of the individual sections 611 is in the form of a rectangle elongated in the x direction. The number and size of the individual sections 611 are not limited to these. For example, each of the individual sections 611 may be in the form of a rectangle elongated in the y direction, not in the x direction.

In each variation of the first embodiment of the second aspect, each step of the die bonding process is performed while setting the application area 61 and the non-application area 62 as shown in FIG. 27. Thus, the sintering metal paste 30 applied to the application area 61 becomes the sintered metal bond 3. The sintered metal bond 3 formed in this process has almost the same shape as the sintering metal paste 30. The vaporized component that is generated in the process of the sintering metal paste 30 becoming the sintered metal bond 3 is discharged to the unfilled space 63 on the non-application area 62. Thereafter, the wire bonding process, the resin molding process, and the finishing process are performed similarly to the first embodiment of the second aspect, whereby the semiconductor device B1' is obtained.

In each variation of the first embodiment of the second aspect again, the unfilled space 63 formed after the mounting step communicates with the external space, similarly to the first embodiment of the second aspect. Thus, in the resin molding process, the epoxy resin flows into the unfilled space 63 to form the interposed portions 57 (a part of the resin package 5). That is, in these variations again, the sintered metal unfilled portions 64 are filled with a part of the resin package 5 (interposed portions 57).

According to each variation of the first embodiment of the second aspect, the non-application area 62 is intentionally provided in the paste application step, similarly to the first embodiment of the second aspect. Thus, a space (unfilled space 63) is formed on the non-application area 62 after the mounting step. Thus, in the sintering step, the vaporized component that is generated in the process of the sintering metal paste 30 becoming the sintered metal bond 3 is discharged to the unfilled space 63. This prevents the vaporized component from remaining in the sintered metal bond 3 and appearing as voids. That is, formation of voids is eliminated or reduced. Thus, similarly to the above-described first embodiment of the second aspect, the semiconductor device B1' has improved reliability even with the use of a sintered metal as a die bonding material.

The variations of the first embodiment of the second aspect also have the other advantages of the above-described first embodiment of the second aspect. Specifically, since the individual bonding parts 31 are arranged symmetrically with respect to the center of the semiconductor element 1 as viewed in the z direction, the semiconductor element 1 is bonded with uniform bonding strength. Moreover, since the wires 4 are bonded to the portions of the obverse surface electrode pad 121 that overlap with the application area 61 as viewed in the z direction, a bonding failure is prevented. Moreover, since every point within each individual section 611 cannot be distant from the closest edge by more than 1.5 mm as viewed in the z direction, formation of voids is effectively eliminated or reduced.

A second embodiment of the second aspect is described below. In the description given below, the elements that are identical or similar to those of the first embodiment of the second aspect are designated by the same reference signs as those used for the first embodiment, and the description thereof is omitted.

Figure 28:
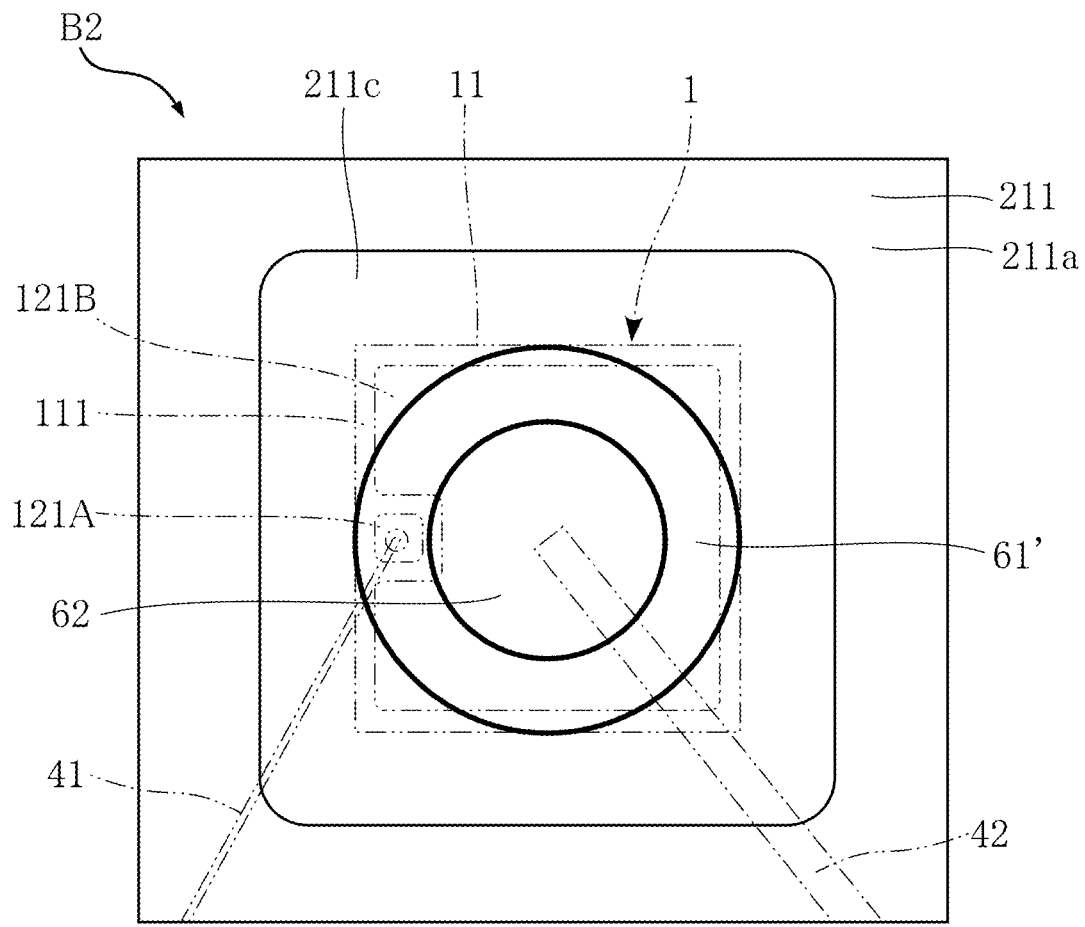
FIG. 28 is an enlarged plan view showing a part before the paste application step according to a second embodiment of the second aspect.

FIG. 28 is an enlarged plan view showing the state before the paste application step in the method for manufacturing a semiconductor device B2 according to the second embodiment of the second aspect. In FIG. 28, the semiconductor element 1, the first wire 41, and the second wire 42 are indicated by two-dot chain lines. The application region 61' is indicated by thick solid lines. Referring to this figure, description is given below of the application area 61' and the non-application area 62 provided in the paste application step according to the second embodiment of the second aspect.

As shown in FIG. 28, the application area 61' according to the second embodiment of the second aspect is annular as viewed in the z direction. For example, the difference between the inner diameter and the outer diameter of the application area 61' is 1 mm. Note that the size of the application area 61' is not limited to this. The outer circumference of the application area 61' corresponds to the inscribed circle of the semiconductor element 1. In the second embodiment of the second aspect that includes such an application area 61', the area inside the inner circumference of the application area 61' as viewed in the z direction is the non-application area 62. Unlike the first embodiment of the second aspect in which the application area 61 is made up of a plurality of individual sections 611, the application area 61' of the second embodiment of the second aspect is a single continuous area.

In the second embodiment of the second aspect, each step of the die bonding process is performed while setting the application area 61' and the non-application area 62 as described above. Thus, the sintering metal paste 30 applied to the application area 61' becomes the sintered metal bond 3. The sintered metal bond 3 formed in this process has almost the same shape as the sintering metal paste 30. The vaporized component that is generated in the process of the sintering metal paste 30 becoming the sintered metal bond 3 is discharged to the unfilled space 63 on the non-application area 62. Thereafter, the wire bonding process, the resin molding process and the finishing process are performed similarly to the first embodiment of the second aspect, whereby the semiconductor device B2 is obtained.

Figure 29:
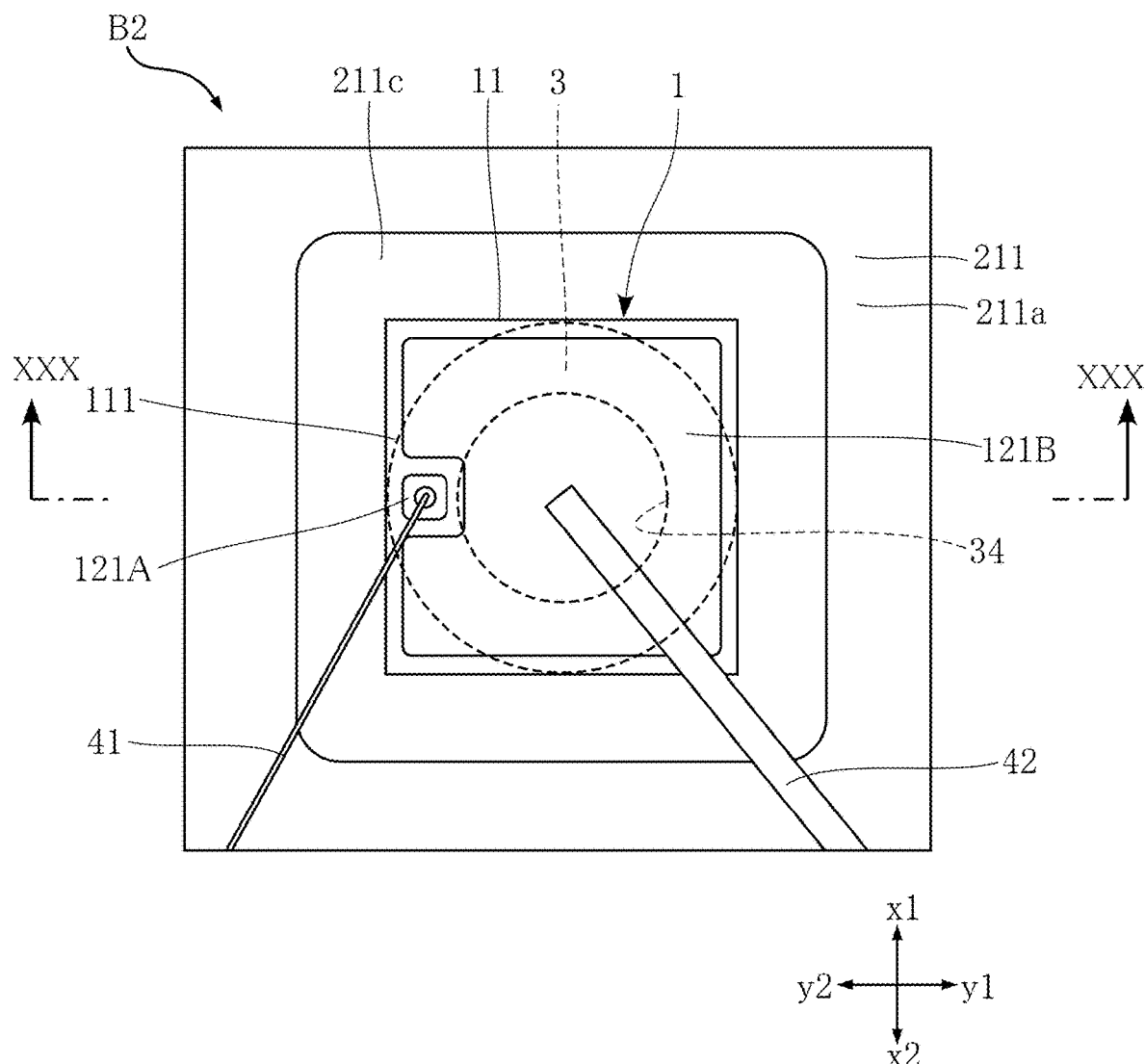
FIG. 29 is an enlarged plan view showing a part of a semiconductor device according to the second embodiment of the second aspect.
Figure 30:
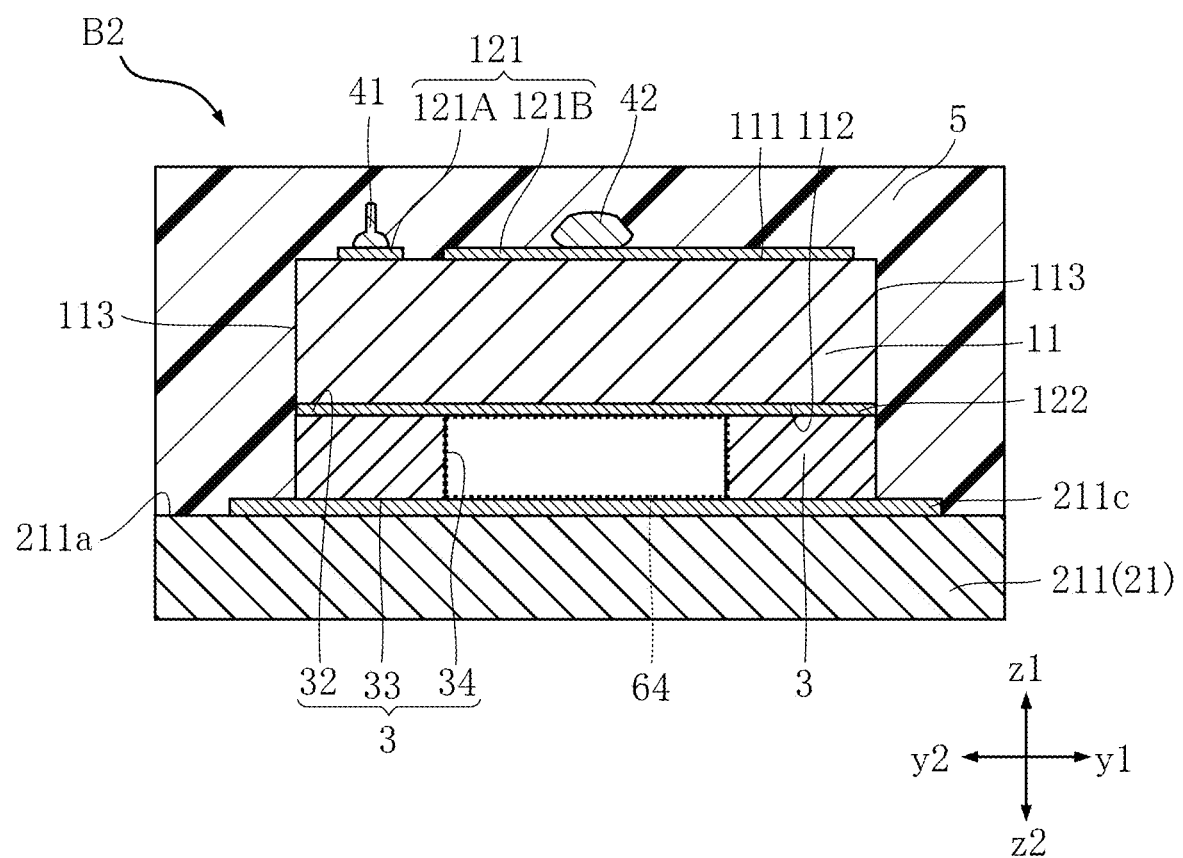
FIG. 30 is a sectional view taken along line XXX-XXX in FIG. 29.

FIGS. 29 and 30 show the semiconductor device B2 according to the second embodiment of the second aspect. FIG. 29 is an enlarged plan view in which the illustration of the resin package 5 is omitted. In FIG. 29, the sintered metal bond 3 is indicated by broken lines. FIG. 30 is a sectional view taken along line XXX-XXX in FIG. 29.

As shown in FIG. 29, the sintered metal bond 3 of the semiconductor device B2 is annular as viewed in the z direction. This corresponds to the application area 61' in the paste application step. The sintered metal bond 3 has a first contact surface 32, a second contact surface 33, and a through-hole 34.

The first contact surface 32 is in contact with the semiconductor element 1 (the reverse surface electrode pad 122). The second contact surface 33 is in contact with the plating layer 211c. The through-hole 34 extends from the first contact surface 32 to the second contact surface 33 in the z direction. The through-hole 34 is circular as viewed in the z direction. The through-hole 34 corresponds to the sintered metal unfilled portions 64.

In the second embodiment of the second aspect, the unfilled space 63 formed in the mounting step is closed without communicating with the external space. Thus, in the resin molding process, epoxy resin does not flow into the unfilled space 63. That is, in the second embodiment of the second aspect, the sintered metal unfilled portions 64 are left unfilled, as shown in FIG. 30.

According to the second embodiment of the second aspect, the non-application area 62 is intentionally provided in the paste application step, similarly to the first embodiment of the second aspect. Thus, a space (unfilled space 63) is formed on the non-application area 62 after the mounting step. Thus, in the sintering step, the vaporized component that is generated in the process of the sintering metal paste 30 becoming the sintered metal bond 3 is discharged to the unfilled space 63. This prevents the vaporized component from remaining in the sintered metal bond 3 and appearing as voids. That is, formation of voids is eliminated or reduced. Thus, similarly to the above-described first embodiment of the second aspect, the semiconductor device B2 has improved reliability even with the use of a sintered metal as a die bonding material.

Figure 31:
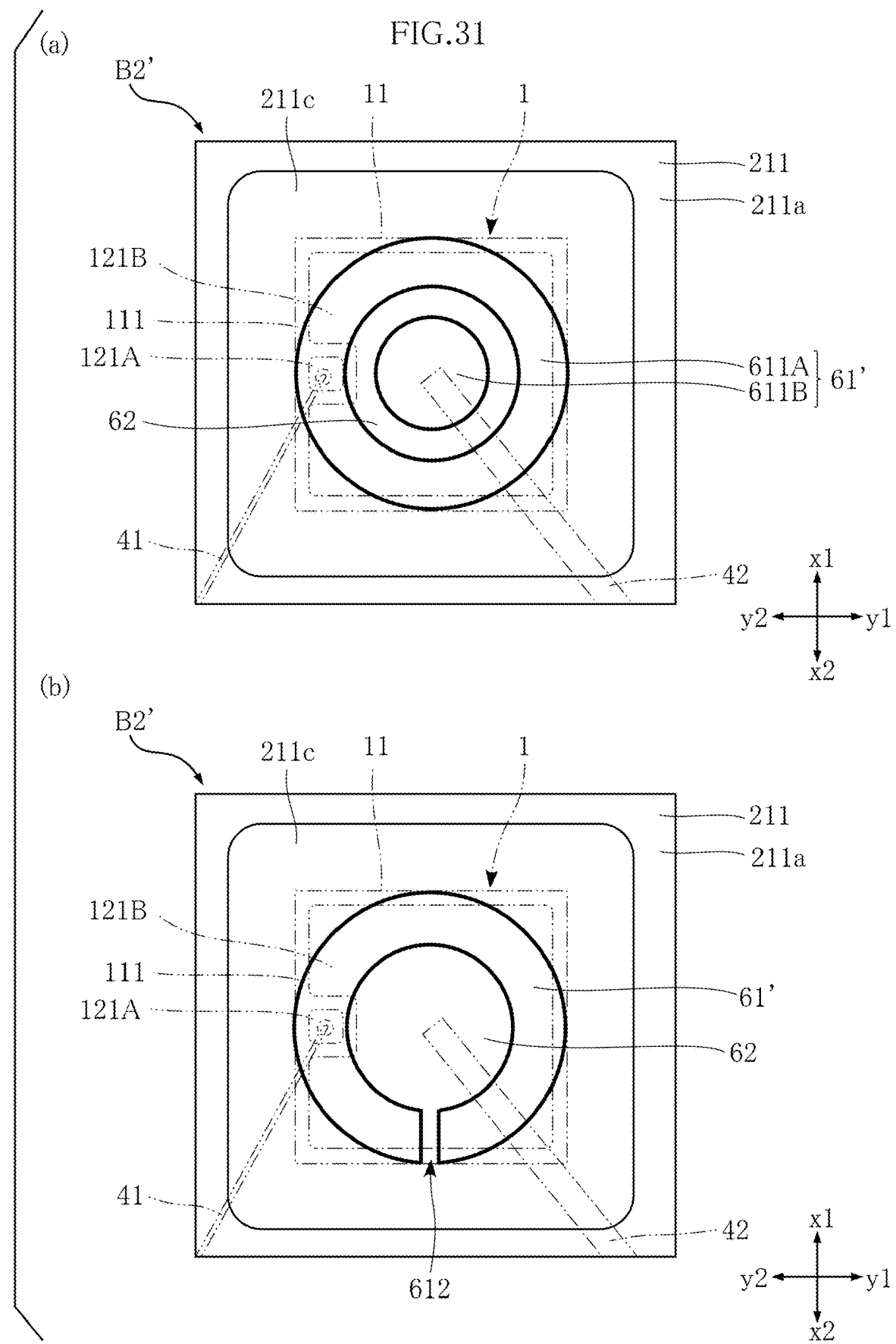
FIG. 31 shows a part before the paste application step in variations (a)-(b) of the second embodiment of the second aspect.
Figure 32:
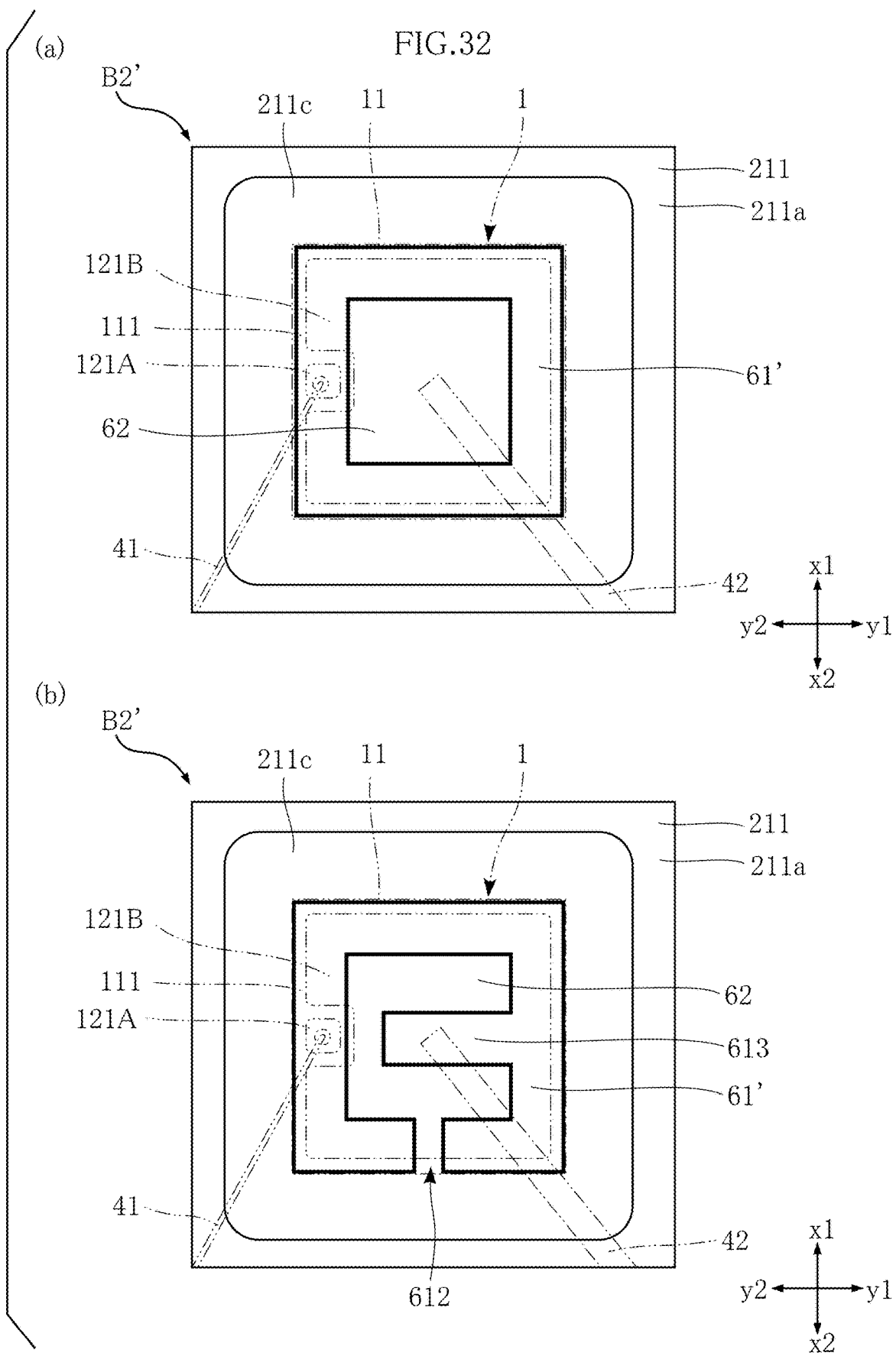
FIG. 32 shows a part before the paste application step in variations (a)-(b) of the second embodiment of the second aspect.

Variations of the semiconductor device B2 according to the second embodiment of the second aspect are described below. FIGS. 31 and 32 are enlarged plan views each showing the state before the paste application step in the method for manufacturing a semiconductor device B2' as a variation of the semiconductor device B2. In FIGS. 31 and 32, the semiconductor element 1, the first wire 41, and the second wire 42 are indicated by two-dot chain lines. The application region 61' is indicated by thick solid lines. Referring to these figures, description is given below of the application area 61' provided in the paste application step in each variation of the second embodiment of the second aspect.

In the variation shown in FIG. 31(*a*), the application area 61' is made up of two individual sections 611A and 611B of different shapes. The individual section 611A is identical to the application area 61' according to the second embodiment of the second aspect. The individual section 611B is provided inside the individual section 611A. The individual section 611B is circular as viewed in the z direction. The individual sections 611A and the individual sections 611B are concentric as viewed in the z direction.

In the variation shown in FIG. 31(*b*), the application area 61' has a shape obtained by forming a notch 612 at a part of the circumference of the application area 61' according to the second embodiment of the second aspect. The notch 612 extends from the outer circumference to the inner circumference of the application area 61' as viewed in the z direction.

In the variation shown in FIG. 32(*a*), the application area 61' is in the form of a rectangular frame as viewed in the z direction. The width of the application area 61' is 1 mm in the present variation but is not limited to this.

In the variation shown in FIG. 32(*b*), the application area 61' has a notch 612 added to the application area 61' shown in FIG. 32(*a*). The notch 612 is provided on the x2 side and at the middle part in the y direction. The notch 612 extends from the outer edge to the inner edge of the application area 61' as viewed in the z direction. The application area 61' of the present variation is further provided with an extension 613 which extends in the y2 direction from the middle part in the x direction on the y1 side. The positions of the notch 612 and the extension 613 are not limited to these.

In each variation of the second embodiment of the second aspect, each step of the die bonding process is performed while setting the application area 61' and the non-application area 62 as shown in FIGS. 31 and 32. Thus, the sintering metal paste 30 applied to the application area 61' becomes the sintered metal bond 3. The sintered metal bond 3 formed in this process has almost the same shape as the sintering metal paste 30. The vaporized component that is generated in the process of the sintering metal paste 30 becoming the sintered metal bond 3 is discharged to the unfilled space 63 on the non-application area 62. Thereafter, the wire bonding process, the resin molding process and the finishing process are performed similarly to the first embodiment of the second aspect, whereby the semiconductor device B2' is obtained.

In each variation shown in FIGS. 31(*a*) and 32(*a*), similarly to the second embodiment of the second aspect, the unfilled space 63 formed after the mounting step does not communicate with the external space. Thus, the epoxy resin does not flow into the unfilled space 63 in the resin molding process. That is, in these variations, the sintered metal unfilled portions 64 are left unfilled. On the other hand, in each variation shown in FIGS. 31(*b*) and 32(*b*), the unfilled space 63 formed after the mounting step communicates with the external space via the notch 612. Thus, in the resin molding process, epoxy resin flows into the unfilled space 63 to form the interposed portions 57 (a part of the resin package 5). That is, in these variations, the sintered metal unfilled portions 64 are filled with a part of the resin package 5 (interposed portions 57).

According to each variation of the second embodiment of the second aspect, the non-application area 62 is intentionally provided in the paste application step, similarly to the first embodiment of the second aspect. Thus, a space (unfilled space 63) is formed on the non-application area 62 after the mounting step. Thus, in the sintering step, the vaporized component that is generated in the process of the sintering metal paste 30 becoming the sintered metal bond 3 is discharged to the unfilled space 63. This prevents the vaporized component from remaining in the sintered metal bond 3 and appearing as voids. That is, formation of voids is eliminated or reduced. Thus, similarly to the above-described first embodiment of the second aspect, the semiconductor device B2' has improved reliability even with the use of a sintered metal as a die bonding material.

In the wire bonding process in each variation shown in FIGS. 31(*a*) and 32(*b*), the wires 4 are bonded to the portions of the obverse surface electrode pad 121 that overlap with the application area 61 as viewed in the z direction. This prevents reduction of the transmission efficiency of the pressing force or ultrasonic vibration. That is, a bonding failure of the wires 4 is eliminated or reduced.

A third embodiment of the second aspect of the present disclosure is described below. In the description given below, the elements that are identical or similar to those of the second embodiments of the first and the second aspects are designated by the same reference signs as the second embodiments, and the description thereof is omitted.

Figure 33:
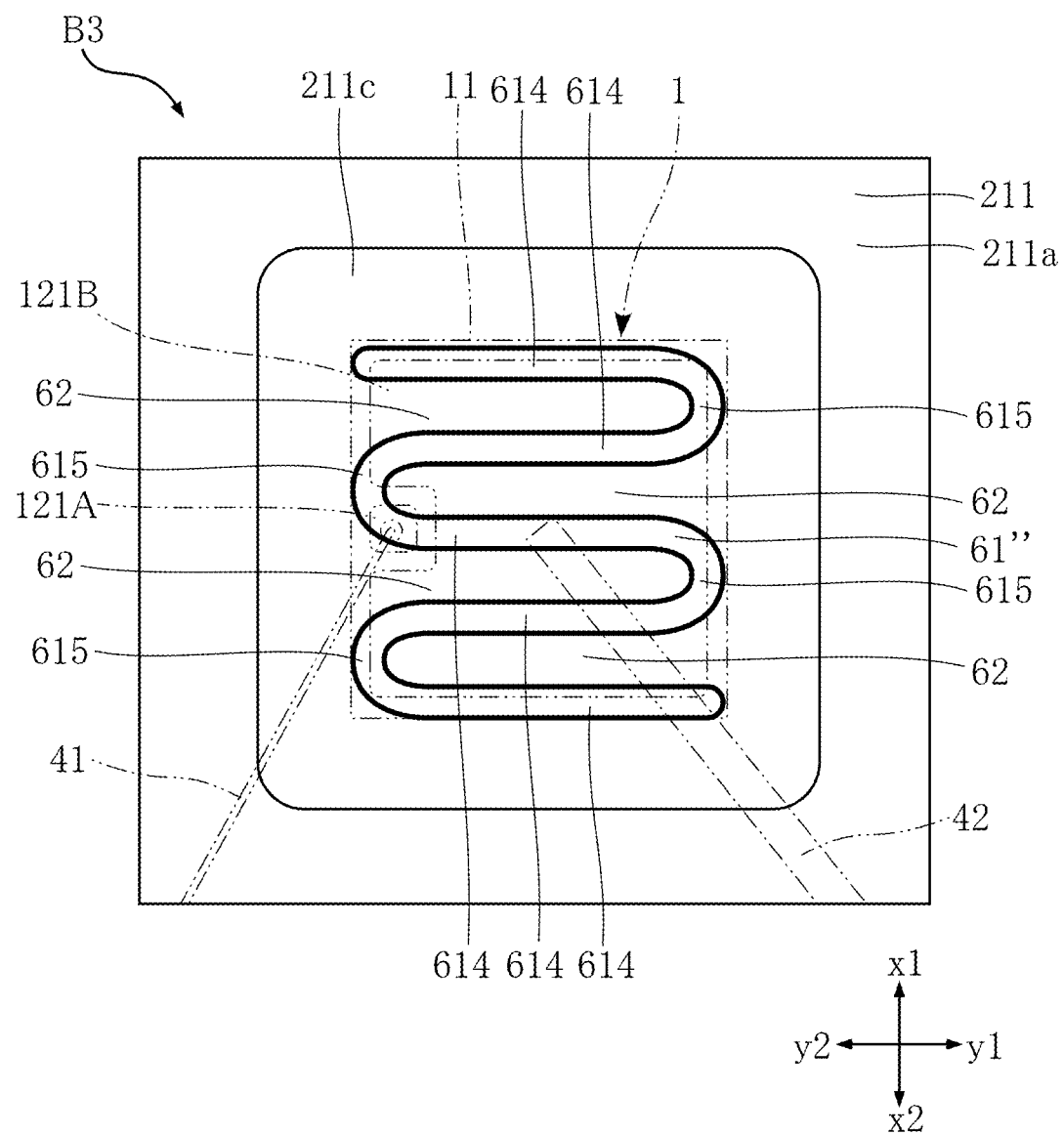
FIG. 33 is an enlarged plan view showing a part before the paste application step according to a third embodiment of the second aspect.

FIG. 33 is an enlarged plan view showing the state before the paste application step in the method for manufacturing a semiconductor device B3 according to the third embodiment of the second aspect. In FIG. 33, the semiconductor element 1, the first wire 41 and the second wire 42 are indicated by two-dot chain lines. The application region 61" is indicated by thick solid lines. Referring to this figure, description is given below of the application area 61" and the non-application area 62 provided in the paste application step according to the third embodiment of the second aspect.

As shown in FIG. 33, the application area 61" according to the third embodiment of the second aspect is a single area in the form of a continuous strip. For example, the application area 61" is 0.5 mm in width but is not limited to this. The application area 61" is in the form of a wave made up of a plurality of linear portions 614 and a plurality of bent portions 615 as viewed in the z direction. In the present embodiment, the application area 61" includes five linear portions 614 and four bent portions 615.

Each of the linear portions 614 extends in the y direction. The linear portions 614 are spaced apart from each other in the x direction. Each bent portion 615 is connected to corresponding ends of two linear portions 614 in the y direction that are adjacent to each other in the x direction. The linear portions 614 and the bent portions 615 are integral with each other.

In the third embodiment of the second aspect, each step of the die bonding process is performed while setting the application area 61" and the non-application area 62 as described above. In the third embodiment of the second aspect, the sintering metal paste 30 is applied with a dispenser, for example. The sintering metal paste 30 may be applied not by using a dispenser but by screen printing using a mask. Thus, the sintering metal paste 30 applied to the application area 61" becomes the sintered metal bond 3. The sintered metal bond 3 formed in this process has almost the same shape as the sintering metal paste 30. The vaporized component that is generated in the process of the sintering metal paste 30 becoming the sintered metal bond 3 is discharged to the unfilled space 63 on the non-application area 62. Thereafter, the wire bonding process, the resin molding process and the finishing process are performed similarly to the first embodiment of the second aspect, whereby the semiconductor device B3 is obtained.

Figure 34:
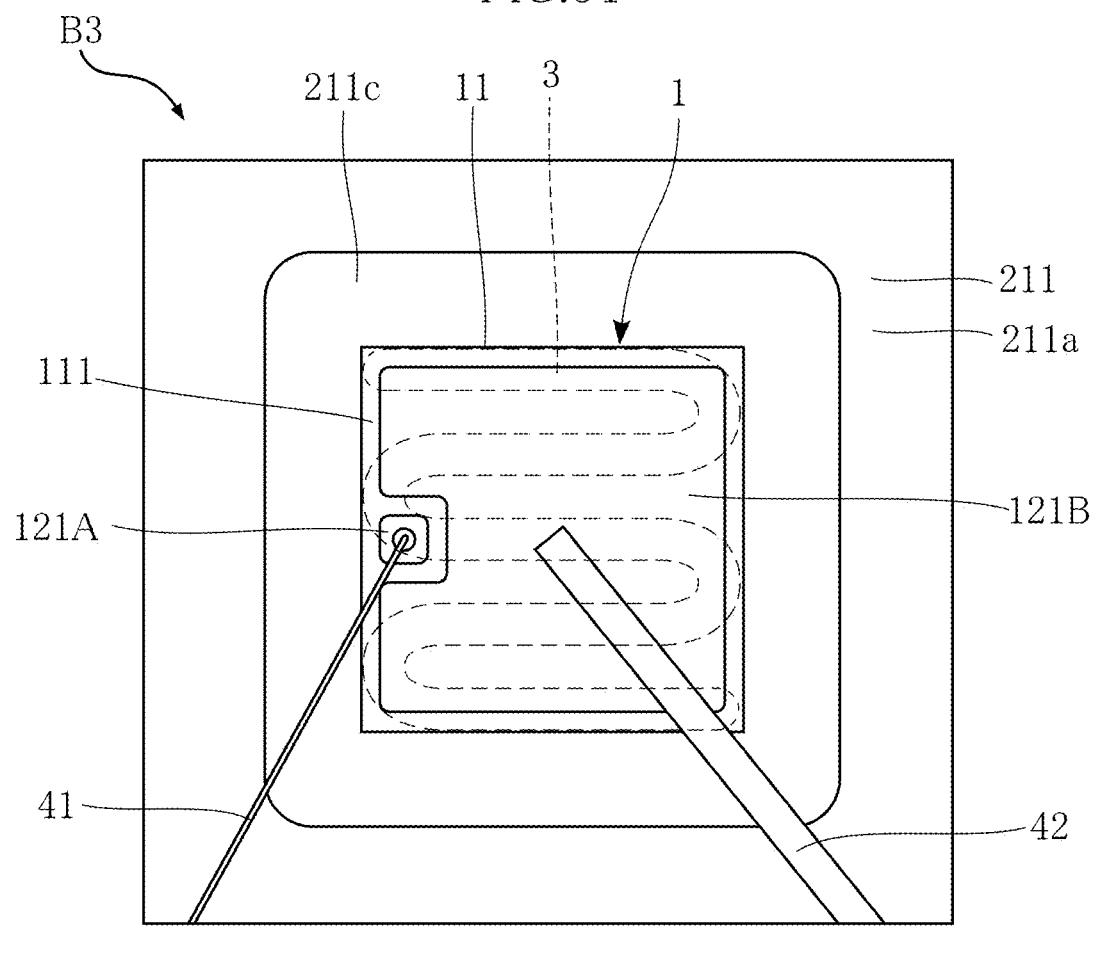
FIG. 34 is an enlarged plan view showing a part of a semiconductor device according to the third embodiment of the second aspect.

FIG. 34 shows a semiconductor device B3 according to a third embodiment of the second aspect. FIG. 34 is an enlarged plan view in which the illustration of the resin package 5 is omitted. In FIG. 34, the sintered metal bond 3 is indicated by broken lines.

As shown in FIG. 34, the sintered metal bond 3 of the semiconductor device B3 is in the form of a continuous strip as viewed in the z direction. The sintered metal bond is in the form of a wave as viewed in the z direction. This is the same as the application area 61" in the paste application step.

In the third embodiment of the second aspect, the unfilled space 63 formed in the mounting step communicates with the external space. Thus, in the resin molding process, epoxy resin flows into the unfilled space 63 to form the interposed portions 57 (a part of the resin package 5). That is, in the third embodiment of the second aspect, the sintered metal unfilled portions 64 are filled with a part of the resin package 5 (interposed portions 57).

According to the third embodiment of the second aspect, the non-application area 62 is intentionally provided in the paste application step, similarly to the first embodiment of the second aspect. Thus, a space (unfilled space 63) is formed on the non-application area 62 after the mounting step. Thus, in the sintering step, the vaporized component that is generated in the process of the sintering metal paste 30 becoming the sintered metal bond 3 is discharged to the unfilled space 63. This prevents the vaporized component from remaining in the sintered metal bond 3 and appearing as voids. That is, formation of voids is eliminated or reduced. Thus, similarly to the above-described first embodiment of the second aspect, the semiconductor device B3 has improved reliability even with the use of a sintered metal as a die bonding material.

Figure 35:
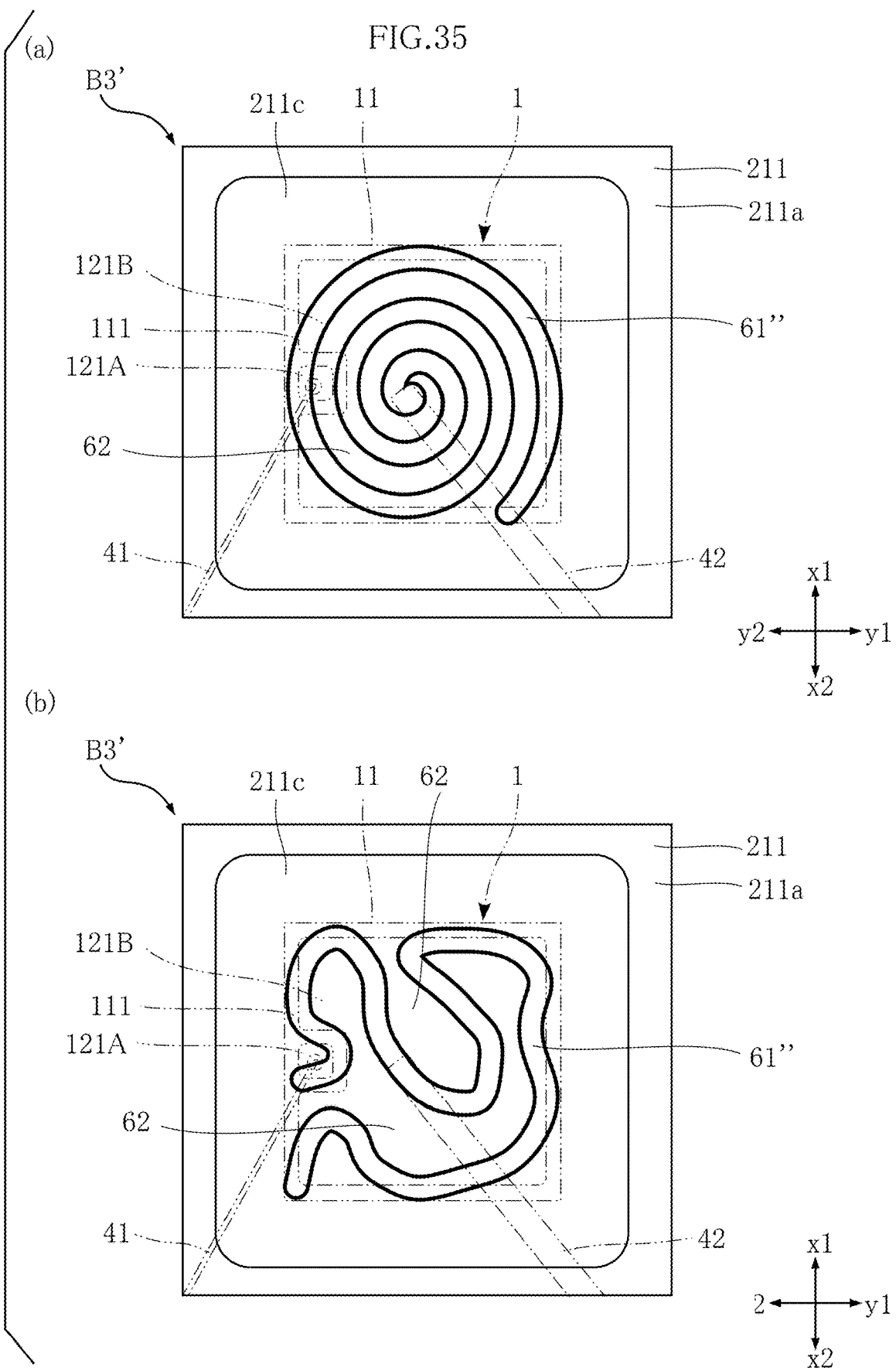
FIG. 35 shows a part before the paste application step in variations (a)-(b) of the third embodiment of the second aspect.

Variations of the third embodiment according to the second aspect are described below. FIG. 35 are enlarged plan views each showing the state before the paste application step in the method for manufacturing a semiconductor device B3' as a variation of the semiconductor device B3. In FIG. 35, the semiconductor element 1, the first wire 41, and the second wire 42 are indicated by two-dot chain lines. The application region 61" is indicated by thick solid lines. Referring to these figures, description is given below of the application area 61" and the non-application area 62 provided in the paste application step in each variation of the third embodiment of the second aspect.

In the variation shown in FIG. 35(a), the application area 61" is a single area in the form of a continuous strip, similarly to the application area 61" according to the third embodiment of the second aspect. In the present variation, the application area 61" has a spiral shape as viewed in the z direction.

In the variation shown in FIG. 35(b), the application area 61" is a single area in the form of a continuous strip, similarly to the application area 61" according to the third embodiment of the second aspect. In the present variation, the application area 61" is in the form of a freely curved strip as viewed in the z direction. Note that, although the application area 61" illustrated in FIG. 35(b) does not include a point of intersection, the application area 61" may include a point of intersection.

In each variation of the third embodiment of the second aspect, each step of the die bonding process is performed while setting the application area 61' and the non-application area 62 as shown in FIG. 35. In this variation again, the sintering metal paste 30 may be applied with a dispenser, similarly to the third embodiment of the second aspect. The sintering metal paste 30 may be applied not by using a dispenser but by screen printing using a mask. Thus, the sintering metal paste 30 applied to the application area 61" becomes the sintered metal bond 3. The sintered metal bond 3 formed in this process has almost the same shape as the sintering metal paste 30. The vaporized component that is generated in the process of the sintering metal paste 30 becoming the sintered metal bond 3 is discharged to the unfilled space 63 on the non-application area 62. Thereafter, the wire bonding process, the resin molding process and the finishing process are performed similarly to the first embodiment of the second aspect, whereby the semiconductor device B3' is obtained.

In each variation of the third embodiment of the second aspect again, the unfilled space 63 formed after the mounting step communicates with the external space, similarly to the third embodiment of the second aspect. Thus, in the resin molding process, epoxy resin flows into the unfilled space 63 to form the interposed portions 57 (a part of the resin package 5). That is, in this variation again, the sintered metal unfilled portions 64 are filled with a part of the resin package 5 (interposed portions 57).

According to each variation of the third embodiment of the second aspect, the non-application area 62 is intentionally provided in the paste application step, similarly to the first embodiment of the second aspect. Thus, a space (unfilled space 63) is formed on the non-application area 62 after the mounting step. Thus, in the sintering step, the vaporized component that is generated in the process of the sintering metal paste 30 becoming the sintered metal bond 3, is discharged to the unfilled space 63. This prevents the vaporized component from remaining in the sintered metal bond 3 and appearing as voids. That is, formation of voids is eliminated or reduced. Thus, similarly to the above-described first embodiment of the second aspect, the semiconductor device B3' has improved reliability even with the use of a sintered metal as a die bonding material.

Although the application area 61" is a single area in the form of a continuous strip in the third embodiment of the second aspect and its variations, the application area is not limited to this. For example, the application area 61" may be made up of a plurality of individual sections 611 which are spaced apart from each other and each of which is in the form of a continuous strip.

Although the entirety of the sintered metal bond 3 overlaps with the semiconductor element 1 as viewed in the z direction in the third embodiment of the second aspect, the sintered metal bond 3 is not limited to this. For example, apart of the sintered metal bond 3 may be formed on the outer side of the edge of the semiconductor element 1.

Although the third embodiment of the second aspect describes an example in which the first pad portion 211 (pad obverse surface 211a) is formed with a plating layer 211c, the plating layer 211c may not be formed. That is, the semiconductor element 1 may be bonded to the first pad portion 211 via the sintered metal bond 3. In this case, the sintered metal bond 3 is in contact with the pad obverse surface 211a of the first pad portion 211.

Although the first through the third embodiments describe an example in which the semiconductor element 1 includes a reverse surface electrode pad 122, the reverse surface electrode pad 122 may not be included. That is, the element body 11 may be bonded to the plating layer 211c (or the first pad portion 211) via the sintered metal bond 3. In this case, the sintered metal bond 3 is in contact with the element reverse surface 112 of the element body 11.

Although the first through the third embodiments describe an example in which a single semiconductor element 1 is mounted on the lead frame 2, the present disclosure is not limited to this, and a plurality of semiconductor elements 1 may be mounted. In such a case, the shape of the lead frame 2 or the number of leads may be changed appropriately depending on the desired function of the semiconductor device.

Although the first through the third embodiments describe an example in which the semiconductor element 1 is a power semiconductor element, the present disclosure is not limited to this, and the semiconductor element 1 may be another type of transistor, various types of diodes, various types of thyristors, etc., or an IC chip such as a control IC. Further, the semiconductor device may be provided with a plurality of such elements.

Although the first through the third embodiments describe semiconductor devices B1-B3 of a lead frame structure, the present disclosure is applicable to various types of semiconductor devices that uses the sintered metal bond 3 to bond the semiconductor element 1. For example, the present disclosure is also applicable to a surface-mounting or chip-type semiconductor device that does not have a lead frame.

A semiconductor device or a method for manufacturing a semiconductor device according to the second aspect of the present disclosure can be defined as the following clauses 1B-20B.

Clause 1B.

A method for manufacturing a semiconductor device comprising: a semiconductor element including an element body having an element obverse surface and an element reverse surface that face away from each other in a first direction;

an element mount portion on which the semiconductor element is mounted; and a sintered metal bond that bonds the semiconductor element and the element mount portion, the method comprising:

a paste application step for applying a sintering metal paste to a part of the element mount portion;

a mounting step for placing the semiconductor element on the sintering metal paste with the element reverse surface facing the element mount portion; and a sintering step for forming the sintering metal paste into the sintered metal bond by heat treatment, wherein the paste application step includes setting an application area to which the sintering metal paste is applied and a non-application area to which the sintering metal paste is not applied, and the mounting step includes arranging the element reverse surface so as to overlap with both of the application area and the non-application area as viewed in the first direction so that an unfilled space that is not filled with the sintering metal paste is formed between the non-application area and the element reverse surface.

Clause 2B.

The method for manufacturing the semiconductor device according to clause 1B, wherein the unfilled space communicates with a space outside an edge of the element reverse surface as viewed in the first direction.

Clause 3B.

The method for manufacturing the semiconductor device according to clause 1B or 2B, further comprising a resin molding step for forming a resin package that covers the semiconductor element, the sintered metal bond, and a part of the element mount portion.

Clause 4B.

The method for manufacturing the semiconductor device according to clause 3B, wherein the resin molding step includes filling the unfilled space with the resin package.

Clause 5B.

The method for manufacturing the semiconductor device according to any one of clauses 1B-4B, wherein the semiconductor element further includes an obverse surface electrode pad that covers a part of the element obverse surface, and the method further includes a wire bonding step for bonding a wire to a part of the obverse surface electrode pad, the part overlapping with the application area as viewed in the first direction.

Clause 6B.

The method for manufacturing the semiconductor device according to any one of clauses 1B-5B, wherein the application area comprises a plurality of individual sections that are spaced apart from each other.

Clause 7B.

The method for manufacturing the semiconductor device according to any one of clauses 1B-6B, wherein the application area has a symmetric shape with respect to a center of the semiconductor element as viewed in the first direction.

Clause 8B.

The method for manufacturing the semiconductor device according to any one of clauses 1B-7B, wherein the semiconductor element further includes a reverse surface electrode pad that covers the element reverse surface.

Clause 9B.

The method for manufacturing the semiconductor device according to any one of clauses 1B-8B, wherein the semiconductor element is 3 mm square or larger as viewed in the first direction.

Clause 10B.

The method for manufacturing the semiconductor device according to any one of clauses 1B-9B, wherein every point within the application area is distant by not more than 1.5 mm from a boundary between the application area and the non-application area that is closest to the point.

Clause 11B.

A semiconductor device comprising:

a semiconductor element including an element body having an element obverse surface and an element reverse surface that face away from each other in a first direction;

an element mount portion on which the semiconductor element is mounted; and a sintered metal bond interposed between the semiconductor element and the element mount portion to bond the semiconductor element and the element mount portion, wherein the element reverse surface and the element mount portion face each other, and the semiconductor device further includes a sintered metal unfilled portion which has a same dimension in the first direction as that of the sintered metal bond and at which the sintered metal bond is not formed.

Clause 12B.

The semiconductor device according to clause 11B, wherein the sintered metal unfilled portion communicates with a space outside an edge of the element reverse surface as viewed in the first direction.

Clause 13B.

The semiconductor device according to clause 11B or 12B, further comprising a resin package that covers the semiconductor element, the sintered metal bond, and a part of the element mount portion.

Clause 14B.

The semiconductor device according to clause 13B, wherein a part of the resin package is formed in the sintered metal unfilled portion.

Clause 15B.

The semiconductor device according to any one of clauses 11B-14B, further comprising a wire made of an electrically conductive material, wherein the semiconductor element further includes an obverse surface electrode pad that covers a part of the element obverse surface, and the wire is bonded to a part of the obverse surface electrode pad, the part overlapping with the sintered metal bond as viewed in the first direction.

Clause 16B.

The semiconductor device according to any one of clauses 11B-15B, wherein the sintered metal bond comprises a plurality of individual bonding parts that are spaced apart from each other.

Clause 17B.

The semiconductor device according to any one of clauses 11B-16B, wherein the application area has a symmetric shape with respect to a center of the semiconductor element as viewed in the first direction.

Clause 18B.

The semiconductor device according to any one of clauses 11B-17B, wherein the semiconductor element further includes a reverse surface electrode pad that covers the element reverse surface.

Clause 19B.

The semiconductor device according to any one of clauses 11B-18B, wherein the semiconductor element is 3 mm square or larger as viewed in the first direction.

Clause 20B.

The semiconductor device according to any one of clauses 11B-19B, wherein, every point within the sintered metal bond is distant by not more than 1.5 mm from an edge of the sintered metal bond that is closest to the point, as viewed in the first direction.

The semiconductor device and the method for manufacturing the semiconductor device according to the second aspect of the present disclosure is not limited to the foregoing embodiments. The specific structure of each part of the semiconductor device and the specific treatment in each step of the semiconductor device manufacturing method may be varied in design in many ways.

The invention claimed is:

1. A semiconductor device comprising:
a semiconductor element including an element body and an electrode pad, the element body having an element obverse surface facing forward in a first direction and an element reverse surface facing rearward in the first direction, the electrode pad covering the element reverse surface;
an element mount portion supporting the semiconductor element;
a sintered metal bond that electrically bonds the electrode pad and the element mount portion,
wherein the sintered metal bond includes a first rear edge and a first front edge that is spaced forward in the first direction from the first rear edge, the electrode pad includes a second rear edge and a second front edge that is spaced forward in the first direction from the second rear edge, and the first front edge of the sintered metal bond is spaced rearward in the first direction from the second front edge of the electrode pad,
the semiconductor element includes an element side surface facing in a second direction perpendicular to the first direction,
the electrode pad includes a first covering portion and a second covering portion, the first covering portion covering the element reverse surface, the second covering portion extending forward in the first direction from the first covering portion along the element side surface,
the element side surface includes an element side surface flat portion and an element side surface recess recessed inward of the element body relative to the element side surface flat portion,
the second covering portion covers a part of the element side surface flat portion and an entirety of the element side surface recess, and the second covering portion is held in direct contact with the sintered metal bond.

2. The semiconductor device according to claim 1, further comprising a plating layer formed on the element mount portion, wherein the plating layer contains silver.

3. The semiconductor device according to claim 1, wherein the sintered metal bond comprises porous sintered silver.

4. The semiconductor device according to claim 1, wherein the semiconductor element is made of silicon.

5. The semiconductor device according to claim 1, further comprising a lead frame, wherein the element mount portion is formed by a part of the lead frame.

6. The semiconductor device according to claim 1, further comprising a resin package that covers the semiconductor element and the sintered metal bond.

7. The semiconductor device according to claim 1, wherein the semiconductor element comprises an IGBT or a power MOSFET.

8. The semiconductor device according to claim 1, wherein the sintered metal bond is a single layer disposed between the electrode pad and a plating layer.

9. The semiconductor device according to claim 1, wherein the element side surface recess is directly connected to the element reverse surface.

10. The semiconductor device according to claim 1, wherein the element side surface recess includes two edges that are spaced apart from each other in the first direction, each of the two edges being connected to the element side surface flat portion.

* * * * *